United States Patent
Kim et al.

(10) Patent No.: US 9,755,076 B2
(45) Date of Patent: Sep. 5, 2017

(54) SEMICONDUCTOR DEVICES HAVING SOURCE/DRAIN REGIONS WITH STRAIN-INDUCING LAYERS AND METHODS OF MANUFACTURING SUCH SEMICONDUCTOR DEVICES

(71) Applicant: Samsung Electronics Co., Ltd., Suwon-si, Gyeonggi-do (KR)

(72) Inventors: Seok-hoon Kim, Suwon-si (KR); Jin-bum Kim, Seoul (KR); Kwan-heum Lee, Suwon-si (KR); Byeong-chan Lee, Yongin-si (KR); Cho-eun Lee, Pocheon-si (KR); Su-jin Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/378,178

(22) Filed: Dec. 14, 2016

(65) Prior Publication Data

US 2017/0092766 A1    Mar. 30, 2017

Related U.S. Application Data

(62) Division of application No. 15/189,117, filed on Jun. 22, 2016, now Pat. No. 9,553,192, which is a division
(Continued)

(30) Foreign Application Priority Data

Jul. 25, 2014 (KR) ........................ 10-2014-0095008

(51) Int. Cl.
  *H01L 29/78* (2006.01)
  *H01L 21/02* (2006.01)
(Continued)

(52) U.S. Cl.
  CPC .... *H01L 29/7848* (2013.01); *H01L 21/02236* (2013.01); *H01L 21/02255* (2013.01);
(Continued)

(58) Field of Classification Search
  CPC ..... H01L 21/823431; H01L 21/823821; H01L 27/0886; H01L 27/0924; H01L 29/41791;
(Continued)

(56) References Cited

U.S. PATENT DOCUMENTS 7,692,254 B2     4/2010  Anderson et al.
8,030,154 B1 *  10/2011  Ozcan ............... H01L 21/82380
                                                                438/199
(Continued)

FOREIGN PATENT DOCUMENTS

JP    2007-165817    6/2007
JP    2012-231168   11/2012

*Primary Examiner* — Ermias Woldegeorgis
(74) *Attorney, Agent, or Firm* — Myers Bigel, P.A.

(57) ABSTRACT

Semiconductor devices include a strain-inducing layer capable of applying a strain to a channel region of a transistor included in a miniaturized electronic device, and a method of manufacturing the semiconductor device. The semiconductor device includes a substrate having a channel region; a pair of source/drain regions provided on the substrate and arranged on both sides of the channel region in a first direction; and a gate structure provided on the channel region and comprising a gate electrode pattern extending in a second direction that is different from the first direction, a gate dielectric layer disposed between the channel region and the gate electrode pattern, and a gate spacer covering respective lateral surfaces of the gate electrode pattern and the gate dielectric layer. At least one of the source/drain regions includes a first strain-inducing layer and a second strain-inducing layer. The first strain-inducing layer is disposed between a lateral surface of the channel region and the
(Continued)

second strain-inducing layer and contacts at least a portion of the gate dielectric layer.

6 Claims, 46 Drawing Sheets

Related U.S. Application Data of application No. 14/680,458, filed on Apr. 7, 2015, now Pat. No. 9,397,219.

(51) Int. Cl.
| | |
|---|---|
| *H01L 29/06* | (2006.01) |
| *H01L 29/10* | (2006.01) |
| *H01L 29/165* | (2006.01) |
| *H01L 29/66* | (2006.01) |
| *H01L 27/092* | (2006.01) |
| *H01L 21/8238* | (2006.01) |
| *H01L 29/417* | (2006.01) |
| *H01L 27/088* | (2006.01) |
| *H01L 21/8234* | (2006.01) |

(52) U.S. Cl.
CPC .. *H01L 21/02532* (2013.01); *H01L 21/02636* (2013.01); *H01L 21/823431* (2013.01); *H01L 21/823821* (2013.01); *H01L 27/0886* (2013.01); *H01L 27/0924* (2013.01); *H01L 29/0649* (2013.01); *H01L 29/1054* (2013.01); *H01L 29/165* (2013.01); *H01L 29/41791* (2013.01); *H01L 29/66795* (2013.01); *H01L 29/785* (2013.01); *H01L 29/7831* (2013.01); *H01L 29/7851* (2013.01); *H01L 29/7856* (2013.01)

(58) Field of Classification Search
CPC .......... H01L 29/7831; H01L 2029/785; H01L 2029/7858; H01L 2924/13067
See application file for complete search history.

(56) References Cited

U.S. PATENT DOCUMENTS

| | | | |
|---|---|---|---|
| 8,264,021 B2 | 9/2012 | Lai et al. | |
| 8,901,537 B2* | 12/2014 | Murthy | H01L 21/28512 257/19 |
| 8,921,192 B2* | 12/2014 | Kim | H01L 21/02532 257/E21.09 |
| 9,142,642 B2* | 9/2015 | Chen | H01L 21/02532 |
| 9,397,219 B2 | 7/2016 | Kim | |
| 2013/0089959 A1 | 4/2013 | Kwok et al. | |
| 2013/0109144 A1 | 5/2013 | Kim et al. | |
| 2013/0207166 A1 | 8/2013 | Chen et al. | |
| 2013/0234204 A1* | 9/2013 | Kang | H01L 29/7851 257/190 |
| 2013/0249003 A1 | 9/2013 | Oh et al. | |
| 2013/0264639 A1 | 10/2013 | Glass et al. | |
| 2013/0320449 A1 | 12/2013 | Hoentschel et al. | |
| 2015/0145066 A1* | 5/2015 | Lu | H01L 29/66795 257/401 |

* cited by examiner

SEMICONDUCTOR DEVICES HAVING SOURCE/DRAIN REGIONS WITH STRAIN-INDUCING LAYERS AND METHODS OF MANUFACTURING SUCH SEMICONDUCTOR DEVICES

CROSS-REFERENCE TO RELATED APPLICATIONS

This U.S. non-provisional patent application claims priority as a divisional application of U.S. patent application Ser. No. 15/189,117, filed Jun. 22, 2016, which in turn is a divisional application of U.S. patent application Ser. No. 14/680,458, filed Apr. 7, 2015, which in turn claims priority under 35 U.S.C.§119 from Korean Patent Application No. 10-2014-0095008, filed on Jul. 25, 2014 in the Korean Intellectual Property Office, the disclosure of each of which is incorporated herein by reference in its entirety.

BACKGROUND

The inventive concepts relate to semiconductor devices and, more particularly, to semiconductor devices having a source/drain region that include a strain-inducing layer, and to methods of fabricating such semiconductor devices.

There is a continued demand for semiconductor devices that operate at increased speed. Strain transistors that apply a strain to a channel region have been proposed to increase the speed of semiconductor devices. However, as semiconductor devices are reduced in size in order to provide increased integration density, it may become more difficult to form strain-inducing layers in semiconductor transistors that are capable of applying a sufficient strain to the channel region.

SUMMARY

The inventive concepts provide semiconductor devices that include a strain-inducing layer that applies a strain to a channel region of a transistor included in a miniaturized electronic device, and methods of manufacturing such semiconductor devices.

According to an aspect of the inventive concepts, there is provided a semiconductor device comprising: a substrate comprising a channel region; a pair of source/drain regions on the substrate on opposite sides of the channel region; and a gate structure on the channel region, the gate structure including a gate electrode pattern and a gate dielectric layer that is between the channel region and the gate electrode pattern, and a gate spacer that covers respective lateral surfaces of the gate electrode pattern and the gate dielectric layer, wherein at least one of the pair of source/drain regions comprises a first strain-inducing layer and a second strain-inducing layer, and the first strain-inducing layer is between a lateral surface of the channel region and the second strain-inducing layer and directly contacts the gate dielectric layer.

The first strain-inducing layer may also extend between a lower surface of the second strain-inducing layer and the substrate.

A thickness of a portion of the first strain-inducing layer that is between the second strain-inducing layer and the lateral surface of the channel region may be less than a thickness of a portion of the first strain-inducing layer that is between the lower surface of the second strain-inducing layer and the substrate.

The second strain-inducing layer may directly contact a portion of a lower surface of the gate spacer.

The first strain-inducing layer may have a doping concentration that is less than a doping concentration of the second strain-inducing layer.

The second strain-inducing layer and the channel region may have a first conductivity type and a second conductivity type, respectively, that are different, and the first strain-inducing layer may be substantially un-doped.

The semiconductor device may further comprise a third strain-inducing layer that is between the first strain-inducing layer and the second strain-inducing layer, wherein the first, second, and third strain-inducing layers may have respective first, second, and third germanium (Ge) contents, and the third Ge content may be smaller than at least one of the first Ge content and the second Ge content.

The first, second, and third strain-inducing layers may have respective first, second, and third doping concentrations, and the first doping concentration may be smaller than at least one of the second doping concentration and the third doping concentration.

The third doping concentration may be smaller than the second doping concentration.

The first strain-inducing layer may directly contact a lower surface of the gate spacer and a lower surface of the gate dielectric layer.

A first portion of the gate dielectric layer may be between the channel region and the gate electrode pattern and a second portion of the gate dielectric layer may be between the gate electrode pattern and the gate spacer.

A fin structure comprising the channel region and a pair of recesses that are on both sides of the channel region may be on the substrate, and the pair of source/drain regions may be in the pair of recesses.

According to another aspect of the inventive concepts, there is provided a strain transistor comprising: a substrate comprising a channel region and a pair of recesses on opposing sides of the channel region; a gate structure on the channel region that includes a gate electrode pattern, a gate dielectric layer between the channel region and the gate electrode pattern, and a gate spacer that covers respective lateral surfaces of the gate electrode pattern and the gate dielectric layer; and a pair of source/drain regions formed in the pair of recesses, respectively, wherein at least one of the pair of source/drain regions comprises a first strain-inducing layer and a second strain-inducing layer, and the first strain-inducing layer is between the second strain-inducing layer and a lateral surface of the channel region and directly contacts the gate spacer and the gate dielectric layer.

The first strain-inducing layer also may be between the second strain-inducing layer and a bottom of each of the recesses.

The strain transistor may further comprise a third strain-inducing layer that is between the first strain-inducing layer and the second strain-inducing layer, and this third strain-inducing layer may have a Ge content that is smaller than a Ge content of at least one of the first and second strain-inducing layers.

The first, second, and third strain-inducing layers may have respective first, second, and third doping concentrations, and the first doping concentration may be smaller than the third doping concentration, and the third doping concentration may be smaller than the second doping concentration.

The second strain-inducing layer and the channel region may have a first conductivity type and a second conductivity type, respectively, which are different, and the first strain-inducing layer may have a first conductivity type with a doping concentration that is smaller than a doping concentration of the second strain-inducing layer.

The strain transistor may be a p-type Metal-Oxide-Semiconductor Field Effect Transistor (MOSFET), and the second strain-inducing layer may be doped with boron (B).

According to another aspect of the inventive concepts, there is provided a semiconductor device comprising: a substrate; a fin structure on the substrate, the fin structure comprising a pair of channel regions that are separated by a recess; a pair of gate structures on the respective pair of channel regions, each gate structure comprising a gate electrode pattern that extends to intersect the fin structure, a gate dielectric layer between the channel regions and the gate electrode pattern, and a gate spacer that covers respective lateral surfaces of the gate electrode pattern and the gate dielectric layer; and a source/drain region extending upwardly from the recess, wherein the source/drain region comprises a first strain-inducing layer and a second strain-inducing layer that cover respective lateral surfaces of the pair of the channel regions that face each other and the bottom of the recess, and the first strain-inducing layer is between each of the respective lateral surfaces of the channel regions that face each other and the second strain-inducing layer and directly contacts a boundary between the gate spacer and the gate dielectric layer on a lower surface of each of the pair of gate structures.

The first strain-inducing layer may also be between the second strain-inducing layer and the bottom of the recess.

The first and second strain-inducing layers may have respective first and second doping concentrations of a first conductivity type dopant, and the first doping concentration may be smaller than the second doping concentration.

According to another aspect of the inventive concepts, there is provided a method of manufacturing a semiconductor device, the method comprising: preparing a substrate that includes a protruding pattern that extends in a first direction; forming an isolation layer that covers a lower portion of the protruding pattern; forming an extending pattern structure that comprises an extending pattern that extends in a second direction that is different from the first direction to intersect the protruding pattern, an insulation layer that is between the protruding pattern and the extending pattern, and a gate spacer covering respective lateral surfaces of the extending pattern and the insulation layer; forming a fin structure that comprises a protrusion and a pair of recesses on opposite sides of the protrusion by removing portions of the protruding pattern that are on opposite sides of the extending pattern structure; forming a first strain-inducing layer that defines a channel region within the protrusion, by diffusing strain-inducing atoms via a lateral surface of the protrusion; and forming a second strain-inducing layer that covers the first strain-inducing layer within each of the pair of recesses, wherein the first strain-inducing layer directly contacts the gate spacer.

The first strain-inducing layer extends from on at least a portion of the lateral surface of the protrusion of the fin structure to on at least a portion of the bottom of each of the pair of recesses of the fin structure.

The forming of the first strain-inducing layer may comprise: forming a first semiconductor layer containing Ge on the lateral surface of the protrusion and the bottom of each of the pair of recesses; forming, an oxide layer by oxidizing a portion of the first semiconductor layer; and removing the oxide layer.

The oxide layer may be formed by thermal oxidation.

The forming of the first strain-inducing layer may further comprise: forming a first semiconductor layer containing Ge on the lateral surface of the protrusion and the bottom of each of the pair of recesses; and forming a second semiconductor layer on the first semiconductor layer, and the forming of the oxide layer comprises oxidizing the second semiconductor layer together with the portion of the first semiconductor layer.

The first semiconductor layer and the second semiconductor layer may be formed by selective epitaxial growth.

After the first strain-inducing layer is formed, at least a portion of a lower surface of the gate spacer may be exposed, and the second strain-inducing layer may directly contact the lower surface of the gate spacer.

The method may further comprise forming a third strain-inducing layer that covers the first strain-inducing layer after forming the first strain-inducing layer and before the the second strain-inducing layer is formed.

The third strain-inducing layer may be formed via selective epitaxial growth using the first strain-inducing layer as a seed layer, and the second strain-inducing layer may be formed via selective epitaxial growth using the third strain-inducing layer as a seed layer.

The third strain-inducing layer may have a Ge content that is smaller than a Ge content of each of the first and second strain-inducing layers.

The third strain-inducing layer may have a doping concentration that is smaller than a doping concentration of the second strain-inducing layer.

Each of the second strain-inducing layer and the third strain-inducing layer may be doped with B.

After the forming of the fin structure, the pair of recesses may be extended by partially removing the protrusion from both lateral surfaces of the protrusion that are exposed via the pair of recesses, wherein after the first strain-inducing layer is formed, at least a portion of a lower surface of the gate spacer is exposed.

The second strain-inducing layer may be formed via selective epitaxial growth using the first strain-inducing layer as a seed layer.

The method may further comprise: removing the extending pattern and the insulation layer and then forming a gate electrode pattern on the channel region within a space from which the extending pattern and the insulation layer have been removed and also forming a gate dielectric layer between the channel region and the gate electrode pattern.

The first strain-inducing layer may have a first doping concentration, and the second strain-inducing layer may have a second doping concentration that is greater than the first doping concentration.

The second strain-inducing layer may have a first conductivity type that is different from a conductivity type of the channel region, and the first strain-inducing layer may be substantially undoped.

The channel region and the first and second strain-inducing layers may form a p-type MOSFET, and the strain-inducing atoms may be Ge.

According to another aspect of the inventive concepts, there is provided a semiconductor device comprising: a substrate having a semiconductor fin structure protruding upwardly therefrom, the fin structure including a channel region; a gate structure on an upper surface of the channel region, the gate structure including a gate dielectric layer on the channel region, a gate electrode pattern on the gate dielectric layer and gate spacers on opposed sidewalls of the gate electrode pattern; a first source/drain region and a second source/drain region on opposite sides of the channel region, the first source/drain region including a first strain-inducing layer on a sidewall of the channel region and a second strain-inducing layer on the first strain-inducing layer opposite the channel region, wherein the channel region has a first conductivity type and the first and second strain-inducing layers have a second conductivity type that is opposite the first conductivity type, wherein a concentration of second conductivity type dopants in the second strain-inducing layer is at least two orders of magnitude greater than a concentration of second conductivity type dopants in the first strain-inducing layer, and wherein a thickness of the first strain-inducing layer along an entirety of the sidewall of the channel region is substantially uniform.

The semiconductor device may further include a third strain-inducing layer between the first strain-inducing layer and the second strain-inducing layer. A germanium content of the third strain-inducing layer may be less than the germanium content of at least one of the first or second strain-inducing layers.

The first strain-inducing layer may directly contact a lower surface of the gate dielectric layer.

The first strain-inducing layer may also directly contact a lower surface of the gate spacer.

The second strain-inducing layer may directly contact a portion of a lower surface of the gate spacer.

The first strain-inducing layer may also extend between a lower surface of the second strain-inducing layer and the substrate, and a thickness of a portion of the first strain-inducing layer that is between the second strain-inducing layer and the sidewall of the channel region may be less than a thickness of a portion of the first strain-inducing layer that is between the lower surface of the second strain-inducing layer and the substrate.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1A:
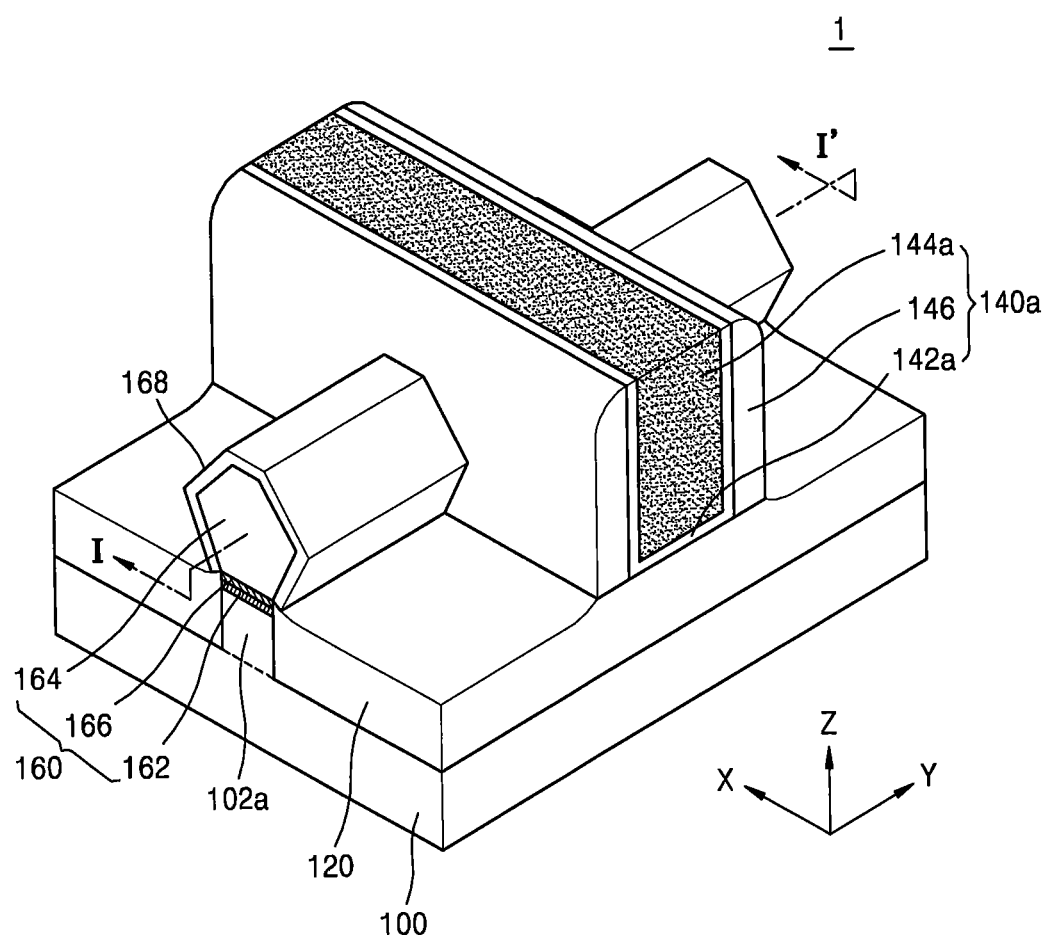
FIG. 1A is a perspective view illustrating a semiconductor device according to an embodiment of the inventive concepts.

The inventive concepts will now be described more fully with reference to the accompanying drawings, in which exemplary embodiments of the inventive concepts are shown. The inventive concepts may, however, be embodied in many different forms and should not be construed as being limited to the embodiments set forth herein; rather, these embodiments are provided so that this disclosure will be thorough and complete, and will fully convey the inventive concepts to one of ordinary skill in the art. In the drawings, the sizes of some elements may be exaggerated for convenience of explanation.

It will be understood that when a component is referred to as being "on" another component or as "contacting" another component, the component can be directly on or can directly contact another component, or intervening components may be present. In contrast, when a component is referred to as being "directly on" another component or "directly contacting" another component, there are no intervening components present. Other expressions describing relationships between components, such as, "between" and "directly between", will also be similarly understood.

While such terms as "first", "second", etc., may be used to describe various components, such components are not limited by these terms. Instead, these terms are used only to distinguish one component from another. For example, a first component discussed below could be termed a second component, and similarly, a second component may be termed a first component, without departing from the teachings of this disclosure.

An expression used in the singular form encompasses the expression in the plural form, unless the context clearly indicates otherwise. In the present specification, it will be understood that terms such as "including" or "having", etc., are intended to indicate the existence of the features, steps, actions, components, parts, or combinations thereof disclosed in the specification, and are not intended to preclude the possibility that one or more other features, steps, actions, components, parts, or combinations thereof may be added.

Unless otherwise defined, all terms used herein have the same meaning as commonly understood by one of ordinary skill in the art.

The inventive concepts will now be described more fully with reference to the accompanying drawings, in which exemplary embodiments are shown.

FIG. 1A is a perspective view illustrating a semiconductor device 1 according to an embodiment of the inventive concepts.

Figure 1B:
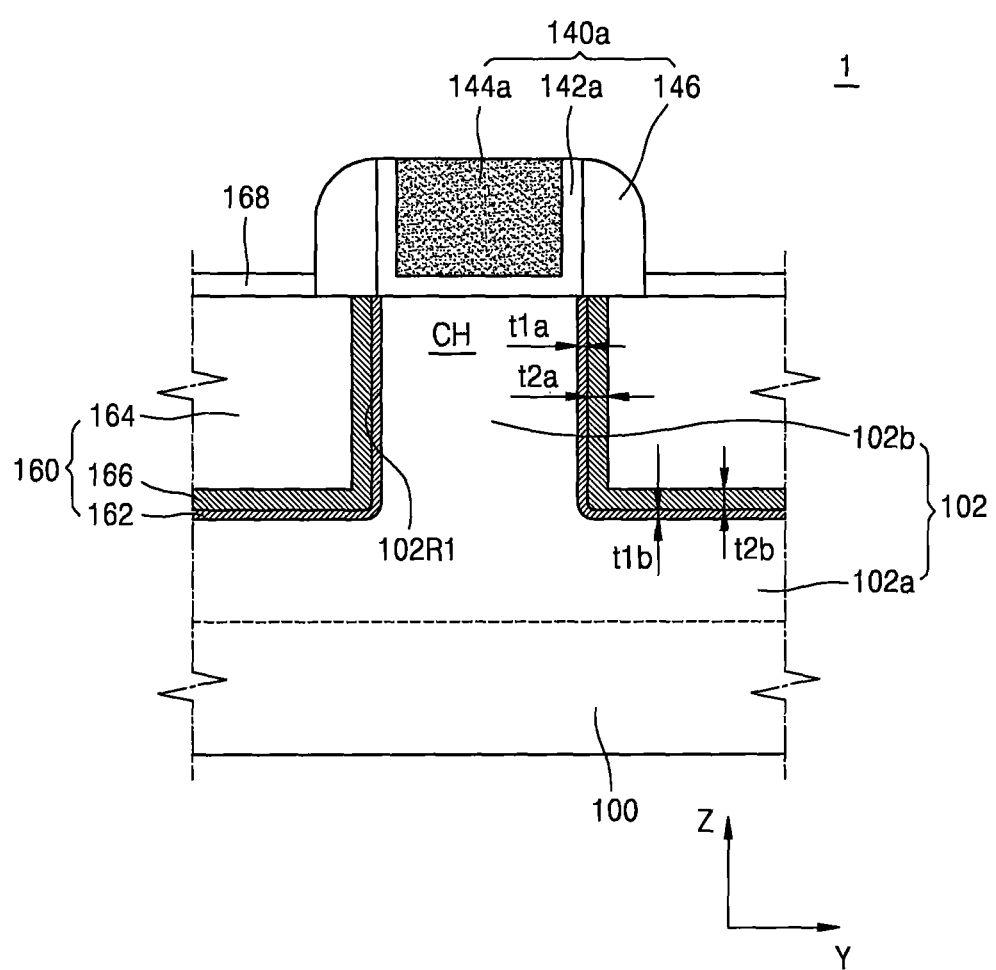
FIG. 1B is a cross-sectional view taken along the line I-I of FIG. 1A.

FIG. 1B is a cross-sectional view taken along the line I-I' of FIG. 1A.

Referring to FIGS. 1A and 1B, the semiconductor device 1 includes a substrate 100 having a channel region CH, a pair of source/drain regions 160 that are on the substrate 100 on opposite sides of the channel region CH along a first direction Y, and a gate structure 140a that is on the channel region CH. The gate structure 140a extends in a second direction X that is different from the first direction Y. The second X direction may be perpendicular to the first direction Y.

A fin structure 102 may extend upwardly from the substrate 100. The channel region CH is within the fin structure 102. A pair of recesses 102R1 are located on opposite sides of the channel region CH. The source/drain regions 160 may be formed in the respective recesses 102R1. The fin structure 102 may include a base 102a and a protrusion 102b in which the channel region CH is formed. The fin structure 102 may be formed on the substrate 100 by selective epitaxial growth (SEG) or may be formed by removing a portion of the substrate 100 that corresponds to the recesses 102R1. An isolation layer 120 may be formed around the base 102a of the fin structure 102. The fin structure 102 may be an active region of a transistor.

The gate structure 140a includes a gate electrode pattern 144a that is on the channel region CH and that extends in the second direction X, a gate dielectric layer 142a, and a gate spacer 146 that covers lateral surfaces (sidewalls) of the gate electrode pattern 144a and lateral surfaces (sidewalls) of the gate dielectric layer 142a.

The gate dielectric layer 142a is interposed between the channel region CH and the gate electrode pattern 144a. The gate dielectric layer 142a is also between the gate electrode pattern 144a and the gate spacer 146. In other words, the gate dielectric layer 142a may cover the inner wall of a space defined by the channel region CH and the gate spacer 146, and the gate electrode pattern 144a may be formed on the gate dielectric layer 142a so as to fill the remainder of the space defined by the channel region CH and the gate spacer 146.

Each of the source/drain regions 160 may include a first strain-inducing layer 162 and a second strain-inducing layer 164. The first strain-inducing layer 162 may be between a lateral surface of the channel region CH and the second strain-inducing layer 164 and may contact a lower surface of the gate dielectric layer 142a. The second strain-inducing layer 164 may contact a lower surface of the gate spacer 146. The second strain-inducing layer 164 may be formed in the recess 102R1.

The first strain-inducing layer 162 may include an upper surface that directly contacts a boundary between the gate spacer 146 and the gate dielectric layer 142a that is on a lower surface of the gate structure 140a. Since the first strain-inducing layer 162 may completely cover the boundary between the gate spacer 146 and the gate dielectric layer 142a on the lower surface of the gate structure 140a, the second strain-inducing layer 164 may not directly contact the gate dielectric layer 142a. Moreover, since the first strain-inducing layer 162 is between the channel region CH and the second strain-inducing layer 164, the second strain-inducing layer 164 may not directly contact the channel region CH.

The first strain-inducing layer 162 may extend from between the second strain-inducing layer 164 and the lateral surface of the channel region CH to between the lower surface of the second strain-inducing layer 164 and the base 102a of fin 102. In other words, the first strain-inducing layer 162 may extend from between the second strain-inducing layer 164 and the lateral surface of the channel region CH so as to be also disposed between the lower surface of the second strain-inducing layer 164 and the bottom of the recess 102R1.

A thickness t1b of a portion of the first strain-inducing layer 162 that is between the lower surface of the second strain-inducing layer 164 and the substrate 100 may be greater than a thickness t1a of a portion of the first strain-inducing layer 162 that is between the second strain-inducing layer 164 and the lateral surface of the channel region CH. A thickness t2b of a portion of a third strain-inducing layer 166 that is on the bottom of the recess 102R1 may be greater than a thickness t2a of a portion of the third strain-inducing layer 166 that is on the lateral surface of the channel region CH.

The second strain-inducing layer 164 and the channel region CH may have different conductivity types. For example, the second strain-inducing layer 164 and the channel region CH may be formed of a p type semiconductor material and an n type semiconductor material, respectively.

The channel region CH may be formed of, for example, silicon (Si) or silicon germanium (SiGe). Each of the first and second strain-inducing layers 162 and 164 may be formed of SiGe.

The first and second strain-inducing layers 162 and 164 may have first and second germanium (Ge) contents, respectively. Herein, the Ge content of an SiGe layer refers to the percentage of Ge atoms within the total number of Si atoms and Ge atoms. The first Ge content of the first strain-inducing layer 162 may be greater than the second Ge content of the second strain-inducing layer 164. Alternatively, the first Ge content of the first strain-inducing layer 162 may be smaller than or equal to the second Ge content of the second strain-inducing layer 164. A Ge content of the channel region CH may be smaller than the first Ge content of the first strain-inducing layer 162 and may be smaller than the second Ge content of the second strain-inducing layer 164. In other words, the Ge content of the channel region CH may be zero or may be greater than zero but smaller than each of the first Ge content and the second Ge content.

The first strain-inducing layer 162 and the second strain-inducing layer 164 may have first and second doping concentrations, respectively. The second doping concentration may be greater than the first doping concentration. The first strain-inducing layer 162 may have a first conductivity type or may be substantially un-doped. In other words, the first doping concentration of the first strain-inducing layer 162 may be substantially zero or may be greater than zero but smaller than the second doping concentration. The first doping concentration of the first strain-inducing layer 162 being substantially zero refers to the case where the first strain-inducing layer 162 is formed of an undoped semiconductor material or the case where the first strain-inducing layer 162 has a doping concentration greatly lower than that of the second strain-inducing layer 164 or the channel region CH and thus does not affect the electrical characteristics of the semiconductor device 1. For example, the first doping concentration of the first strain-inducing layer 162 may be greater than or equal to zero, and may be smaller than the second doping concentration of the second strain-inducing layer 164 or the doping concentration of the channel region CH by at least two orders of magnitude.

The first strain-inducing layer 162 may reduce or prevent a first conductivity type dopant that is included in the second strain-inducing layer 164 from diffusing into the channel region CH which has the second conductivity type.

The transistor having the channel region CH, the gate electrode pattern 144a, the gate dielectric layer 142a, and the source/drain regions 160 may be a Metal-Oxide-Semiconductor Field Effect Transistor (MOSFET). The transistor may be a strain transistor in which the source/drain regions 160 apply a strain to the channel region CH. The transistor may be a p-type MOSFET. In this case, the second strain-inducing layer 164 may be doped with boron (B) as a dopant.

The source/drain region 160 may further include a third strain-inducing layer 166 that is between the first strain-inducing layer 162 and the second strain-inducing layer 164. The first, second, and third strain-inducing layers 162, 164, and 166 may have first, second, and third Ge contents, respectively. The third Ge content of the third strain-inducing layer 166 may be smaller than at least one selected from the first Ge content of the first strain-inducing layer 162 and the second Ge content of the second strain-inducing layer 164.

The first, second, and third strain-inducing layers 162, 164, and 166 may have first, second, and third doping concentrations, respectively. The first doping concentration of the first strain-inducing layer 162 may be smaller than at least one selected from the second doping concentration of the second strain-inducing layer 164 and the third doping concentration of the third strain-inducing layer 166. The third doping concentration of the third strain-inducing layer 166 may be smaller than the second doping concentration of the second strain-inducing layer 164. The first doping concentration of the first strain-inducing layer 162 may be smaller than the third doping concentration of the third strain-inducing layer 166.

The first strain-inducing layer 162 may have a first conductivity type or may be substantially un-doped. In other words, the first doping concentration of the first strain-inducing layer 162 may be substantially zero or may be greater than zero but smaller than the second doping concentration of the second strain-inducing layer 164 and smaller than the third doping concentration of the third strain-inducing layer 166.

In some embodiments, a portion of the fin structure 102 may be included in the first strain-inducing layer 162. Accordingly, in this specification, the protrusion 102b and the channel region CH are referred to differently and will be described with reference to the manufacturing process of the semiconductor device 1, which will be described later.

A source/drain capping layer 168 may be formed on a surface of the source/drain region 160. The source/drain capping layer 168 may cover the entire surface of the source/drain region 160 that is exposed by the fin structure 102, the gate structure 160a, and the isolation layer 120. The source/drain capping layer 168 may comprise, for example, silicon doped with a first conductivity type dopant or undoped silicon.

The transistor included in the semiconductor device 1 may be, for example, an n-type MOSFET. In this case, the Ge described above may be replaced with carbon (C), and the B described above may be replaced with phosphorus (P) or arsenic (As).

Figure 2:
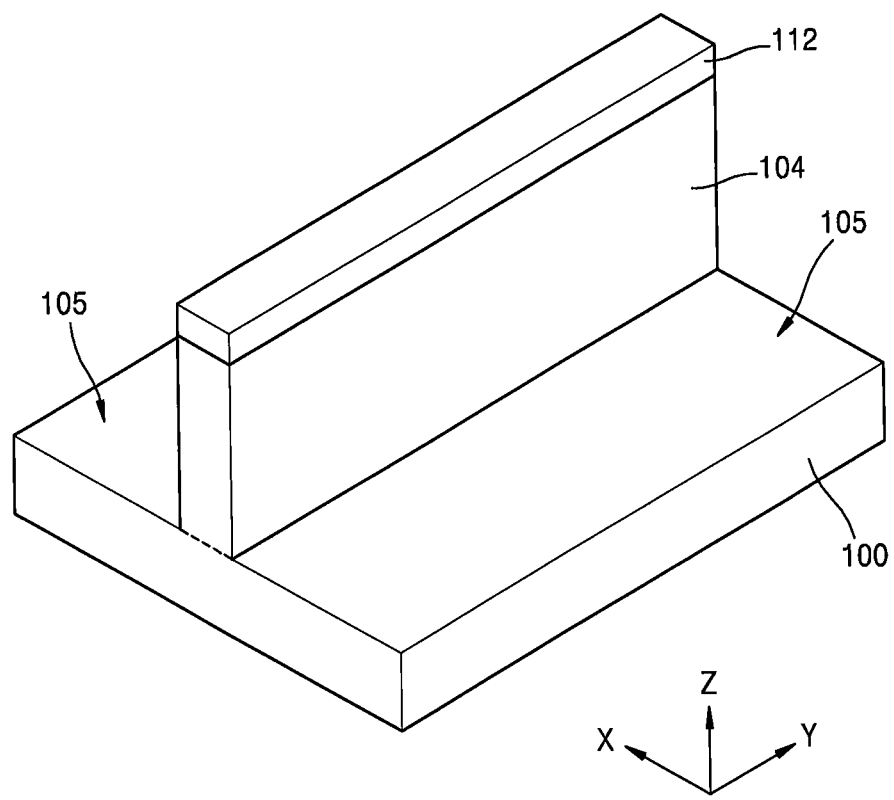
FIG. 2 is a perspective view for explaining an operation of preparing a substrate in order to manufacture a semiconductor device according to an embodiment of the inventive concepts.

FIG. 2 is a perspective view for explaining an operation of preparing a substrate 100 in order to manufacture a semiconductor device according to an embodiment of the inventive concepts.

Referring to FIG. 2, a substrate 100 is prepared to have a protruding pattern 104 that extends in the first direction Y. A trench 105 may be formed on either side of the protruding pattern 104. The substrate 100 may include, for example, silicon. Alternatively, the substrate 100 may include a semiconductor element, such as, Ge, or a compound semiconductor, such as, silicon carbide (SiC), gallium arsenide (GaAs), indium arsenide (InAs), or indium phosphide (InP). The substrate 100 may have a silicon-on-insulator (SOI) structure. For example, the substrate 100 may include a buried oxide (BOX) layer. The substrate 100 may include a conductive region, for example, an impurity-doped well or an impurity-doped structure.

The protruding pattern 104 may be formed by forming a first mask pattern 112 on the substrate 100 and then etching the substrate 100 using the first mask pattern 112 as an etch mask. The first mask pattern 112 may have a line shape and may extend in the first direction Y. The first mask pattern 112 may include at least one material selected from silicon oxide, silicon nitride, and silicon oxynitride. The protruding pattern 104 may be, for example, Si or SiGe.

Figure 3:
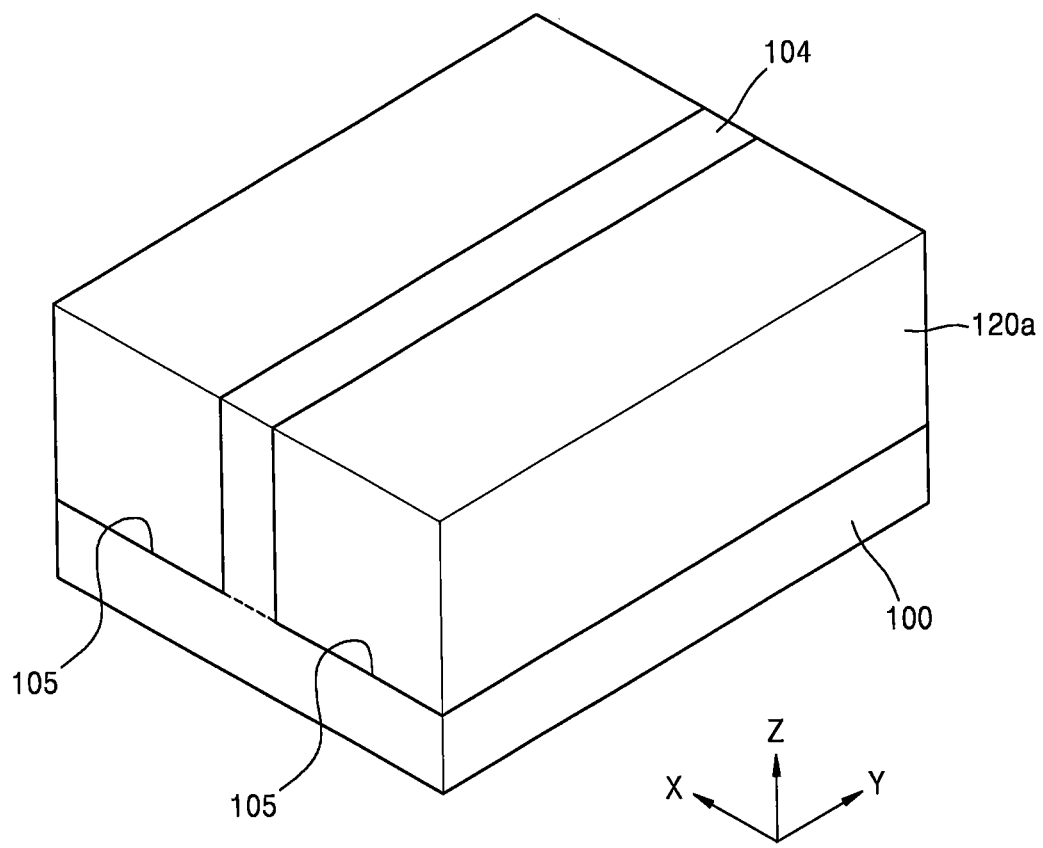
FIG. 3 is a perspective view for explaining an operation of forming a preliminary isolation layer in order to manufacture a semiconductor device according to an embodiment of the inventive concepts.

FIG. 3 is a perspective view for explaining an operation of forming a preliminary isolation layer 120a in order to manufacture a semiconductor device according to an embodiment of the inventive concepts.

Referring to FIG. 3, a preliminary isolation layer 120a is formed in the trenches 105. The preliminary isolation layer 120a may be, for example, a material including at least one selected from silicon oxide, silicon nitride, and silicon oxynitride. The preliminary isolation layer 120a may be formed by forming a preliminary isolation material (not shown) on the substrate 100 so as to cover the protruding pattern 104 and then removing a portion of the preliminary isolation material until the first mask pattern 112 of FIG. 2 is exposed or by removing a portion of the preliminary isolation material and the first mask pattern 112 until the protruding pattern 104 is exposed. To remove a portion of the preliminary isolation material, an etchback process and/or a chemical mechanical polishing (CMP) process may be performed.

Figure 4:
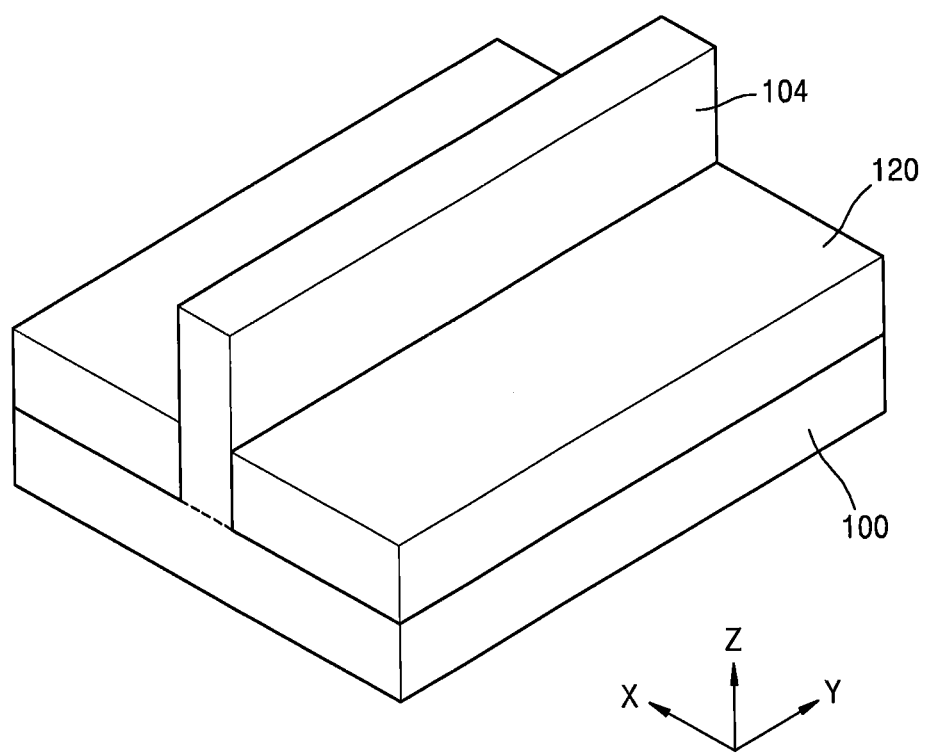
FIG. 4 is a perspective view for explaining an operation of forming an isolation layer in order to manufacture a semiconductor device according to an embodiment of the inventive concepts.

Although the first mask pattern 112 of FIG. 2 has been removed in FIG. 3, the first mask pattern 112 may remain in other embodiments and be removed when the isolation layer 120 of FIG. 4 is formed.

FIG. 4 is a perspective view for explaining an operation of forming the isolation layer 120 in order to manufacture a semiconductor device according to an embodiment of the inventive concepts.

Referring to FIG. 4, an upper portion of the protruding pattern 104 may be exposed by removing a portion of the preliminary isolation layer 120a of FIG. 3 to form the isolation layer 120 that covers a lower portion of the protruding pattern 104 may be formed. To form the isolation layer 120, an etching process having an etch selectivity with respect to the protruding pattern 104 may be performed.

As described above, the first mask pattern 112 may also be removed when the preliminary isolation layer 120a is removed. However, the first mask pattern 112 may be removed after the preliminary isolation layer 120a is formed, or when or after the isolation layer 120 is formed.

In another embodiment of the inventive concepts, a SEG process may be used to grow the protruding portion 104.

The protruding portion 104 may be doped to form the channel region. For example, when a p-type MOSFET is to be formed, P or As may be doped into the protruding pattern 104 to form the channel region. When an n-type MOSFET is to be formed, B may be doped into the protruding pattern 104 to form the channel region. The doping of the channel region may be performed during any of the operations of FIG. 2, 3, or 4.

Figure 5:
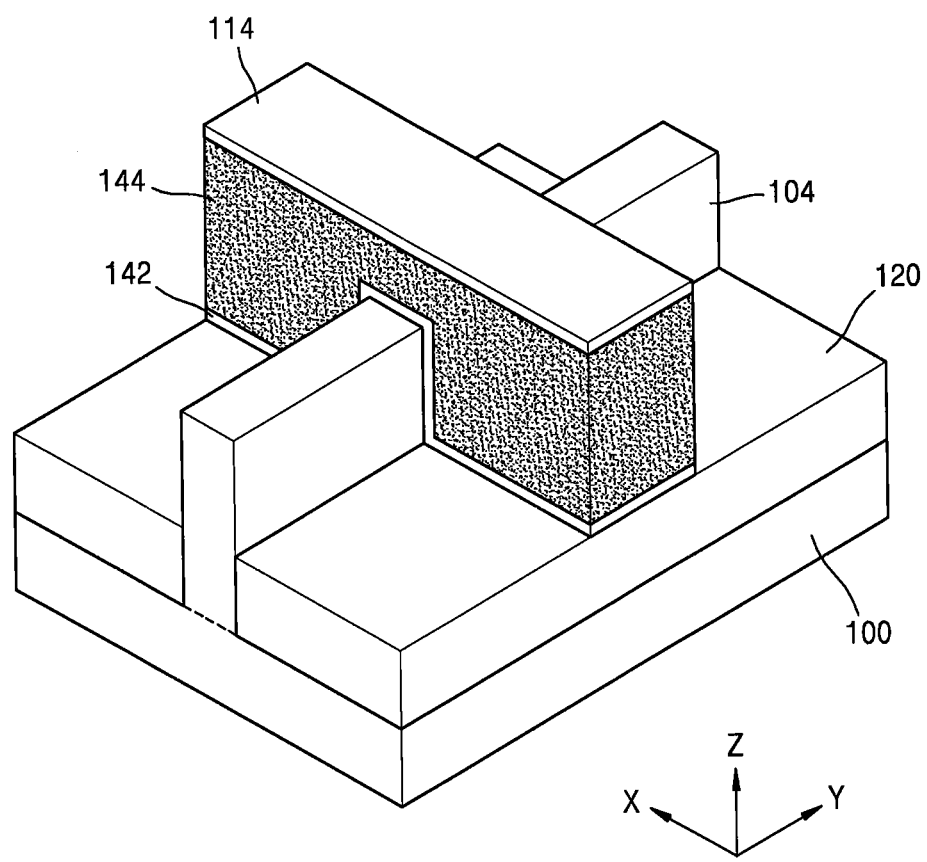
FIG. 5 is a perspective view for explaining an operation of forming an extending pattern in order to manufacture a semiconductor device according to an embodiment of the inventive concepts.

FIG. 5 is a perspective view for explaining an operation of forming an extending pattern 144 in order to manufacture a semiconductor device according to an embodiment of the inventive concepts.

Referring to FIG. 5, the extending pattern 144 extends in the second direction X that is different from the first direction Y to intersect the protruding pattern 104. An insulation layer 142 may be disposed between the extending pattern 144 and the protruding pattern 104.

The insulation layer 142 and the extending pattern 144 may be formed by sequentially forming an insulation material layer (not shown) and an extending pattern material layer (not shown) on the substrate 100 on which the protruding pattern 104 has been formed, forming a second mask pattern 114 on the extending pattern material layer, and etching the insulation material layer and the extending pattern material layer using the second mask pattern 114 as an etch mask. The second mask pattern 114 may be a line extending in the second direction X. The second mask pattern 114 may include at least one material selected from silicon oxide, silicon nitride, and silicon oxynitride. The second mask pattern 114 may serve as a gate capping layer. Alternatively, the second mask pattern 114 may be removed after the etching is completed.

In another embodiment, the insulation layer 142, the extending pattern 144, and a gate capping layer 114 are again formed to extend in the second direction X different from the first direction Y and to intersect the protruding pattern 104. In this case, the insulation layer 142, the extending pattern 144, and the gate capping layer 114 may be formed using an etching process in which a line-shaped mask pattern (not shown) that extends in the second direction X is used as an etch mask. The gate capping layer 114 may be, for example, a material including at least one selected from silicon oxide, silicon nitride, and silicon oxynitride.

Figure 12A:
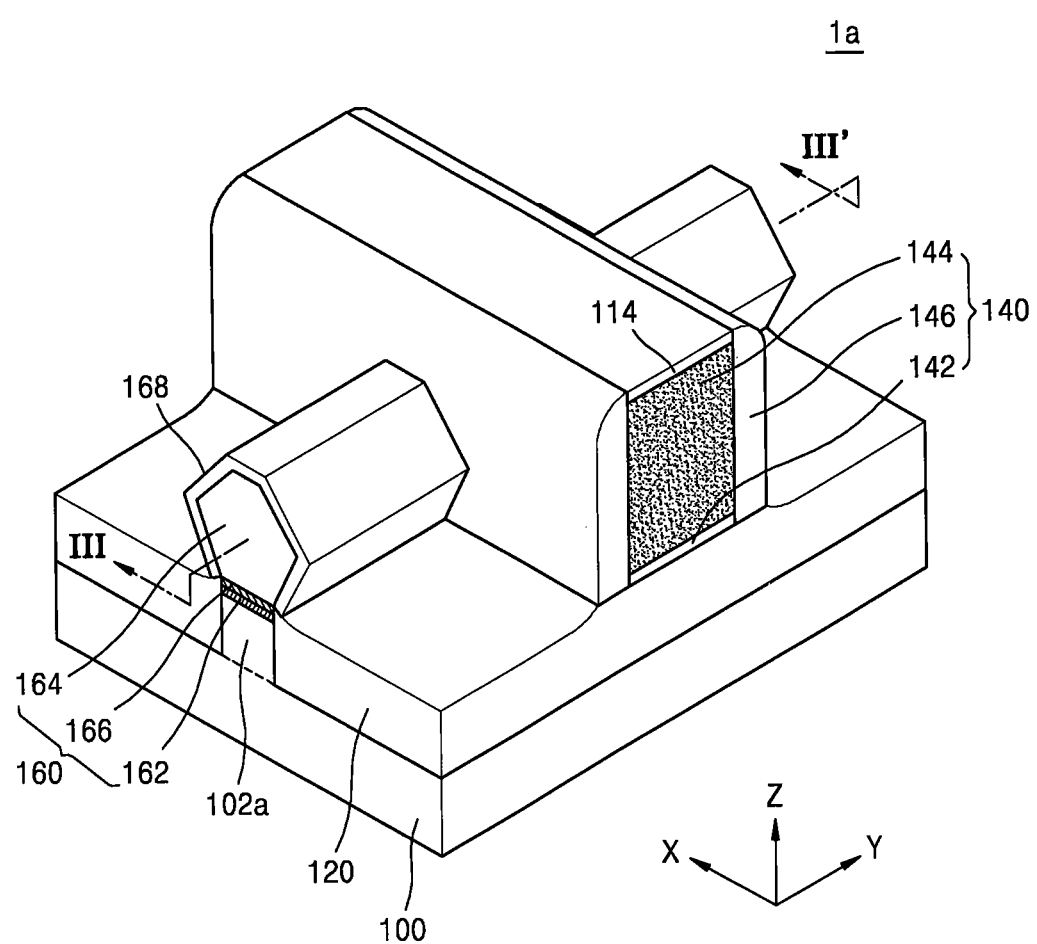
FIG. 12A is a perspective view for explaining an operation of forming a source/drain region in order to manufacture a semiconductor device according to an embodiment of the inventive concepts.
Figure 12B:
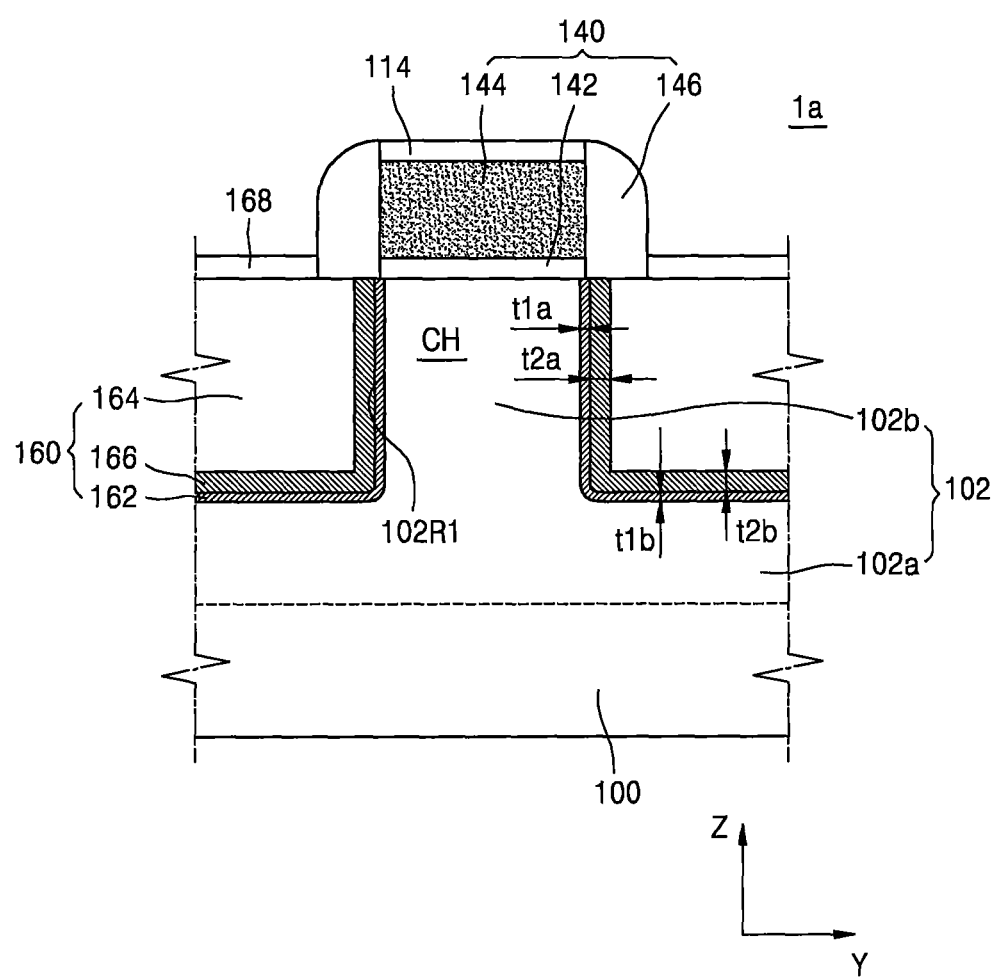
FIG. 12B is a cross-sectional view for explaining the operation of forming the source/drain region in order to manufacture a semiconductor device according to an embodiment of the inventive concepts.

In some embodiments, the insulation layer 142 and the extending pattern 144 may be a dummy gate dielectric layer and a dummy gate electrode pattern, respectively. For example, insulation layer 142 and the extending pattern 144 may be a dummy gate dielectric layer and a dummy gate electrode pattern in the case where the semiconductor device 1 of FIGS. 1A and 1B is to be formed. In other embodiments, such as in the case where a semiconductor device 1a of FIGS. 12A and 12B is to be formed, the insulation layer 142 and the extending pattern 144 may be a gate dielectric layer and a gate electrode pattern, respectively.

Figure 6:
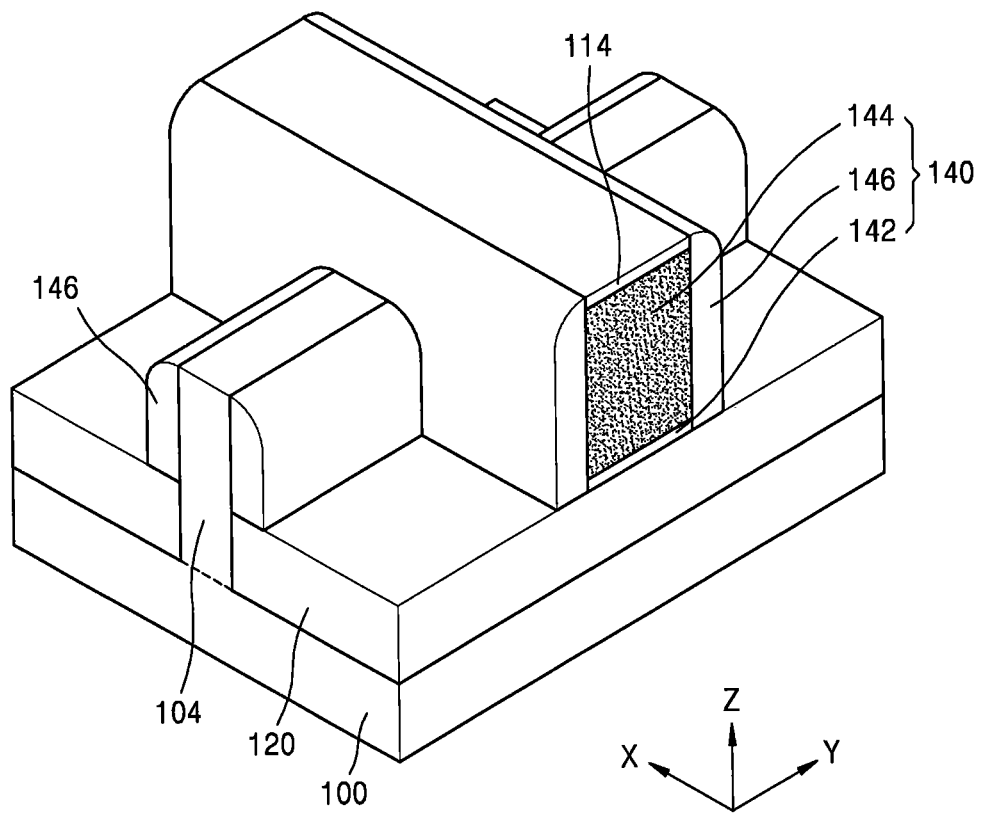
FIG. 6 is a perspective view for explaining an operation of forming a spacer layer in order to manufacture a semiconductor device according to an embodiment of the inventive concepts.

FIG. 6 is a perspective view for explaining an operation of forming a spacer layer in order to manufacture a semiconductor device according to an embodiment of the inventive concepts.

Referring to FIG. 6, a gate spacer 146 is formed to cover the respective lateral surfaces of the insulation layer 142 and the extending pattern 144. The insulation layer 142, the extending pattern 144 and the gate spacer 146 may together form an extending pattern structure 140. The gate spacer 146 may be formed by forming a gate spacer material layer (not shown) on an upper surface of the substrate 100 on which the insulation layer 142 and the extending pattern 144 have been formed and then removing a portion of the gate spacer material layer via anisotropic etching. The gate spacer 146 may be formed of, for example, a silicon nitride layer or a silicon oxynitride layer.

According to another embodiment, when the insulation layer 142 and the extending pattern 144 are respectively a gate dielectric layer and a gate electrode pattern, the insulation layer 142, the extending pattern 144, and the gate spacer 146 may constitute the gate structure 140a.

The gate spacer 146 may also cover lateral surfaces of the protruding pattern 104 that are not covered by the insulation layer 142 and/or the extending pattern 144.

In the embodiment of FIG. 6, the second mask pattern 114 is left on the extending pattern, and hence the gate spacer 146 also covers lateral surfaces of the second mask pattern 114. In other embodiments, the second mask pattern 114 may be removed before the gate spacer 146 is formed, as described above.

Figure 7:
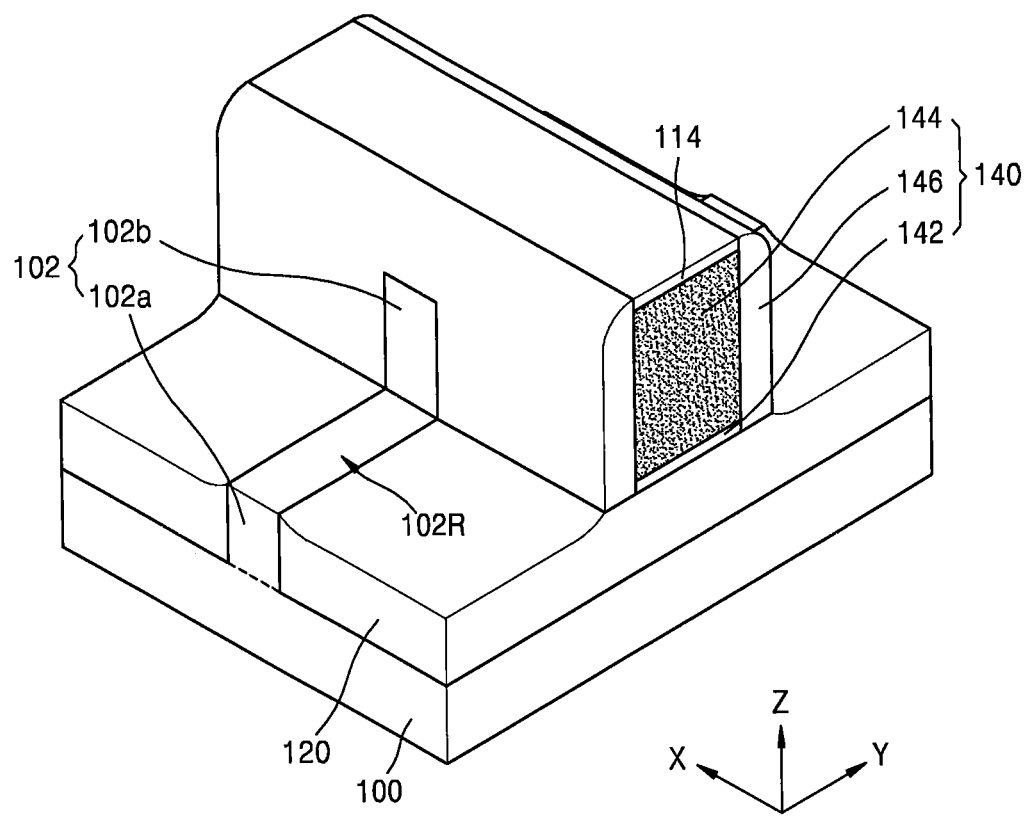
FIG. 7 is a perspective view for explaining an operation of forming a fin structure having a pair of recesses in order to manufacture a semiconductor device according to an embodiment of the inventive concepts.

FIG. 7 is a perspective view for explaining an operation of forming a fin structure 102 having a pair of recesses 102R in order to manufacture a semiconductor device according to an embodiment of the inventive concepts.

Referring to FIG. 7, portions of the protruding pattern 104 of FIG. 6 on both sides of the extending pattern structure 140 and portions of the gate spacer 146 that cover the lateral surfaces of the portions of the protruding pattern 104 are removed to thereby form the fin structure 102 having a protrusion 102b and the pair of recesses 102R (i.e., the open space that is created by removal of the portions of the protruding pattern 104 on either side of the extending pattern structure 140). The recesses 102R are located on both sides of the protrusion 102b. In other words, the pair of recesses 102R may be created by removing portions of the protruding pattern 104 on both sides of the extending pattern structure 140, and a portion of the protruding pattern 104 that remains between the recesses 102R may serve as the protrusion 102b. The fin structure 102 may include a base 102a that extends below the protrusion 102b and that defines the bottoms of the recesses 102R, and the protrusion 102b that is disposed over the base 102a.

An upper surface of the base 102a may be exposed, and lateral surfaces of the protrusion 102b may also be exposed.

Figure 8A:
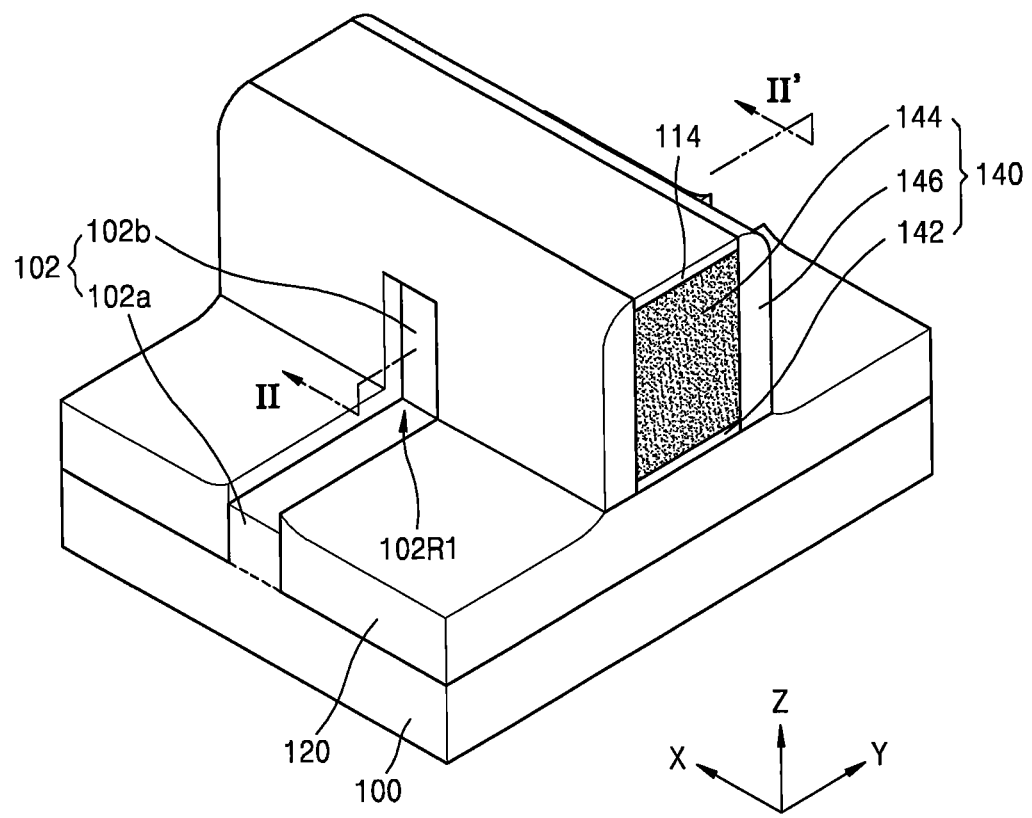
FIG. 8A is a perspective view for explaining an operation of extending the recesses in order to manufacture a semiconductor device according to an embodiment of the inventive concepts.

FIG. 8A is a perspective view for explaining an operation of extending the recesses 102R of FIG. 7, in order to manufacture a semiconductor device according to an embodiment of the inventive concepts.

Figure 8B:
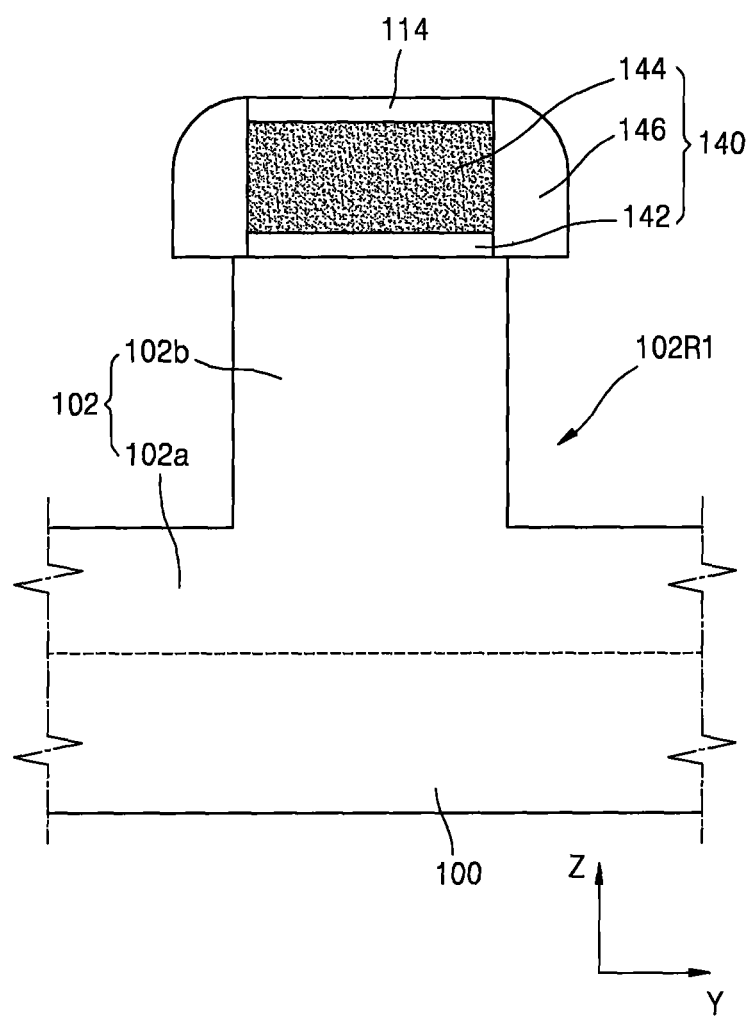
FIG. 8B is a cross-sectional view for explaining the operation of extending the recesses in order to manufacture a semiconductor device according to an embodiment of the inventive concepts.

FIG. 8B is a cross-sectional view taken along the line of FIG. 8A.

Referring to FIGS. 8A and 8B, a portion of the fin structure 102 is removed from an exposed surface thereof. In particular, a portion of the protrusion 102b is removed from both lateral surfaces of the protrusion 102b. Accordingly, the gate spacer 146 may extend farther laterally than does the protrusion 102b. Additionally, an upper surface of the exposed portions of the base 102a may also be removed. In this manner the recesses 102R of FIG. 7 are converted into recesses 102R1. As shown in FIG. 8B, the insulation layer 142 is not exposed via the recesses 102R1.

For example, a lower portion of the gate spacer 146 may be removed that has a height of 30 nm to 60 nm.

Figure 9:
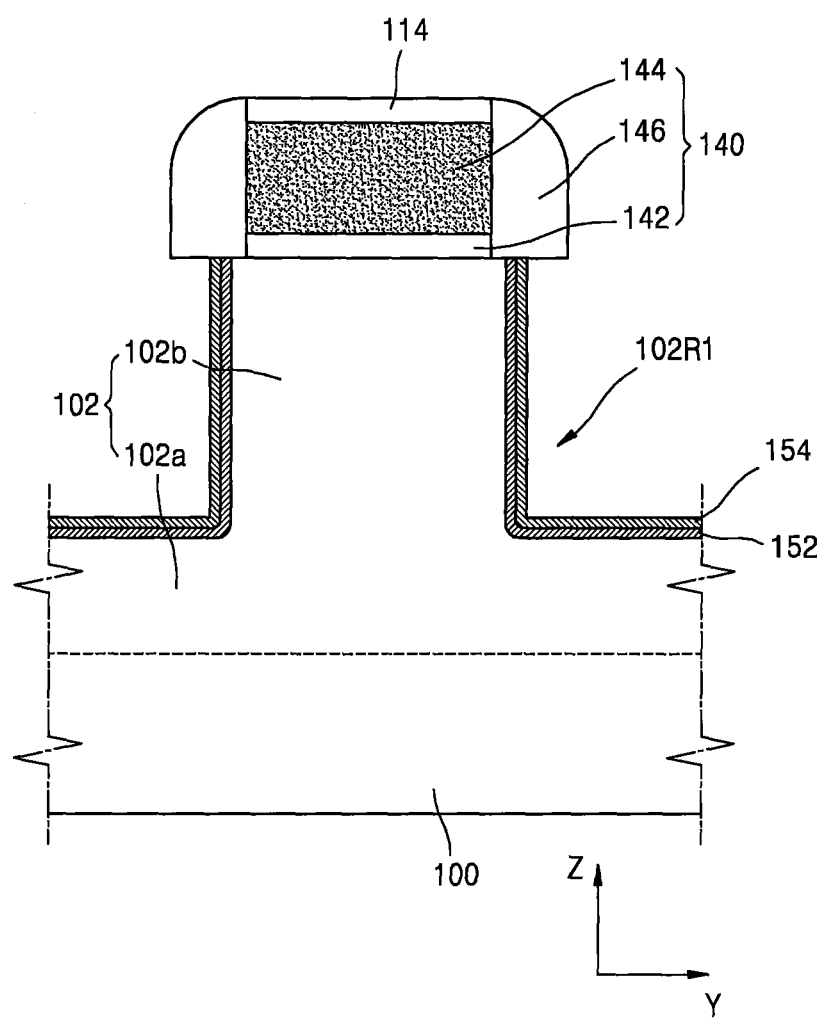
FIG. 9 is a cross-sectional view for explaining an operation of forming first and second semiconductor layers in order to manufacture a semiconductor device according to an embodiment of the inventive concepts.
Figure 10:
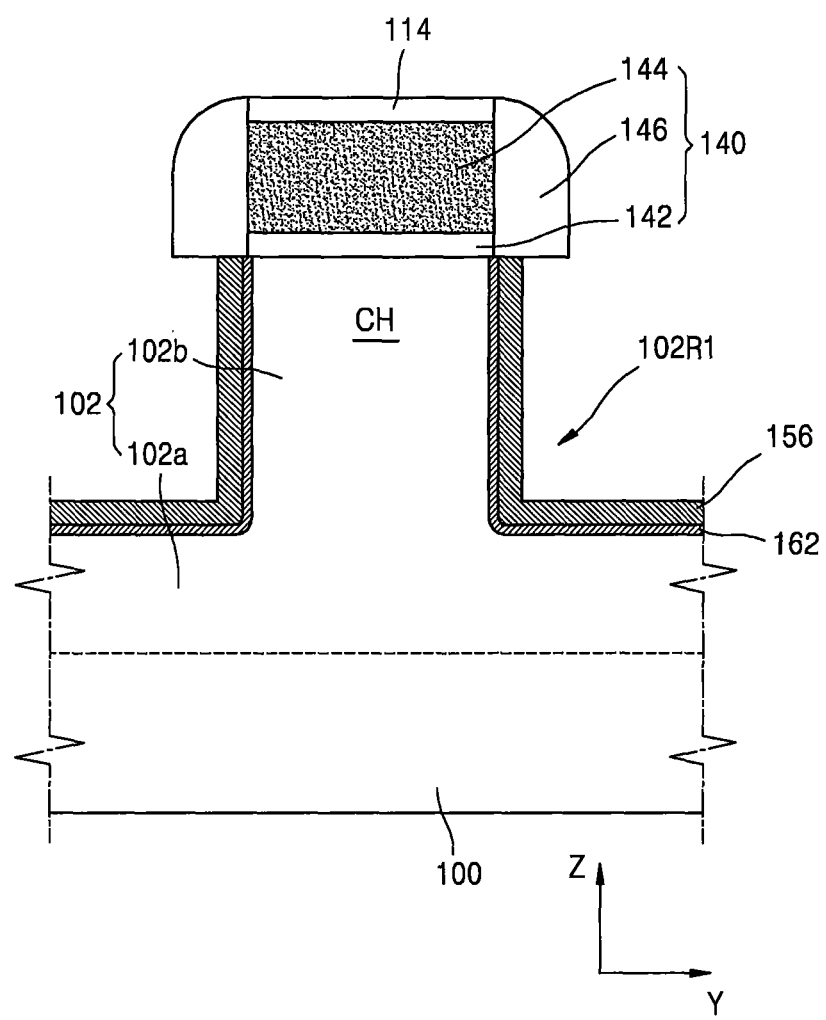
FIG. 10 is a cross-sectional view for explaining an operation of forming an oxide layer and a first strain-inducing layer in order to manufacture a semiconductor device according to an embodiment of the inventive concepts.
Figure 11:
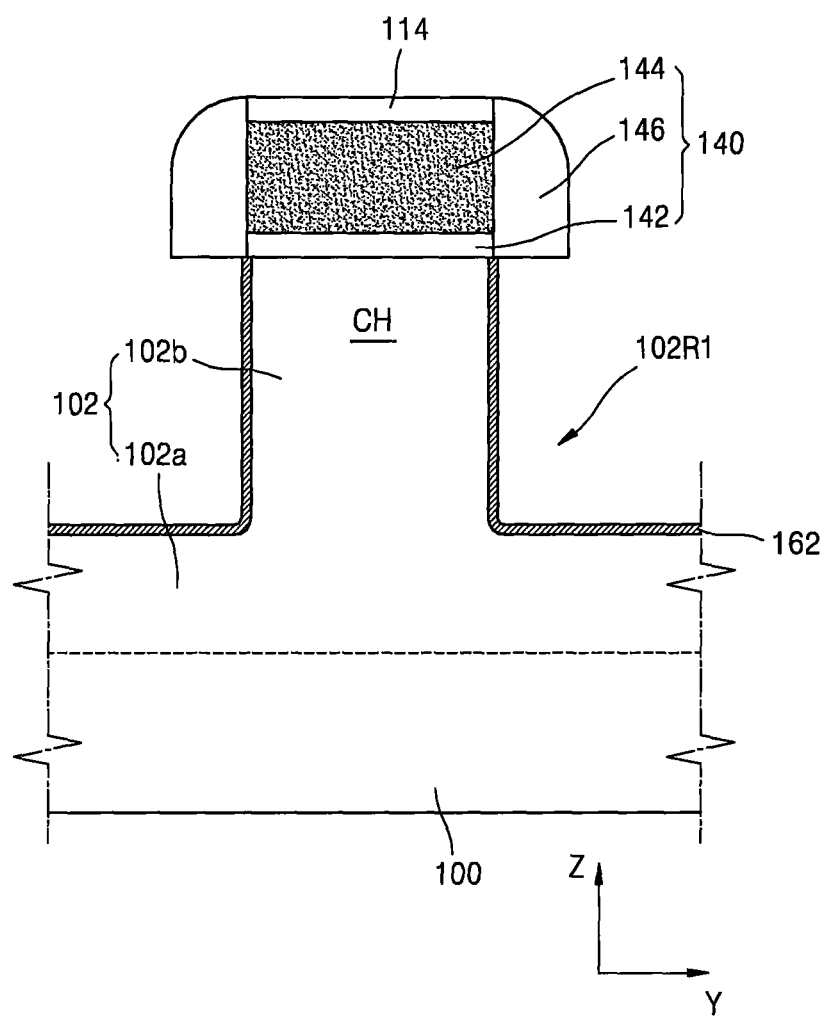
FIG. 11 is a cross-sectional view for explaining an operation of removing the oxide layer in order to manufacture a semiconductor device according to an embodiment of the inventive concepts.

FIG. 9 is a cross-sectional view for explaining an operation of forming first and second semiconductor layers 152 and 154 in order to manufacture a semiconductor device according to an embodiment of the inventive concepts. FIGS. 9-11 are cross-sectional views taken along the same line as FIG. 8B (namely line II-II of FIG. 7) after successive processing steps are performed.

Referring to FIG. 9, the first semiconductor layer 152 and the second semiconductor layer 154 are sequentially formed on an exposed surface of the fin structure 102, namely, on both upper surfaces of the base 102a that is exposed via the recesses 102R1 and on lateral surfaces of the protrusion 102b that are exposed via the recesses 102R1. The first semiconductor layer 152 may be, for example, a semiconductor material including Ge. The first semiconductor layer 152 may be, for example, undoped SiGe. The first semiconductor layer 152 may have a Ge content of, for example, 10% to 80%. The second semiconductor layer 154 may be, for example, an undoped semiconductor material including Si. The first semiconductor layer 152 may be formed by, for example, SEG in which the fin structure 102 is used as a seed. The second semiconductor layer 154 may be formed by, for example, SEG in which the first semiconductor layer 152 is used as a seed. The first semiconductor layer 152 and the second semiconductor layer 154 may be formed together in-situ.

Although in the embodiment of FIG. 9 the first semiconductor layer 152 and the second semiconductor layer 154 are sufficiently thin such that a portion of the lower surface of the gate spacer 146 is exposed, the thicknesses of the first semiconductor layer 152 and the second semiconductor layer 154 are not limited thereto. For example, the first semiconductor layer 152 and the second semiconductor layer 154 may be formed so that the first semiconductor layer 152 exposes a portion of the lower surface of the gate spacer 146 and the second semiconductor layer 154 covers the remaining portion of the lower surface of the gate spacer 146. In still other embodiments, for example, the first semiconductor layer 152 may be formed to a thickness that is sufficient to cover the entire lower surface of the gate spacer 146.

FIG. 10 is a cross-sectional view for explaining an operation of forming an oxide layer 156 and a first strain-inducing layer 162 in order to manufacture a semiconductor device according to an embodiment of the inventive concepts.

Referring to FIGS. 9 and 10, the oxide layer 156 is formed by oxidizing the second semiconductor layer 154. While the second semiconductor layer 154 is being oxidized, a portion of the first semiconductor layer 152 is also oxidized, thereby forming the oxide layer 156. The oxide layer 156 may be formed of, for example, silicon oxide. The oxide layer 156 may be formed by, for example, thermal oxidation under an atmosphere of 400° C. to 1000° C.

When the first semiconductor layer 152 is formed of a semiconductor material including Ge, for example, SiGe, Si atoms included in a portion of the first semiconductor layer 152 may be used to form the oxide layer 156, and Ge atoms in the first semiconductor layer 152 may diffuse into a remaining portion of the first semiconductor layer 152 and/or a portion of the fin structure 102 to form the first strain-inducing layer 162.

When the SiGe is oxidized, the Si atoms contribute to forming the oxide layer 156, but the Ge atoms may diffuse toward non-oxide because they have a very low diffusion coefficient within the $SiO_2$. Accordingly, when a portion of the oxide layer 156 is formed by oxidizing a portion of the first semiconductor layer 152, the Ge atoms included in the oxidized portion of the first semiconductor layer 152 may be diffused into the remaining portion of the first semiconductor layer 152 that is not oxidized, and some of the Ge atoms may be diffused into a portion of the fin structure 102.

Alternatively, the Si atoms included in the first semiconductor layer 152 may be used to form the oxide layer 156, and the Ge atoms included therein may be diffused into a portion of the fin structure 102 that is adjacent to the first semiconductor layer 152, thereby forming the first strain-inducing layer 162.

Alternatively, both the first and second semiconductor layers 152 and 154 may be oxidized and a portion of the protrusion 102b may also be oxidized, to thereby form the oxide layer 156. The Ge atoms included in the first semiconductor layer 152 may be diffused into a non-oxidized portion of the fin structure 102 that is adjacent to the first semiconductor layer 152, to thereby form the first strain-inducing layer 162.

In other words, during forming the first strain-inducing layer 162, a portion of the first semiconductor layer 152 may turn into the oxide layer 156, the entire first semiconductor layer 152 may turn into the oxide layer 156, or both the entire first semiconductor layer 152 and a portion of the fin structure 102 may turn into the oxide layer 156. A strain-inducing layer 162 is formed adjacent the oxide layer 156. The first strain-inducing layer 162 may contact at least a portion of the gate spacer 146. In particular, the first strain-inducing layer 162 may contact a portion of the lower surface of the gate spacer 146 that contacts the insulation layer 142. Alternatively, the first strain-inducing layer 162 may have an upper surface that directly contacts a boundary between the gate spacer 146 and the insulation layer 142 so as to directly contact at least a portion of each of the gate spacer 146 and the insulation layer 142.

In some embodiments, the oxide layer 156 may be formed under temperature and atmospheric conditions that are selected so that a speed at which the oxide layer 156 is formed by thermal oxidation is higher than a speed at which the Ge atoms are diffused. When the oxide layer 156 is formed under these conditions, Ge condensation may occur that may allow the Ge content of the first strain-inducing layer 162 to be higher than that of the first semiconductor layer 152.

The first strain-inducing layer 162 may be integrally formed on both at least a portion of the lateral surface of the protrusion 102b of the fin structure 102 and at least a portion of the bottoms of the recesses 102R1.

A portion of the protrusion 102b defined by the first strain-inducing layer 162 may be a channel region CH.

In the embodiment of FIGS. 9 and 10, the second semiconductor layer 154 is entirely oxidized to form a portion of the oxide layer 156. However, according to another embodiment, the second semiconductor layer 154 may not be formed and a portion of the first semiconductor layer 152, the entire first semiconductor layer 152, or both the entire first semiconductor layer 152 and a portion of the fin structure 102 may be oxidized to form the oxide layer 156.

FIG. 11 is a cross-sectional view for explaining an operation of removing the oxide layer 156 in order to manufacture a semiconductor device according to an embodiment of the inventive concepts.

Referring to FIGS. 10 and 11, the oxide layer 156 is removed to expose the first strain-inducing layer 162. The oxide layer 156 may be removed by dry etching, such as Chemical Oxide Removal (COR), SiConitm, or PNC, by wet etching using an HF, a Buffered Oxide Etchant (BOE), or the like, or by a combination of dry etching and wet etching.

FIG. 12A is a perspective view for explaining an operation of forming a source/drain region in order to manufacture a semiconductor device according to an embodiment of the inventive concepts.

FIG. 12B is a cross-sectional view taken along line of FIG. 12A.

Referring to FIGS. 12A and 12B, the source/drain region 160 may be formed by forming a second strain-inducing layer 164 that covers the first strain-inducing layer 162.

Optionally, before the second strain-inducing layer 164 is formed, a third strain-inducing layer 166 may be formed that covers the first strain-inducing layer 162, and then the second strain-inducing layer 164 may be formed on the third strain-inducing layer 166, thereby forming the source/drain region 160. The third strain-inducing layer 166 may be formed by SEG using the first strain-inducing layer 162 as a seed.

The second strain-inducing layer 164 may be formed by SEG using the third strain-inducing layer 166 as a seed.

The first strain-inducing layer 162 may be formed such that a thickness t1b of a portion thereof that is between the lower surface of the second strain-inducing layer 164 and the substrate 100 may be greater than a thickness t1a of a portion of the first strain-inducing layer 162 that is between the second strain-inducing layer 164 and the lateral surface of the channel region CH. The third strain-inducing layer 166 may be formed such that a thickness t2b of a portion thereof on the bottom of the recess 102R1 may be greater than a thickness t2a of a portion of the third strain-inducing layer 166 on the lateral surface of the channel region CH.

The second strain-inducing layer 164 may have a different conductivity from that of the channel region CH. For example, when the channel region CH is a second conductivity type, the second strain-inducing layer 164 may have a first conductivity type that is different from the second conductivity type. For example, when the channel region CH is an n-type semiconductor material, the second strain-inducing layer 164 may be a p-type semiconductor material.

The first strain-inducing layer 162 may initially be substantially undoped. However, during the formation of the second and third strain-inducing layers 164 and 166, some dopants may diffuse into the first strain-inducing layer 162, and hence the first strain-inducing layer 162 may have the first conductivity type with a doping concentration that is greatly lower than that of each of the second strain-inducing layer 164 and the channel region CH.

When the first strain-inducing layer 162 has the first doping concentration, the second strain-inducing layer 164 may have a second doping concentration that is greater than the first doping concentration. For example, the second doping concentration may be greater than the first doping concentration by at least two orders of magnitude.

The third strain-inducing layer 166 may have a third doping concentration that is smaller than the second doping concentration. The third doping concentration may be greater than the first doping concentration.

For example, the channel region CH and the source/drain region 160 may form a strain transistor that is a p-type field effect transistor. In this case, atoms that induce a strain in the strain transistor may be Ge, and each of the second strain-inducing layer 164 and the third strain-inducing layer 166 may be doped with of, for example, B.

The third strain-inducing layer 166 may have a Ge content that is smaller than the Ge contents of each of the first and second strain-inducing layers 162 and 164.

If the first strain-inducing layer 162 is not formed and the third strain-inducing layer 166 directly contacts the channel region CH, dopants included in the third strain-inducing layer 166 may diffuse into the channel region CH. As the dopants that diffuse into the channel region CH from the third strain-inducing layer 166 have a different conductivity type from the dopants that are in the channel region CH, this diffusion of dopants from the third strain-inducing layer 166 may effectively shorten the length of the channel region CH. This may lead to occurrence of a short channel effect (SCE) and/or to a change in a threshold voltage of the transistor. However, in embodiments where the first strain-inducing layer 162 is included (which may be undoped or doped to a relatively low doping concentration), little or no diffusion of dopants from the third strain-inducing layer 166 into the channel region CH may occur, and thus the possibility of SCE and/or deviations in the threshold voltage may be reduced.

If the first strain-inducing layer 162 is formed directly on the fin structure 102 by SEG as opposed to by the method discussed above, the first strain-inducing layer 162 may fail to have a uniform thickness profile and may be formed more thinly on an upper portion of the protrusion 102b than on a lower portion of the protrusion 102b. Moreover, if the first strain-inducing layer 162 is formed directly on the fin structure 102 by SEG, the recesses 102R1 would need to extend further laterally to reach the insulation layer 142 in order for the first strain-inducing layer 162 to contact the insulation layer 142. However, during the etching process (es) used to form such a recess the insulation layer 142 may be damaged.

However, since the first strain-inducing layer 162 according to an embodiment of the inventive concepts is formed by Ge condensation that is based on Ge diffusion, the first strain-inducing layer 162 may have a conformal thickness profile on sidewalls of the protrusion 102b and at the same time may avoid damage to the insulation layer 142.

Moreover, when the first strain-inducing layer 162 according to an embodiment of the inventive concepts is omitted and the third strain-inducing layer 166 is formed to have a relatively high Ge content in order to increase the strain applied to the channel region CH, the third strain-inducing layer 166 may fail to have a uniform thickness profile and may be formed more thinly on an upper portion of the protrusion 102b than on a lower portion thereof. In this case, when the second strain-inducing layer 164 is formed using the third strain-inducing layer 166 as a seed, a portion of the second strain-inducing layer 164 that is adjacent to the upper portion of the protrusion 102b may not form properly.

However, since the first strain-inducing layer 162 according to an embodiment of the inventive concepts has a high Ge content via Ge condensation that is based on Ge diffusion, the strain that is applied to the channel region CH may be increased, and the third strain-inducing layer 166 may be formed to have a relatively low Ge content. Thus, the third strain-inducing layer 166 may be formed to have a relatively constant thickness on the lateral surfaces of the protrusion 102b. Accordingly, when the second strain-inducing layer 164 is formed using the third strain-inducing layer 166 as a seed, a portion of the second strain-inducing layer 164 that is adjacent to the upper portion of the protrusion 102b may be properly formed.

A source/drain capping layer 168 may be formed on the source/drain region 160. The source/drain capping layer 168 may cover the entirety of the exposed surfaces of the source/drain region 160. The source/drain capping layer 168 may be, for example, Si doped with a first conductivity type dopant or undoped Si.

Referring back to FIGS. 1A and 1B, the second mask pattern 114 (if it has been left in place), the extending pattern 144 (which is a dummy gate electrode pattern) and the insulation layer 142 (which is a dummy gate dielectric layer 142) may then be removed, and a gate electrode pattern 144a may be formed on the channel region CH and a gate dielectric layer 142a may be interposed between the channel region CH and the gate electrode pattern 144a to provide a gate structure 140a.

The gate dielectric layer 142a may conformally cover the space defined by the channel region CH and the gate spacer 146, and the gate electrode pattern 144a may be formed on the gate dielectric layer 142a so as to fill the space defined by the channel region CH and the gate spacer 146.

The gate dielectric layer 142a may be formed of, for example, a high dielectric material that has a dielectric constant that is higher than a dielectric constant of a silicon oxide layer. In some embodiments, the dielectric constant of the gate dielectric layer 142a may be greater than 8. For example, the gate dielectric layer 142a may include $HfO_2$, $ZrO_2$, or $Ta_2O_5$. The gate electrode pattern 144a may include, for example, at least one metal layer. The gate electrode pattern 144a may have, for example, a stacked structure in which at least two metal layers are stacked. The gate electrode pattern 144a may include, for example, a TiN layer, a TaN layer, a TiC layer, a TaC layer, a W layer, an Al layer or a stack thereof. The gate electrode pattern 144a may be formed using, for example, a damascene process in which the gate spacer 146 is used as a mold.

Referring back to FIGS. 12A and 12B, the insulation layer 142 and the extending pattern 144 may be respectively a gate dielectric layer 142 and a gate electrode pattern 144. In this case, the semiconductor device 1a may be formed without removing the insulation layer 142 and the extending pattern 144.

In other words, the semiconductor device 1 of FIGS. 1A and 1B may be formed via a replacement process in which the dummy gate dielectric layer 142 and the dummy gate electrode pattern 144 are removed and then the gate dielectric layer 142a and the gate electrode pattern 144a are formed. Alternatively, the semiconductor device 1a of FIGS. 12A and 12B may be formed without performing the replacement process, since the insulation layer 142 and the extending pattern 144 are respectively the gate dielectric layer 142 and the gate electrode pattern 144.

Figure 13A:
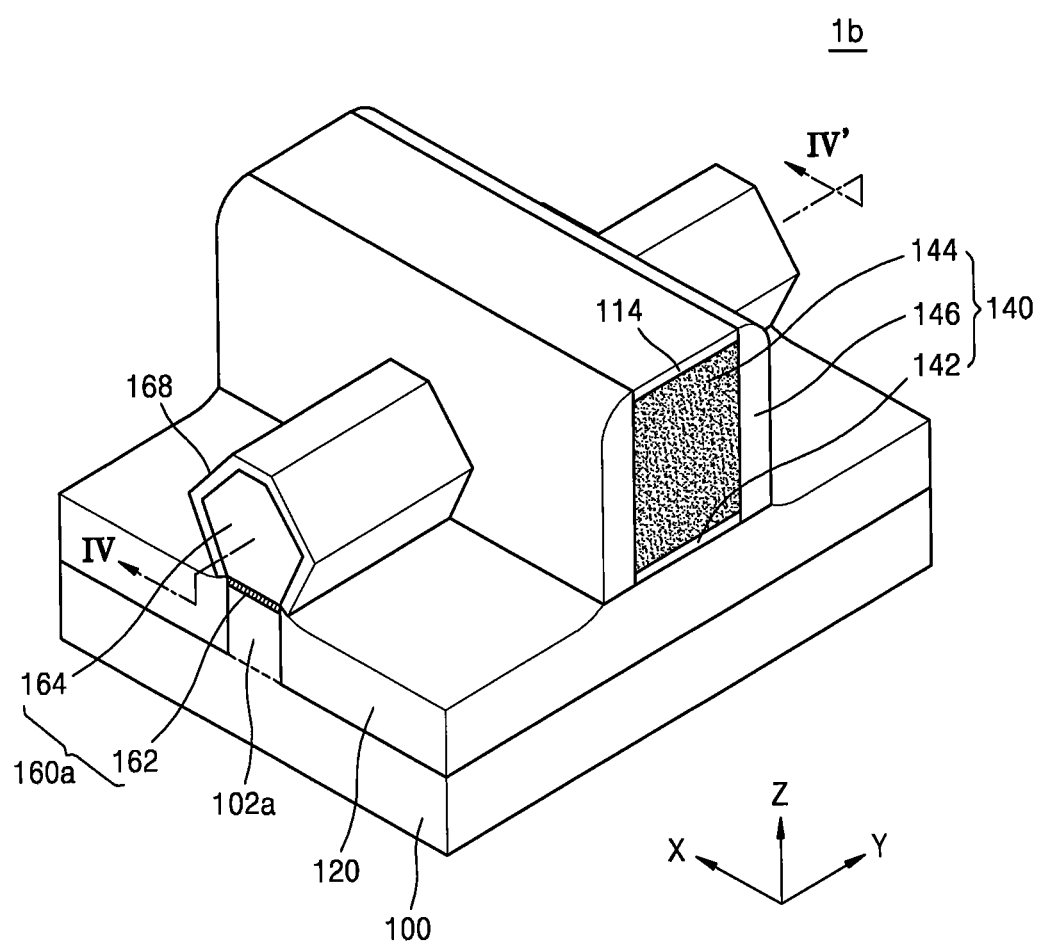
FIG. 13A is a perspective view illustrating a semiconductor device according to an embodiment of the inventive concepts.

FIG. 13A is a perspective view of a semiconductor device 1b according to an embodiment of the inventive concepts.

Figure 13B:
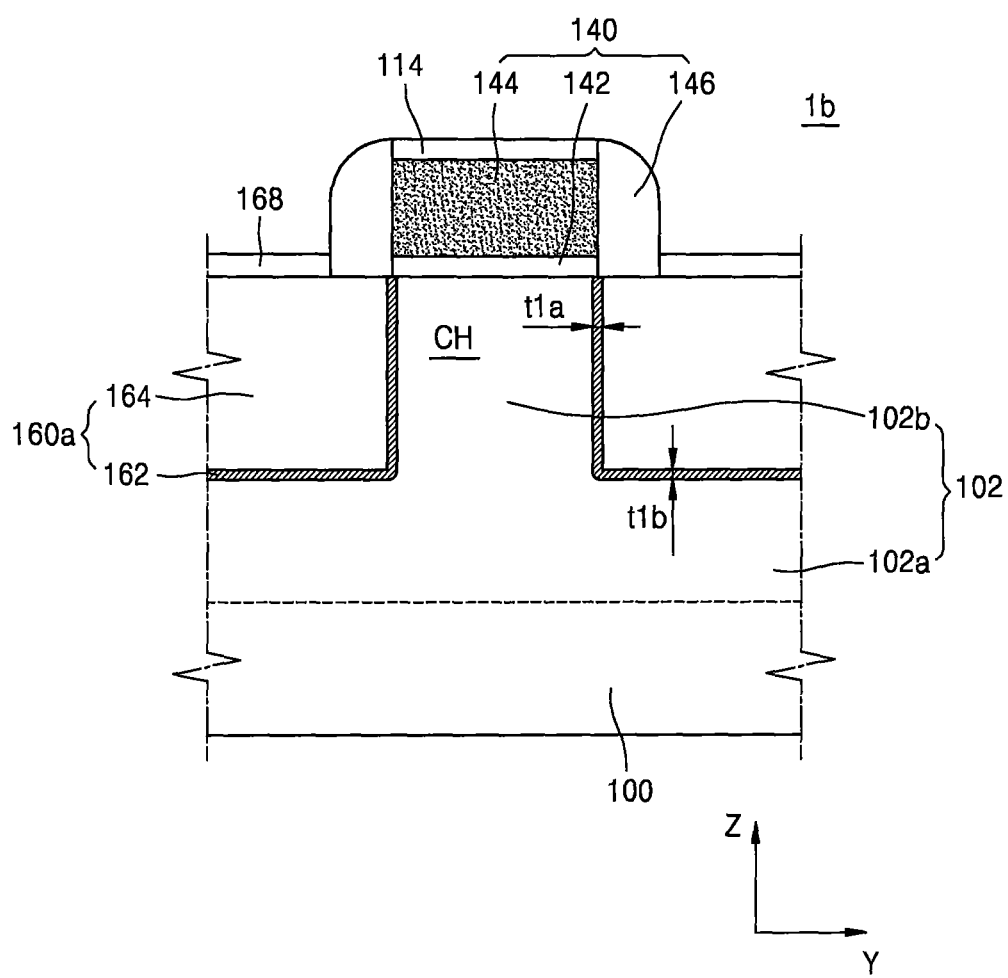
FIG. 13B is a cross-sectional view of the semiconductor device of FIG. 13A.

FIG. 13B is a cross-sectional view taken along line IV-IV' of FIG. 13A.

Referring to FIGS. 13A and 13B, a source/drain region 160a includes first and second strain-inducing layers 162 and 164. The second strain-inducing layer 164 may be formed by SEG using the first strain-inducing layer 162 as a seed.

The semiconductor device 1b of FIGS. 13A and 13B does not include third strain-inducing layers 166 in contrast with the semiconductor device 1a of FIGS. 12A and 12B. The semiconductor device 1b of FIGS. 13A and 13B is the same as the semiconductor device 1a of FIGS. 12A and 12B except that the third strain-inducing layers 166 are omitted, and thus further description of the semiconductor device 1b will not be provided.

Figure 14A:
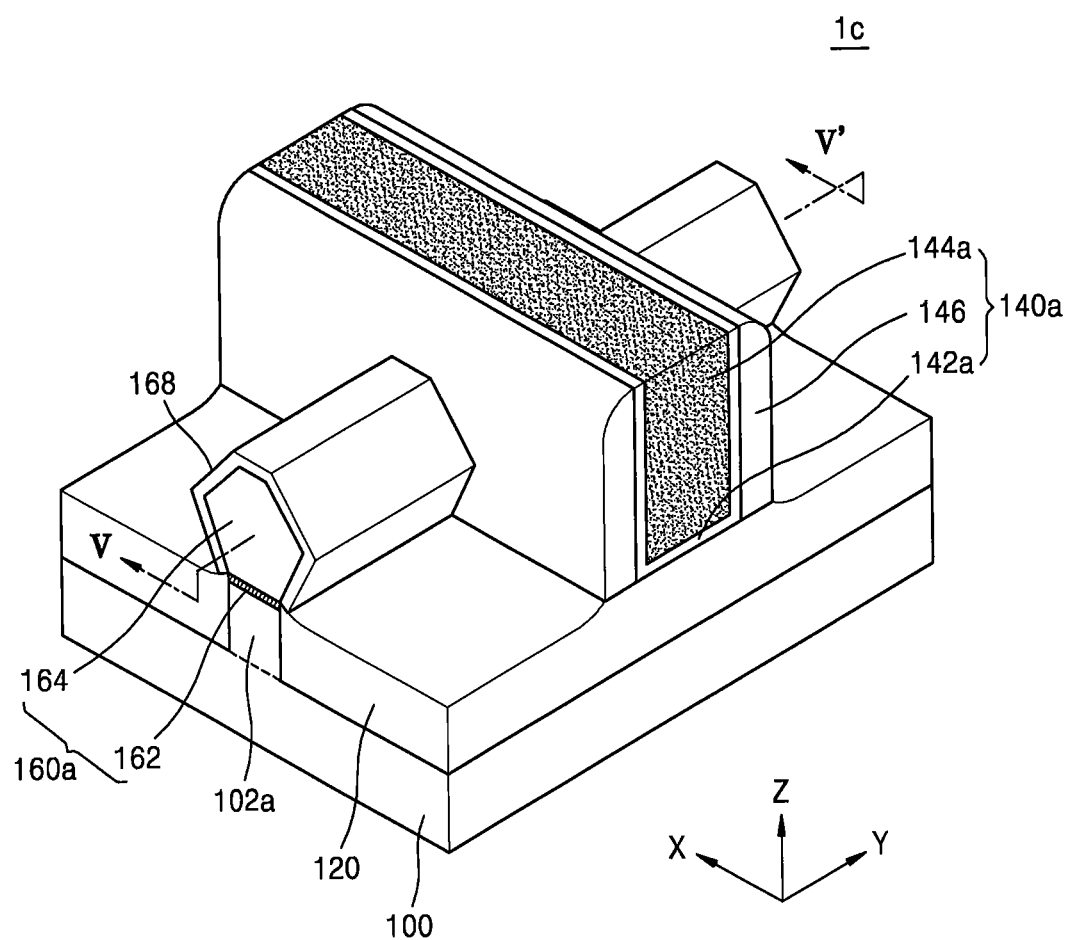
FIG. 14A is a perspective view illustrating a semiconductor device according to an embodiment of the inventive concepts.

FIG. 14A is a perspective view of a semiconductor device 1c according to another embodiment of the inventive concepts.

Figure 14B:
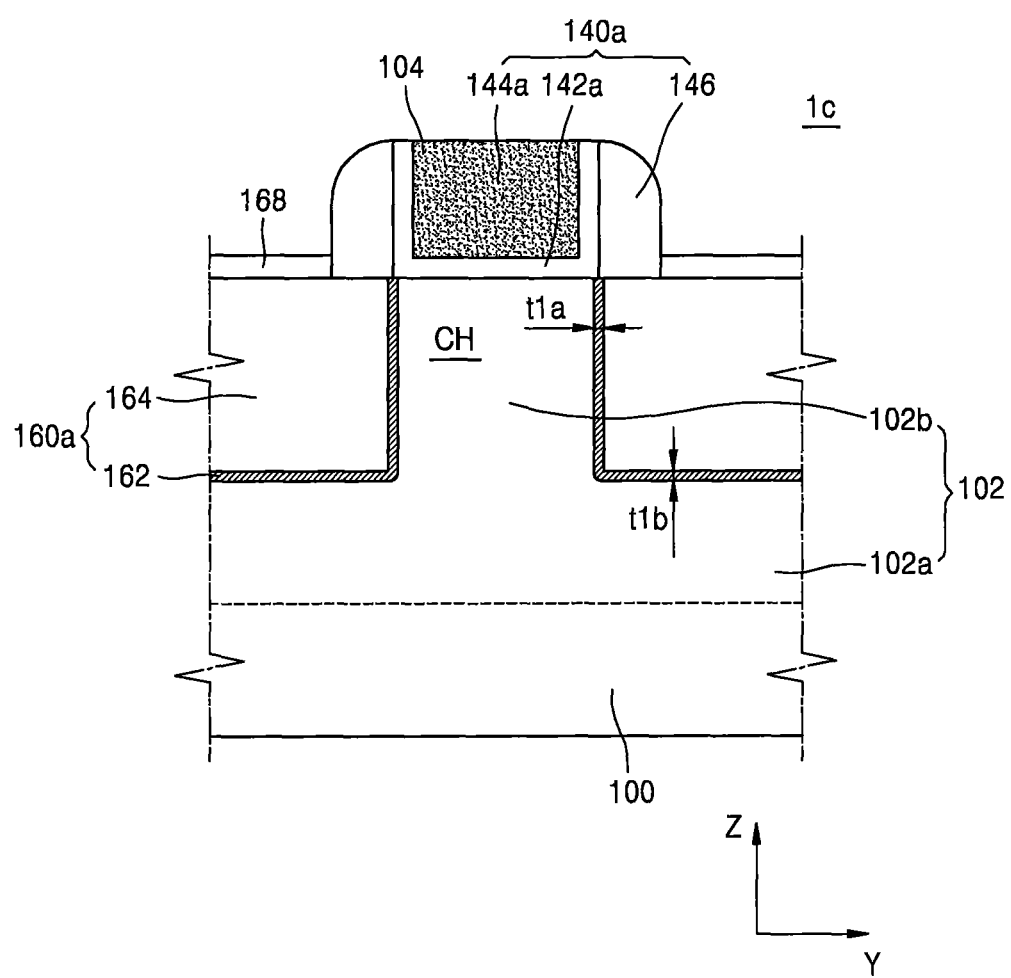
FIG. 14B is a cross-sectional view of the semiconductor device of FIG. 14A.

FIG. 14B is a cross-sectional view taken along line V-V' of FIG. 14A.

Referring to FIGS. 14A and 14B, a source/drain region 160a includes first and second strain-inducing layers 162 and 164. The second strain-inducing layer 164 may be formed by SEG using the first strain-inducing layer 162 as a seed.

The semiconductor device 1c of FIGS. 14A and 14B does not include third strain-inducing layers 166 in contrast with the semiconductor device 1 of FIGS. 1A and 1B. The semiconductor device 1c of FIGS. 14A and 14B is the same as the semiconductor device 1 of FIGS. 1A and 1B except that the third strain-inducing layers 166 are omitted, and thus further description of the semiconductor device 1c will not be provided.

Figure 15:
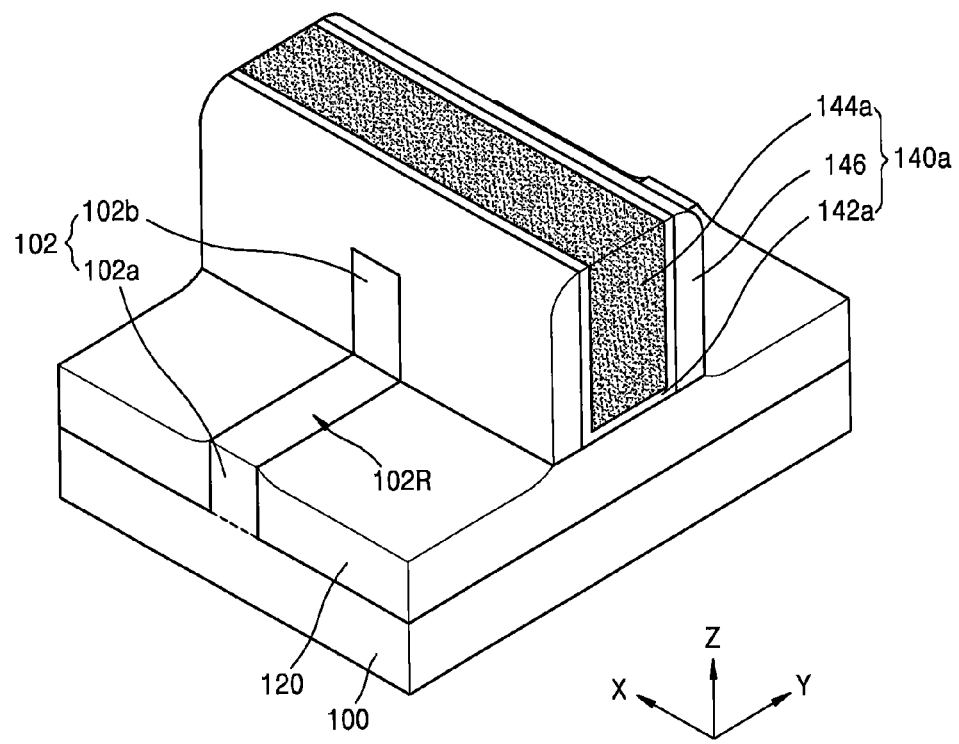
FIG. 15 is a perspective view for explaining an operation of forming a gate electrode pattern in order to manufacture a semiconductor device according to an embodiment of the inventive concepts.

FIG. 15 is a perspective view for explaining an operation of forming a gate electrode pattern 144a in order to manufacture a semiconductor device according to an embodiment of the inventive concepts. In detail, FIG. 15 is a perspective view for explaining operations subsequent to the operation of FIG. 6.

Referring to FIGS. 6 and 15, the extending pattern 144 and the insulation layer 142 may be removed, and then gate dielectric layer 142a and the gate electrode pattern 144a are formed on the channel region CH to form the gate structure 140a. In this case, the insulation layer 142 is a dummy gate dielectric layer 142 and the extending pattern 144 is a dummy gate electrode pattern 144.

Thereafter, the portions of the protruding pattern 104 of FIG. 6 that are on both sides of the extending pattern structure 140 and the portions of the gate spacer 146 that cover the lateral surfaces of the portions of the protruding pattern 104 that are on both sides of the extending pattern structure 104 are removed to form the fin structure 102 having the protrusion 102b and the recesses 102R located on both sides of the protrusion 102b. Then, the operations subsequent to the operation of FIG. 8 may be performed to form the semiconductor device 1 of FIGS. 1A and 1B.

In other words, to manufacture the semiconductor device 1 of FIGS. 1A and 1B, the gate structure 140a may be first formed and then the source/drain region 160 may be formed, or the source/drain region 160 may be first formed and then the gate structure 140a may be formed. This logic may be equally applied to the method of forming the semiconductor device 1c of FIGS. 14A and 14B.

Figure 16:
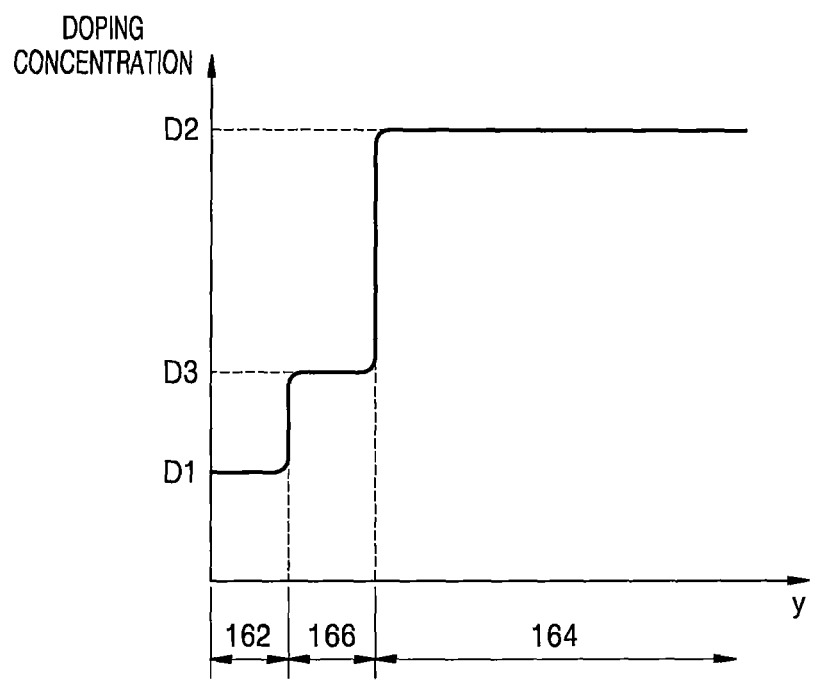
FIG. 16 is a graph showing first, second, and third doping concentrations of first, second, and third strain-inducing layers of a semiconductor device according to an embodiment of the inventive concepts.

FIG. 16 is a graph showing first, second, and third doping concentrations D1, D2, and D3 of the respective first, second, and third strain-inducing layers 162, 164, and 166 of semiconductor devices according to embodiments of the inventive concepts. The graph of FIG. 16 may illustrate doping concentrations in both the semiconductor device 1 of FIGS. 1A and 1B and the semiconductor device 1a of FIGS. 12A and 12B.

Referring to FIG. 16, the first strain-inducing layer 162, the second strain-inducing layer 164, and the third strain-inducing layer 166 may have the first doping concentration D1, the second doping concentration D2, and the third doping concentration D3, respectively.

The first doping concentration D1 may be smaller than both the second and third doping concentrations D2 and D3. The second doping concentration D2 may be greater than the third doping concentration D3. For example, the first doping concentration D1 may be substantially 0 or may be smaller than each of the second and third doping concentrations D2 and D3 by at least two orders of magnitude. The second doping concentration D2 may be, for example, 1.0E20 to 3E21 atoms/cm$^3$.

The relationship between the first doping concentration D1 and the second doping concentration D2 illustrated in FIG. 16, that is, a relationship where the first doping concentration D1 is smaller than the second doping concentration D2, may also hold with respect to the semiconductor device 1b of FIGS. 13A and 13B and the semiconductor device 1c of FIGS. 14A and 14B.

Figure 17:
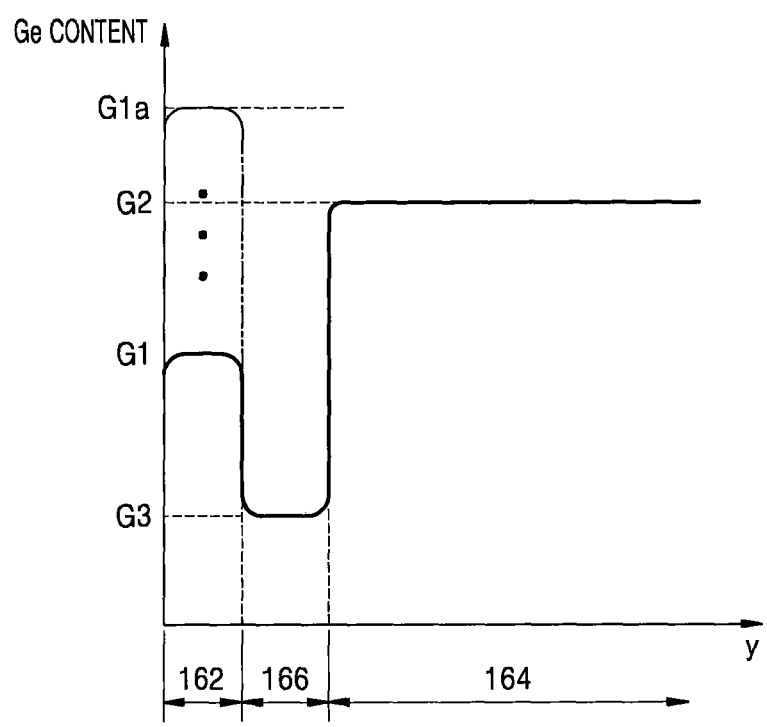
FIG. 17 is a graph showing first, second, and third germanium (Ge) contents of the first, second, and third strain-inducing layers of a semiconductor device according to an embodiment of the inventive concepts.

FIG. 17 is a graph showing first, second, and third Ge contents G1-G1a, G2, and G3 of the first, second, and third strain-inducing layers 162, 164, and 166 of a semiconductor device according to an embodiment of the inventive concepts.

Referring to FIG. 17, the first strain-inducing layer 162, the second strain-inducing layer 164, and the third strain-inducing layer 166 may have the first Ge content G1-G1a, the second Ge content G2, and the third Ge content G3, respectively.

The first Ge content G1-G1a may be greater than the third Ge content G3. The second Ge content G2 may be greater than the third Ge content G3. The second Ge content G2 may be, for example, 30 atom % to 65 atom %. The third Ge content G3 may be smaller than the second Ge content G2 and may be, for example, 35 atom % or less.

The first Ge content G1 may be smaller than the second Ge content G2, and the first Ge content G1a may be equal to or greater than the second Ge content G2. In other words, the first Ge content G1-G1a may vary via Ge condensation.

The relationship between the first Ge content G1 or G1a and the second Ge content G2 illustrated in FIG. 17 may also apply to the semiconductor device 1b of FIGS. 13A and 13B and the semiconductor device 1c of FIGS. 14A and 14B.

Figure 18A:
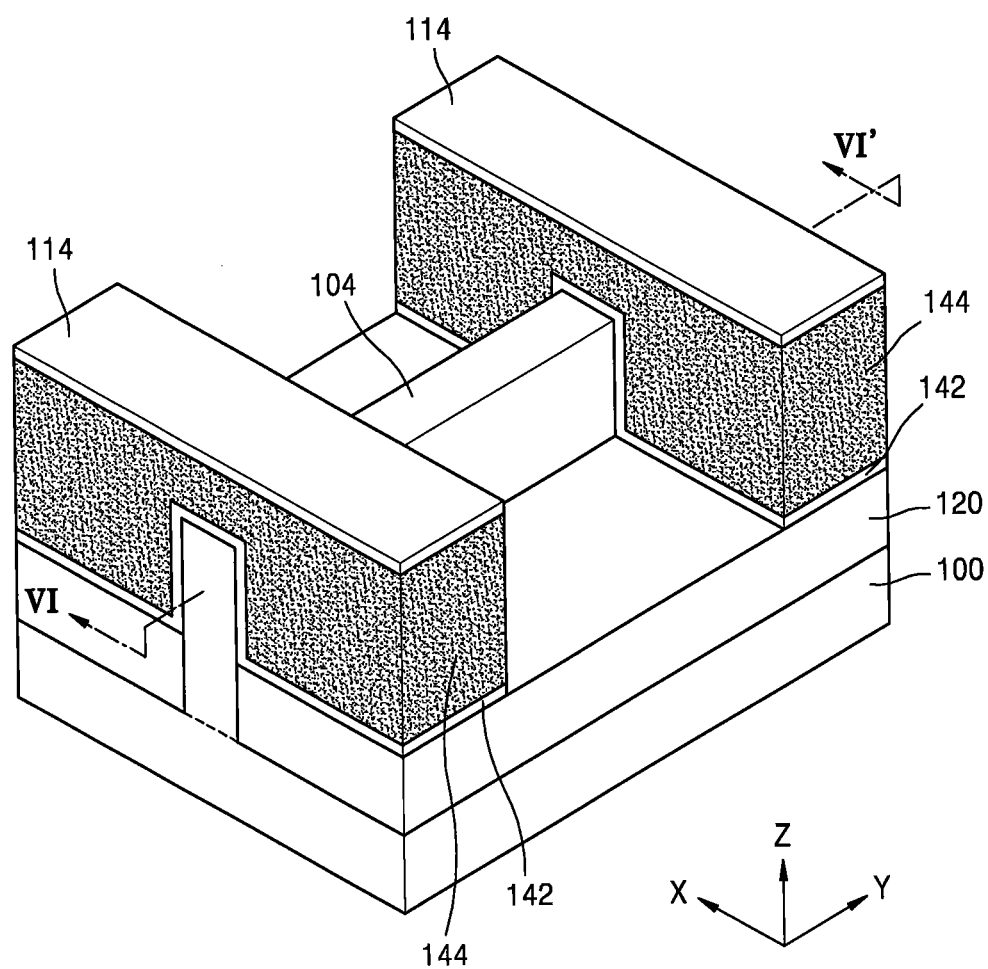
FIG. 18A is a perspective view for explaining an operation of forming a pair of extending patterns in order to manufacture a semiconductor device according to an embodiment of the inventive concepts.
Figure 18B:
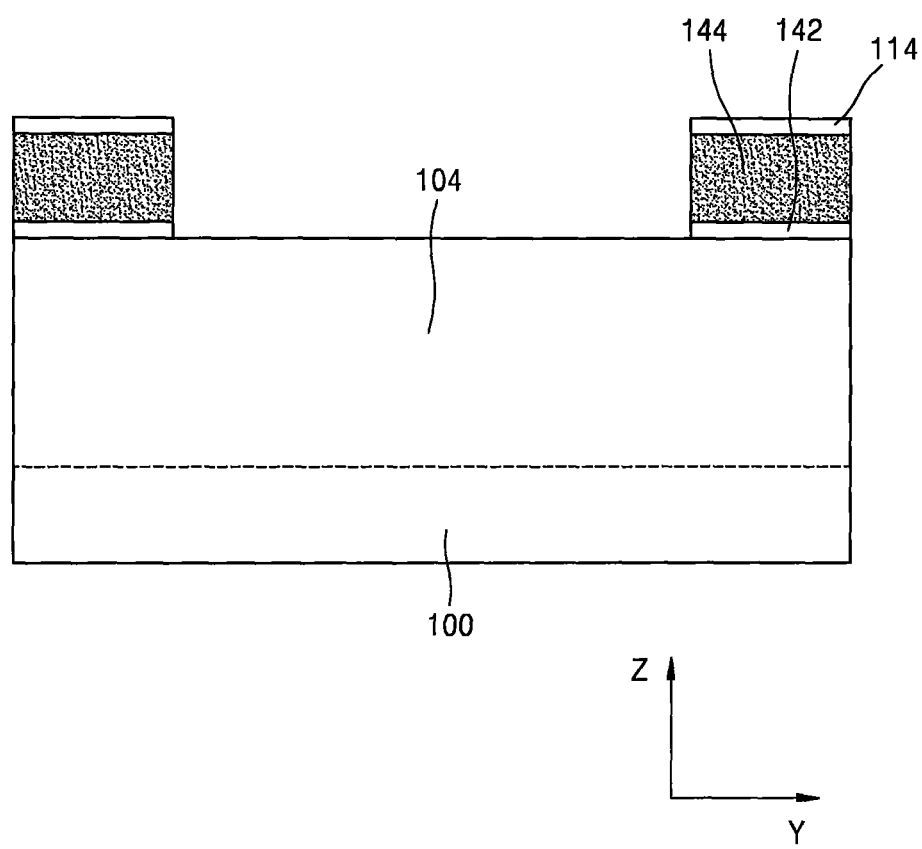
FIG. 18B is a cross-sectional view for explaining the operation of forming the extending patterns in order to manufacture a semiconductor device according to an embodiment of the inventive concepts.

FIG. 18A is a perspective view of a semiconductor device having a plurality of fin structures 102. FIGS. 18B-29 are cross-sectional views that illustrate a method of manufacturing the semiconductor device of FIG. 18A. FIG. 18B is a cross-sectional view taken along line VI-VI of FIG. 18A, and FIGS. 19-29 are taken along the same line VI-VI after additional processing steps have been performed. A repeated description of elements of FIGS. 18A-29 described above with reference to FIGS. 1A-17 will be omitted herein.

FIG. 18A is a perspective view of a semiconductor device according to an embodiment of the inventive concepts.

FIG. 18B is a cross-section taken along line VI-VI' of FIG. 18A. FIGS. 18A and 18B illustrate operations for forming a semiconductor device according to an embodiment of the inventive concepts that are performed after the operations of FIGS. 1-4.

Referring to FIGS. 18A and 18B, the extending patterns 144 are formed to extend in the second direction X that is different from the first direction Y. As shown in FIG. 18A, the extending patterns 144 intersect the protruding pattern 104. Insulation layers 142 may be disposed between each of the extending patterns 144 and the protruding pattern 104.

The insulation layers 142 and the extending patterns 144 may be formed by sequentially forming an insulation material layer (not shown) and an extending pattern material layer (not shown) on the substrate 100 after formation of the protruding pattern 104, forming a pair of second mask patterns 114 on the extending pattern material layer, and etching the extending pattern material layer and the insulation material layer using the second mask patterns 114 as an etch mask. The second mask patterns 114 may be lines that each extend in the second direction X. The second mask patterns 114 may comprise a material including at least one selected from silicon oxide, silicon nitride, and silicon oxynitride. Respective portions of the second mask patterns 114 that remain after the etching may serve as gate capping layers. Alternatively, the second mask patterns 114 may be removed after the etching is completed.

According to another embodiment, the insulation layers 142, the extending patterns 144, and gate capping layers 114 extend in the second direction X that is different from the first direction Y to intersect the protruding pattern 104. In this embodiment, the insulation layers 142, the extending patterns 144, and the gate capping layers 114 may be formed using an etching process in which a line-shaped mask pattern (not shown) extending in the second direction X is used as an etch mask. The gate capping layers 114 may comprise, for example, a material including at least one selected from silicon oxide, silicon nitride, and silicon oxynitride.

Figure 19:
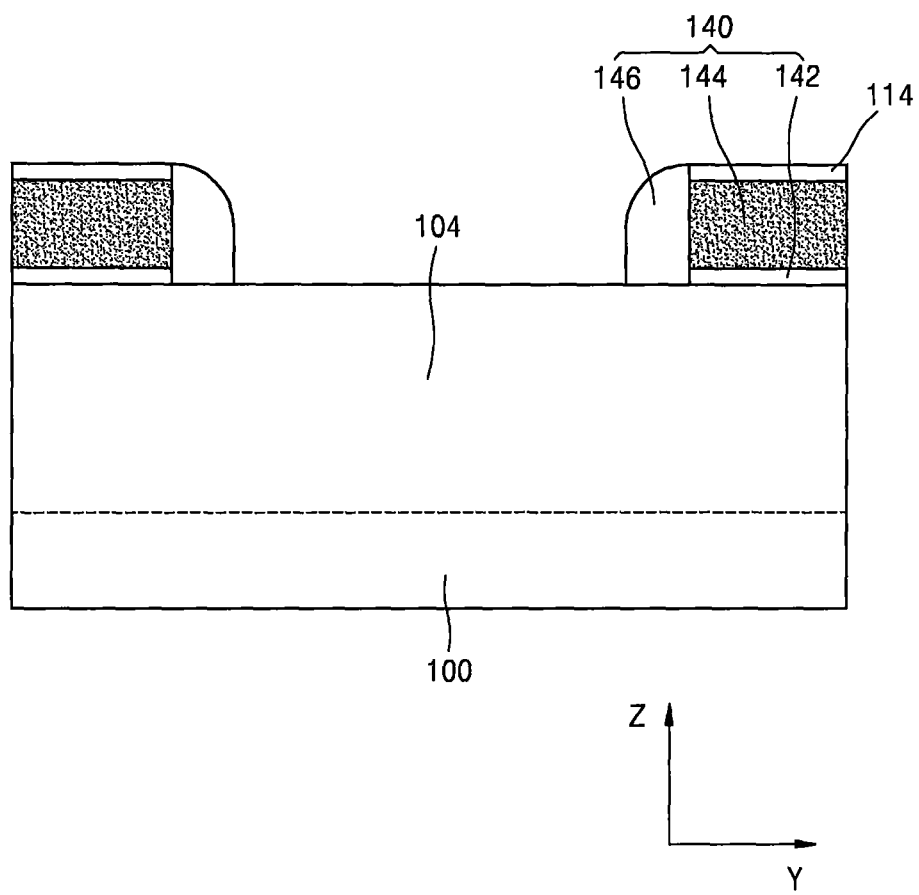
FIG. 19 is a cross-sectional view for explaining an operation of forming gate spacers in order to manufacture a semiconductor device according to an embodiment of the inventive concepts.

FIG. 19 is a cross-sectional view illustrating an operation of forming gate spacers 146 in order to manufacture a semiconductor device according to an embodiment of the inventive concepts.

Referring to FIG. 19, gate spacers 146 are formed that cover the respective lateral surfaces of the insulation layers 142 and the extending patterns 144, thereby forming a pair of extending pattern structures 140 that each include an insulation layer 142, an extending pattern 144, and a gate spacer 146. The gate spacers 146 may be formed by forming a gate spacer material layer (not shown) on an upper surface of the substrate 100 on which the insulation layers 142 and the extending patterns 144 have been formed and then removing a portion of the gate spacer material layer via anisotropic etching. The gate spacers 146 may comprise, for example, a silicon nitride layer or a silicon oxynitride layer.

In another embodiment, the insulation layer 142 may be a gate dielectric layer 142 and the extending pattern 144 may be a gate electrode pattern. In this embodiment, the insulation layers 142, the extending patterns 144, and the gate spacers 146 may constitute a pair of gate structures 140.

Although not illustrated, the gate spacers 146 may also cover lateral surfaces of the protruding pattern 104 that are not covered by the insulation layers 142 and the extending patterns 144.

Although the second mask patterns 114 remain in the depicted embodiment and thus the gate spacers 146 also cover lateral surfaces of the second mask patterns 114, it will be appreciated that in other embodiments the second mask patterns 114 may be removed before the gate spacers 146 are formed, as described above.

Figure 20:
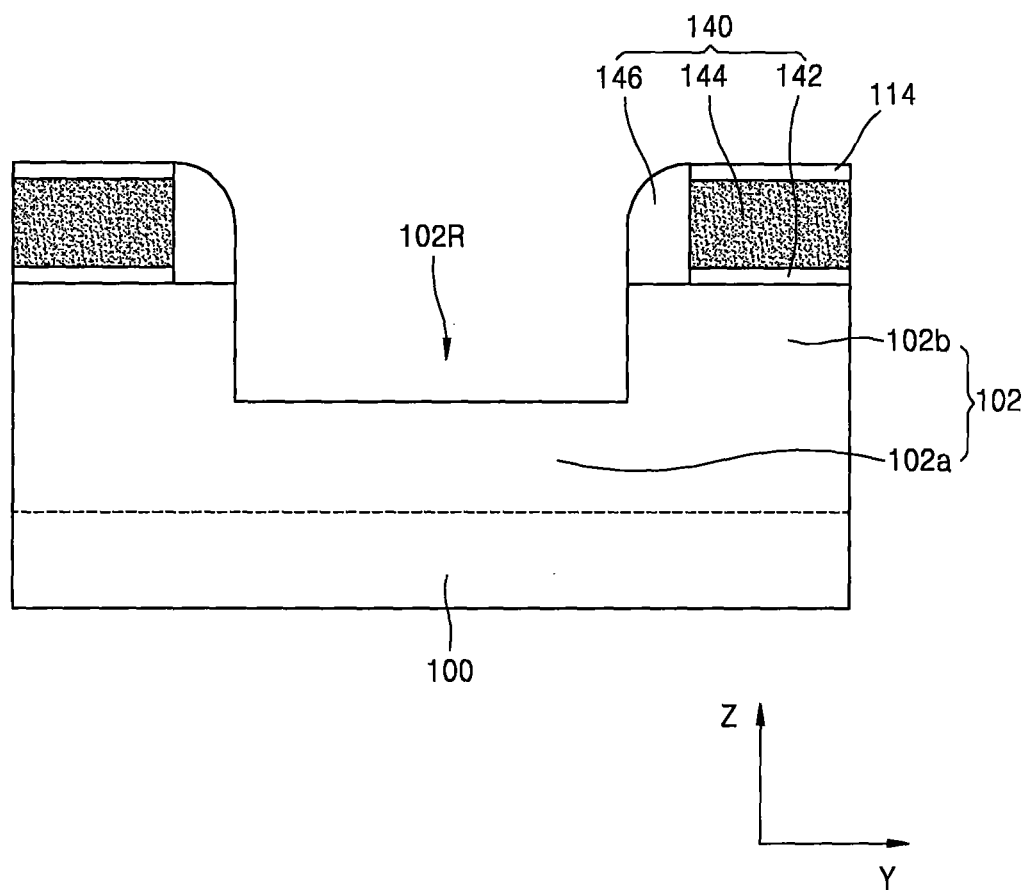
FIG. 20 is a cross-sectional view for explaining an operation of forming a fin structure having a recess in order to manufacture a semiconductor device according to an embodiment of the inventive concepts.

FIG. 20 is a cross-sectional view illustrating the formation of a pair of fin structures 102 having a recess 102R in order to manufacture a semiconductor device according to an embodiment of the inventive concepts.

Referring to FIG. 20, a portion of the protruding pattern 104 of FIG. 19 is removed to form the pair of fin structures 102 having a pair of protrusions 102b and the recess 102R therebetween. In other words, the protrusions 102b are the portions of the protruding pattern 104 that remain on both sides of the recess 102R. Each of the fin structures 102 may include a base 102a extending below the protrusion 102b and below the bottoms of the recesses 102R, and the protrusion 102b disposed over the base 102a.

Figure 21:
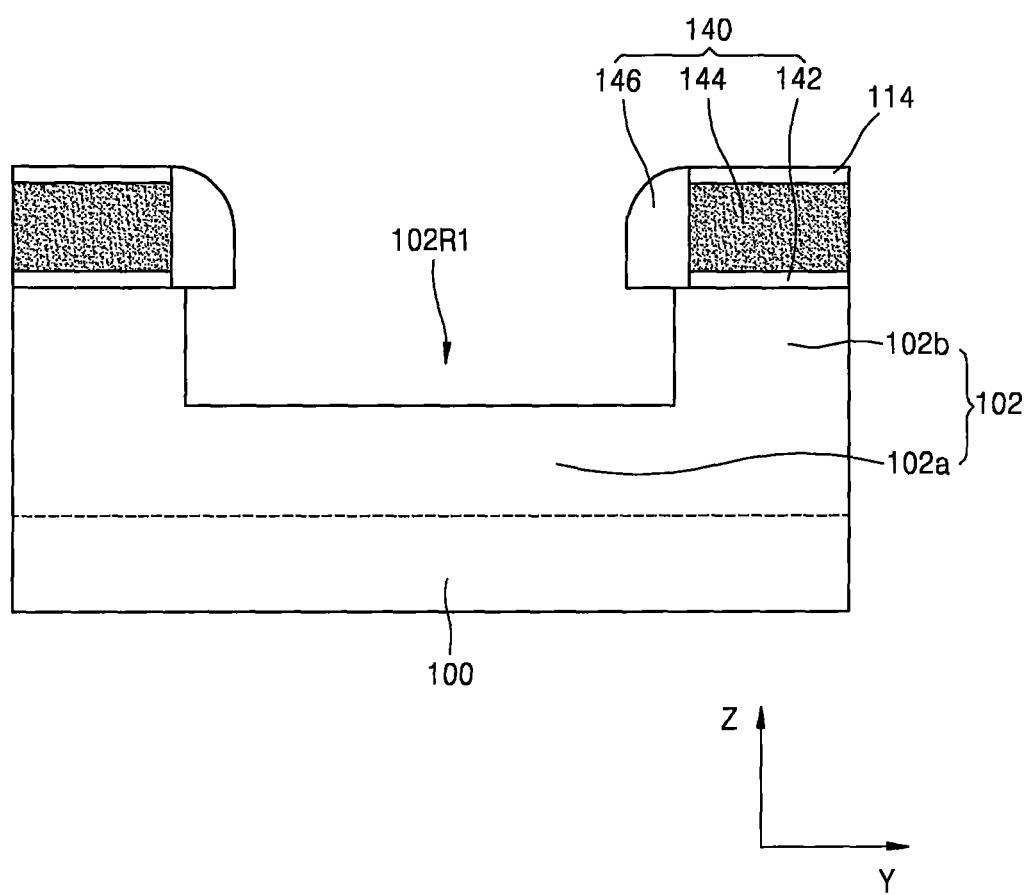
FIG. 21 is a cross-sectional view for explaining an operation of expanding the recess in order to manufacture a semiconductor device according to an embodiment of the inventive concepts.

FIG. 21 is a cross-sectional view illustrating an operation that expands the recess 102R.

Referring to FIG. 21, a portion of each of the fin structures 102 is removed from an exposed surface thereof. In particular, a portion of each of the protrusions 102b is removed from both lateral surfaces of each of the protrusions 102b. Accordingly, the recess 102R of FIG. 20 may extend downwards from each of the gate spacers 146 to thereby form a recess 102R1. Accordingly, a lower surface of each of the gate spacers 146 may be partially exposed via the recesses 102R1. However, a portion of the lower surface of each of the gate spacers 146 that is adjacent to each of the insulation layers 142 may be covered by each of the protrusions 102b so that the insulation layers 142 are not exposed via the recess 102R1.

For example, a portion having a width of 30 nm to 60 nm from the lower surface of each of the gate spacers 146 may be exposed via the recess 102R1.

Figure 22:
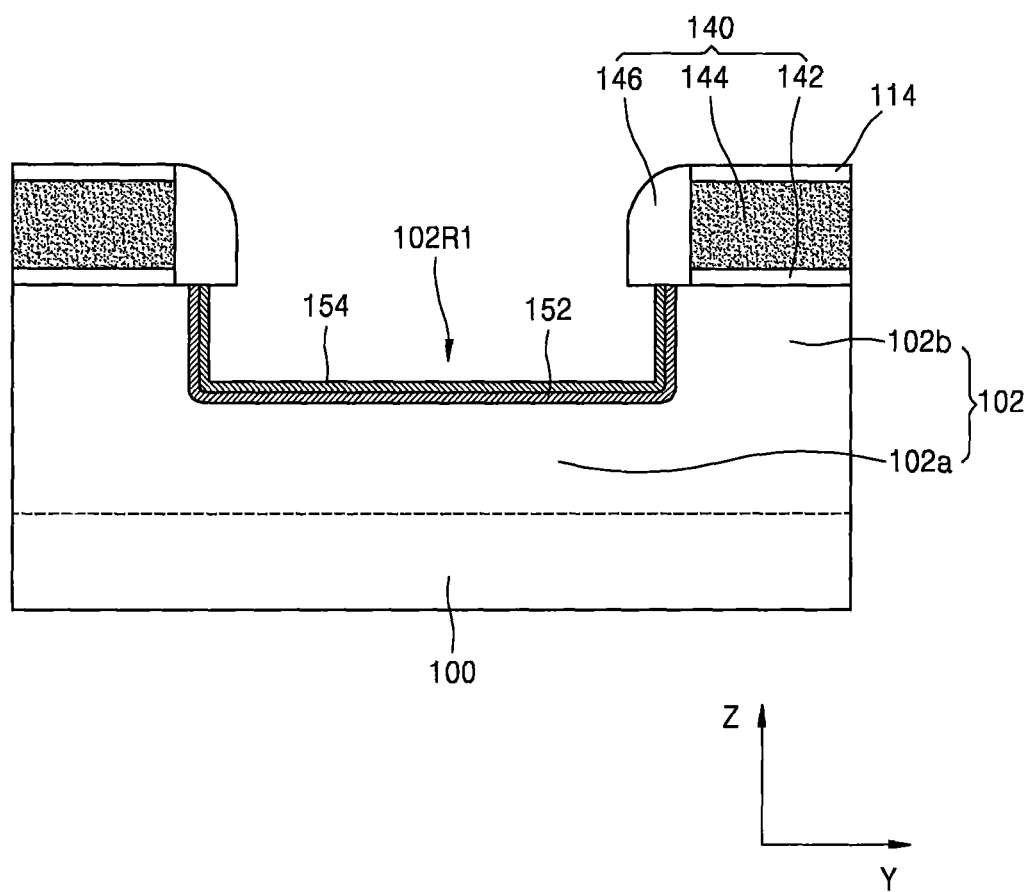
FIG. 22 is a cross-sectional view for explaining an operation of forming first and second semiconductor layers in order to manufacture a semiconductor device according to an embodiment of the inventive concepts.

FIG. 22 is a cross-sectional view illustrating an operation in which first and second semiconductor layers 152 and 154 are formed.

Referring to FIG. 22, the first semiconductor layer 152 and the second semiconductor layer 154 are sequentially formed on exposed surfaces of the fin structures 102. In particular, the first semiconductor layer 152 and the second semiconductor layer 154 are formed on both an upper surface of the base 102a that is exposed via the recess 102R1 and on lateral surfaces of the protrusions 102b that are exposed via the recess 102R1. The first semiconductor layer 152 may comprise, for example, a semiconductor material that includes Ge. For example, the first semiconductor layer 152 may be undoped SiGe. The second semiconductor layer 154 may comprise, for example, an undoped semiconductor material that includes Si. For example, the first semiconductor layer 152 may be an Si layer that is formed by SEG using the fin structure 102 as a seed. The second semiconductor layer 154 may be formed by, for example, SEG in which the first semiconductor layer 152 is used as a seed.

Although in FIG. 22 the first semiconductor layer 152 and the second semiconductor layer 154 are sufficiently thin that a portion of the lower surface of each of the gate spacers 146 is exposed, the thicknesses of the first semiconductor layer 152 and the second semiconductor layer 154 are not limited thereto. For example, in another embodiment, the first semiconductor layer 152 and the second semiconductor layer 154 may be formed so that the first semiconductor layer 152 exposes a portion of the lower surface of each of the gate spacers 146 and the second semiconductor layer 154 covers the remaining portion of the lower surface of each of the gate spacers 146. In still another embodiment, the first semiconductor layer 152 may cover the entire lower surface of each of the gate spacers 146.

Figure 23:
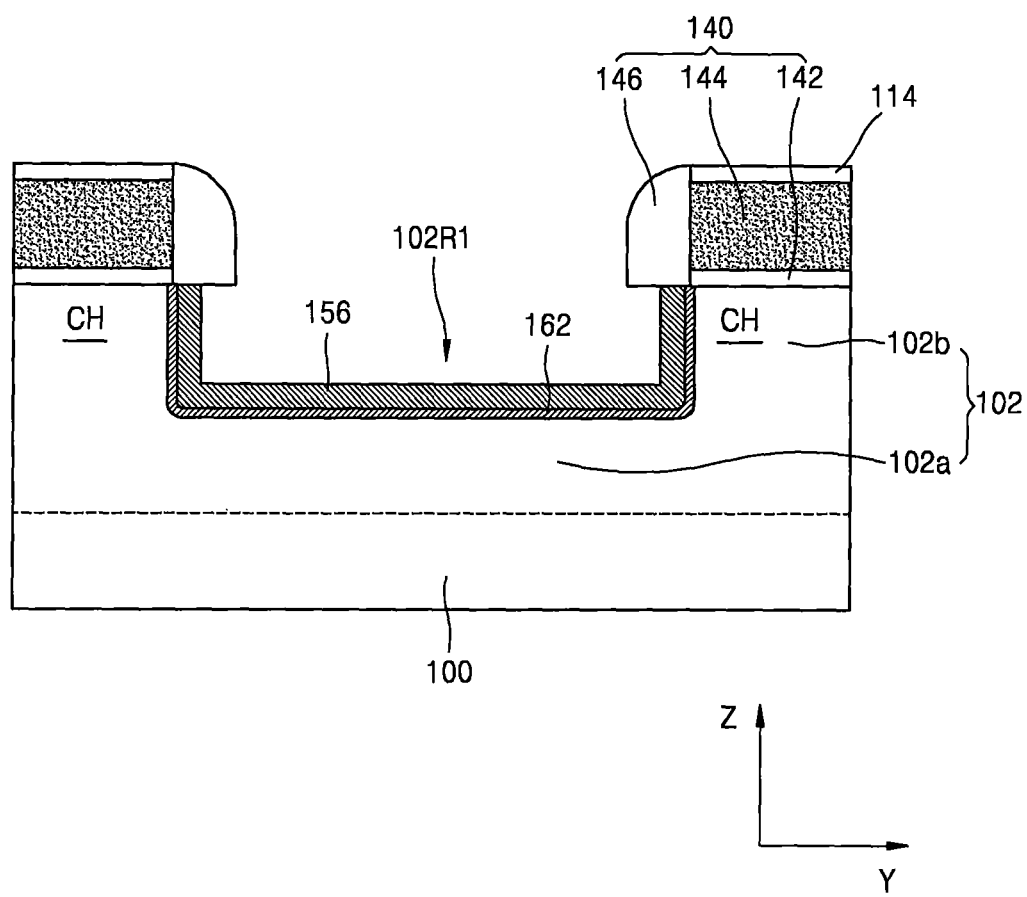
FIG. 23 is a cross-sectional view for explaining an operation of forming an oxide layer and a first strain-inducing layer in order to manufacture a semiconductor device according to an embodiment of the inventive concepts.

FIG. 23 is a cross-sectional view illustrating the formation of an oxide layer 156 and a first strain-inducing layer 162.

Referring to FIGS. 22 and 23, the oxide layer 156 is formed by oxidizing the second semiconductor layer 154. While the second semiconductor layer 154 is being oxidized, a portion of the first semiconductor layer 152 may also be oxidized, thereby forming the oxide layer 156. The oxide layer 156 may be formed by, for example, thermal oxidation.

When the first semiconductor layer 152 comprises a semiconductor material that includes Ge, for example, SiGe, Si atoms included in a portion of the first semiconductor layer 152 may be used to form the oxide layer 156, and Ge atoms may be diffused into a remaining portion of the first semiconductor layer 152 and/or a portion of each of the fin structures 102 to form the first strain-inducing layer 162.

Alternatively, the Si atoms included in the first semiconductor layer 152 may be used to form the oxide layer 156, and the Ge atoms included therein may be diffused into a portion of each of the fin structures 102 that is adjacent to the first semiconductor layer 152, thereby forming the first strain-inducing layer 162.

Alternatively, both the first and second semiconductor layers 152 and 154 may be oxidized and a portion of each of the protrusions 102b may also be oxidized, to form the oxide layer 156. The Ge atoms included in the first semiconductor layer 152 may be diffused into a non-oxidized portion of each of the fin structures 102 that is adjacent to the first semiconductor layer 152 to form the first strain-inducing layer 162.

In other words, during the formation of the first strain-inducing layer 162, a portion of the first semiconductor layer 152 may be converted into the oxide layer 156, the entire first semiconductor layer 152 may be converted into the oxide layer 156, or both the entire first semiconductor layer 152 and a portion of each of the fin structures 102 may be converted into the oxide layer 156. The first strain-inducing layer 162 may contact at least a portion of each of the gate spacers 146. In particular, the first strain-inducing layer 162 may contact a portion of the lower surface of each of the gate spacers 146 that contacts each of the insulation layers 142. Alternatively, the first strain-inducing layer 162 may have a surface facing a boundary between each of the gate spacers 146 and each of the insulation layers 142 so as to directly contact at least a portion of each of the gate spacer 146 and the insulation layer 142.

The first strain-inducing layer 162 may be integrally formed on both at least a portion of the lateral surface of each of the protrusions 102b of the fin structures 102 and at least a portion of the bottom of the recess 102R1.

A portion of each of the protrusions 102b defined by the first strain-inducing layer 162 may be a channel region CH.

In FIGS. 22 and 23, the second semiconductor layer 154 is completely oxidized to form a portion of the oxide layer 156. However, according to another embodiment, the second semiconductor layer 154 may not be formed and a portion of the first semiconductor layer 152, the entire first semiconductor layer 152, or both the entire first semiconductor layer 152 and a portion of each of the fin structures 102 may be oxidized to form the oxide layer 156.

Figure 24:
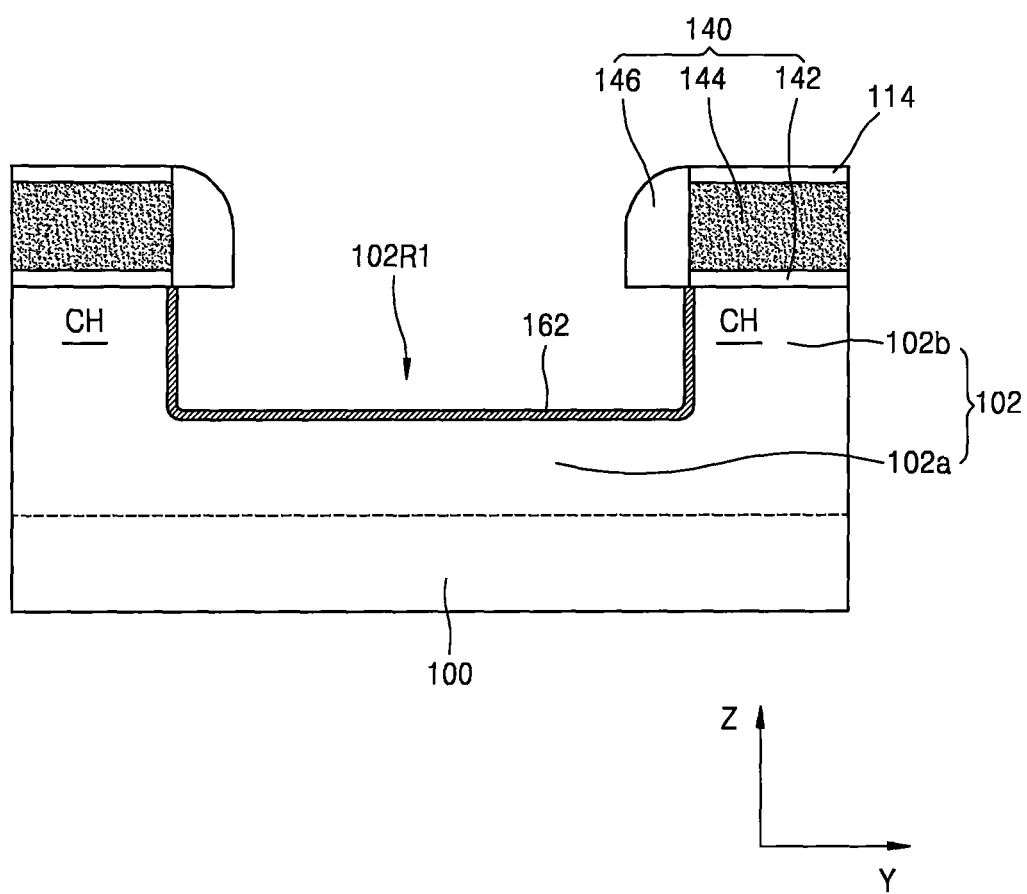
FIG. 24 is a cross-sectional view for explaining an operation of removing the oxide layer in order to manufacture a semiconductor device according to an embodiment of the inventive concepts.

FIG. 24 is a cross-sectional view illustrating the removal of the oxide layer 156.

Referring to FIGS. 23 and 24, the oxide layer 156 is removed so that the first strain-inducing layer 162 is exposed.

Figure 25:
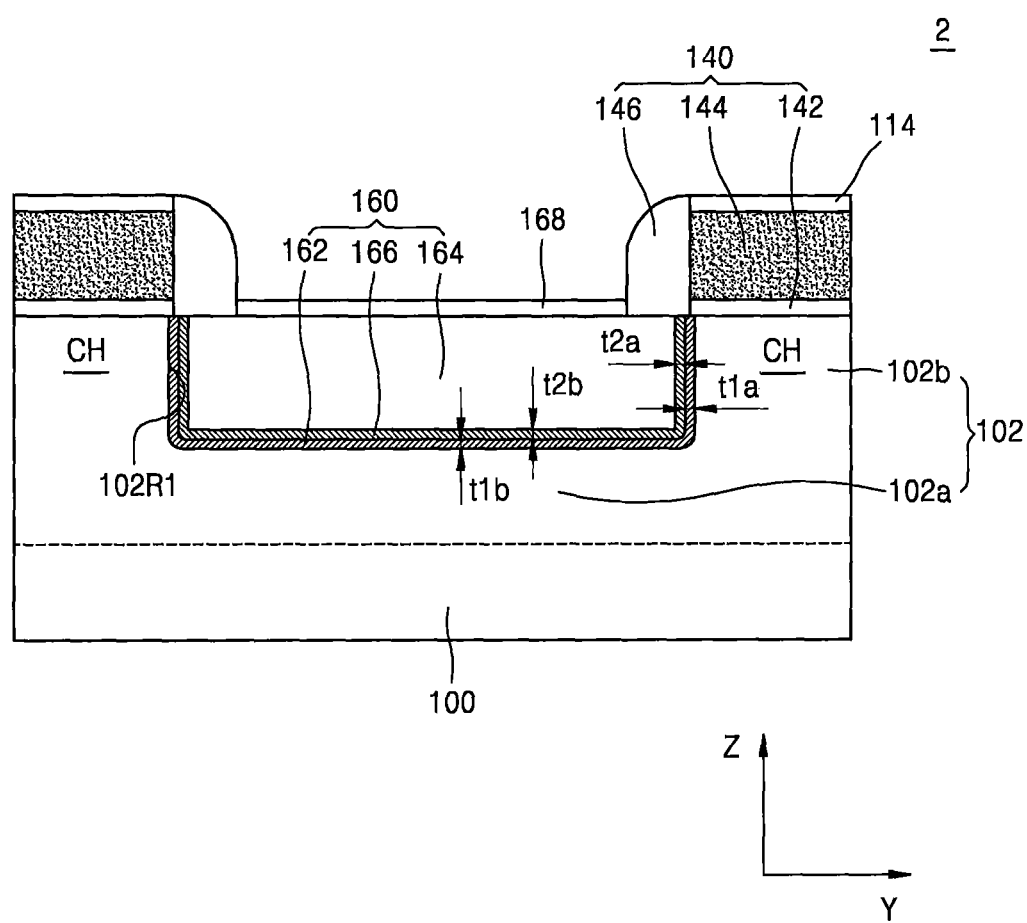
FIG. 25 is a cross-sectional view illustrating a semiconductor device according to an embodiment of the inventive concepts.

FIG. 25 is a cross-sectional view illustrating a semiconductor device 2 according to an embodiment of the inventive concepts.

Referring to FIG. 25, a second strain-inducing layer 164 is formed to cover the first strain-inducing layer 162. Before the second strain-inducing layer 164 is formed, a third strain-inducing layer 166 may be formed to cover the first strain-inducing layer 162, and then the second strain-inducing layer 164 may be formed on the third strain-inducing layer 166, thereby forming a source/drain region 160. The third strain-inducing layer 166 may be formed by SEG in which the first strain-inducing layer 162 is used as a seed. The second strain-inducing layer 164 may be formed by SEG in which the third strain-inducing layer 166 is used as a seed.

A thickness t1$b$ of a portion of the first strain-inducing layer 162 that is between the lower surface of the second strain-inducing layer 164 and the substrate 100 may be greater than a thickness t1$a$ of a portion of the first strain-inducing layer 162 that is between the second strain-inducing layer 164 and the lateral surface of the channel region CH. A thickness t1$b$ of a portion of the third strain-inducing layer 166 that is on the bottom of the recess 102R1 may be greater than a thickness t2$a$ of a portion of the third strain-inducing layer 166 that is on the lateral surface of the channel region CH.

The first strain-inducing layer 162 may be substantially undoped. Alternatively, the first strain-inducing layer 162 may be doped with first conductivity type dopants to a doping concentration that is much lower than that of each of the second strain-inducing layer 164 and the channel region CH.

When the first strain-inducing layer 162 has the first doping concentration, the second strain-inducing layer 164 may be formed to have the second doping concentration that is greater than the first doping concentration. The third strain-inducing layer 166 may be formed such that a third doping concentration that is the doping concentration thereof may be smaller than the second doping concentration. The third doping concentration may be greater than the first doping concentration.

The third strain-inducing layer 166 may have a Ge content that is smaller than that of each of the first and second strain-inducing layers 162 and 164.

A source/drain capping layer 168 may be formed on the source/drain region 160. The source/drain capping layer 168 may completely cover a surface of the source/drain region 160 that is exposed by the fin structures 102, the gate structure 160, and the isolation layer 120. The source/drain capping layer 168 may comprise, for example, Si doped with a first conductivity type dopant or undoped Si.

In this case, the insulation layer 142 and the extending pattern 144 may be respectively the gate dielectric layer 142 and the gate electrode pattern 144.

Accordingly, the semiconductor device 2 includes: a substrate 100 on which a fin structure 102 having a pair of channel regions CH, a recess 102R1 that is located between the channel regions CH; gate electrode patterns 144 on each of the channel regions CH that extend to intersect the fin structure 102; a pair of gate structures 140 that each include a gate dielectric layer 142 that is interposed between a channel region CH and a gate electrode pattern 144 and a gate spacer 146 that covers respective lateral surfaces of the gate electrode pattern 144 and the gate dielectric layer 142; and the source/drain region 160 formed in the recess 102R1.

The source/drain region 160 includes the first strain-inducing layer 162 and the second strain-inducing layer 164 that cover respective lateral surfaces of the channel regions CH that face each other and the bottom of the recess 102R1. The first strain-inducing layer 162 may be disposed between each of the respective lateral surfaces of the channel regions CH that face each other and the second strain-inducing layer 164. The first strain-inducing layer 162 may include a surface that directly contacts a boundary between the gate spacer 146 and the gate dielectric layer 142 at a lower surface of each of the pair of gate structures 140.

The first strain-inducing layer 162 may extend from between the lower surface of the second strain-inducing layer 164 and the bottom of the recess 102R1 to between the second strain-inducing layer 164 and each of the respective lateral surfaces of the channel regions CH that face each other.

The first strain-inducing layer 162 and the second strain-inducing layer 164 may be doped with first conductivity type dopants to first and second doping concentrations. The first doping concentration may be smaller than the second doping concentration. The third strain-inducing layer 166 may be disposed between the first strain-inducing layer 162 and the second strain-inducing layer 164.

Figure 26:
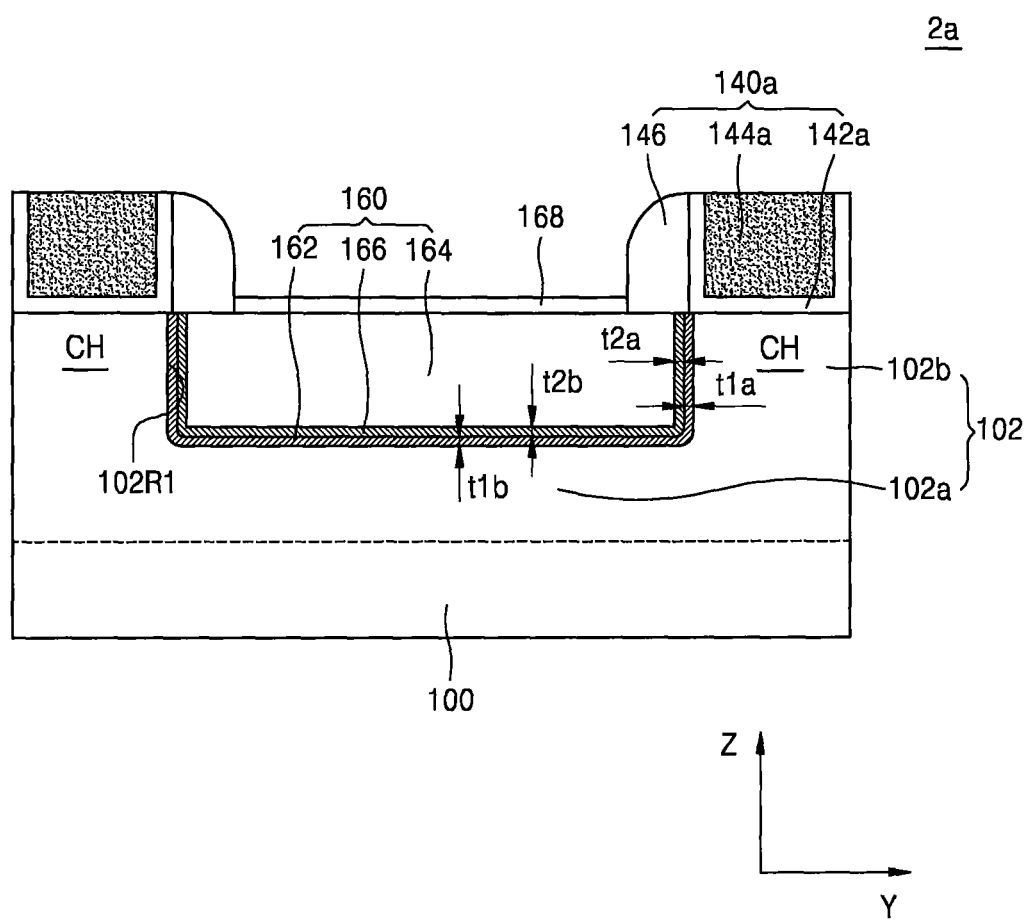
FIG. 26 is a cross-sectional view illustrating a semiconductor device according to an embodiment of the inventive concepts.

FIG. 26 is a cross-sectional view illustrating a semiconductor device 2a according to an embodiment of the inventive concepts.

Referring to FIG. 26, after the source/drain region 160 is formed in FIG. 25, the extending patterns 144 and the insulation layers 142 may be removed, and then gate dielectric layers 142a and gate electrode patterns 144a are formed on the channel regions CH within a space from which the extending patterns 144 and the insulation layers 142 have been removed, thereby forming the gate structures 140a. In this case, the insulation layers 142 and the extending patterns 144 may be, respectively, dummy gate dielectric layers 142 and dummy gate electrode patterns 144.

If the second mask patterns 114 remain on the extending patterns, they may be removed before the extending patterns 144 and the insulation layers 142 are removed.

The gate dielectric layers 142a may conformally cover the inner walls of the spaces defined by the channel regions CH and the gate spacers 146, and the gate electrode patterns 144a may be formed on the gate dielectric layers 142a so as to fill the space defined by the channel regions CH and the gate spacers 146.

The gate dielectric layers 142a may comprise, for example, a high dielectric constant material having a higher dielectric constant than silicon oxide. For example, the gate dielectric layers 142a may include $HfO_2$, $ZrO_2$, or $Ta_2O_5$.

The gate electrode patterns 144a may include, for example, at least one metal layer. The gate electrode patterns 144a may have, for example, a stacked structure in which at least two metal layers are stacked. The gate electrode patterns 144a may be formed to include, for example, a TiN layer, a TaN layer, a TiC layer, a TaC layer, a W layer, an Al layer or a stack thereof. The gate electrode patterns 144a may be formed using, for example, a damascene process in which each of the gate spacers 146 is used as a mold.

Figure 27:
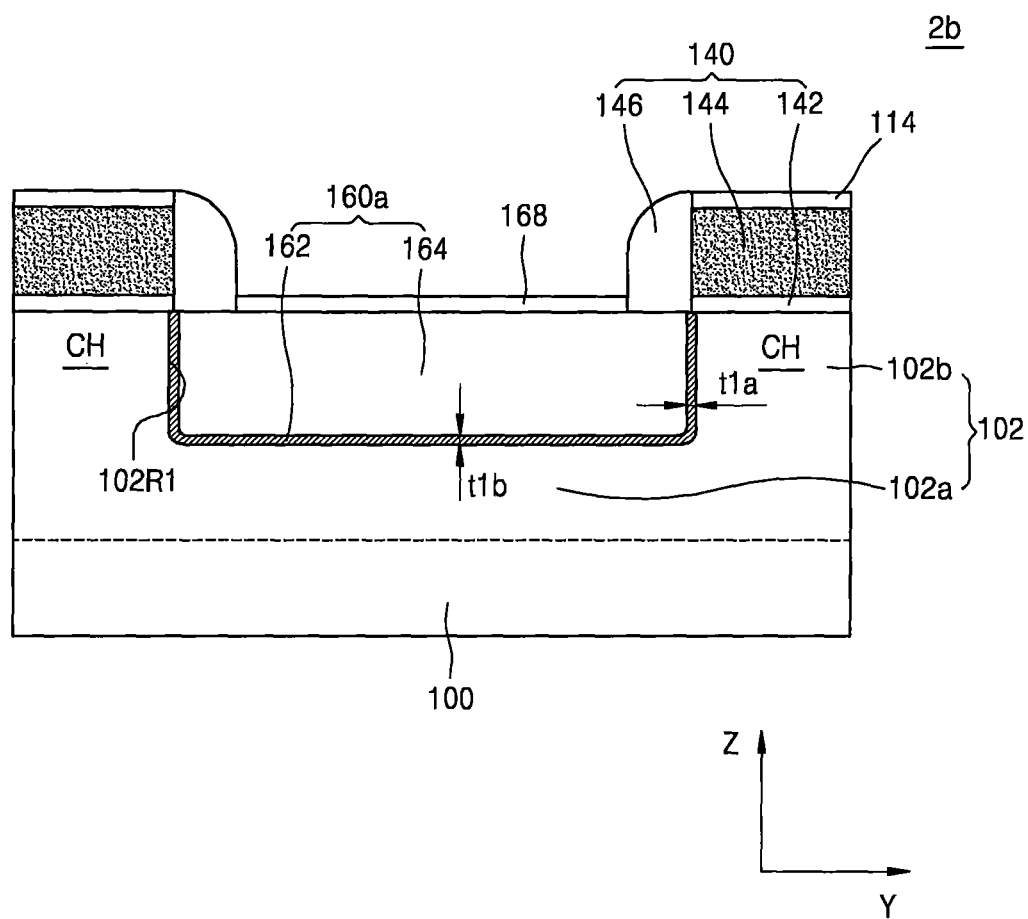
FIG. 27 is a cross-sectional view illustrating a semiconductor device according to an embodiment of the inventive concepts.

FIG. 27 is a cross-sectional view illustrating a semiconductor device 2b according to an embodiment of the inventive concepts.

Referring to FIG. 27, a source/drain region 160a includes first and second strain-inducing layers 162 and 164. The second strain-inducing layer 164 may be formed by SEG using the first strain-inducing layer 162 as a seed.

The semiconductor device 2b of FIG. 27 does not include the third strain-inducing layers 166 in contrast with the semiconductor device 2 of FIG. 25. The semiconductor device 2b of FIG. 27 is the same as the semiconductor device 2 of FIG. 25 except that no third strain-inducing layers 166 are included, and thus a detailed description thereof will be omitted.

Figure 28:
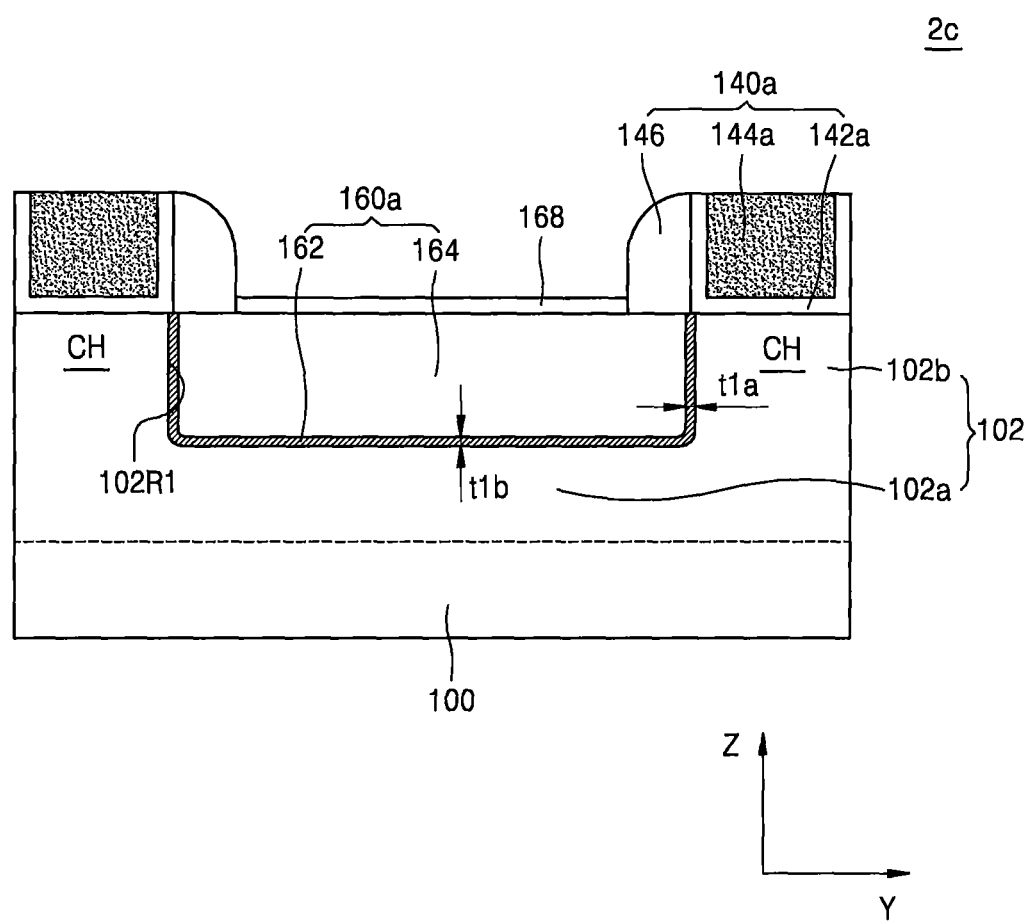
FIG. 28 is a cross-sectional view illustrating a semiconductor device according to an embodiment of the inventive concepts.

FIG. 28 is a cross-sectional view illustrating a semiconductor device 2c according to an embodiment of the inventive concepts.

Referring to FIG. 28, a source/drain region 160a includes first and second strain-inducing layers 162 and 164. The second strain-inducing layer 164 may be formed by SEG using the first strain-inducing layer 162 as a seed.

The semiconductor device 2c of FIG. 28 does not include the third strain-inducing layers 166 in contrast with the semiconductor device 2a of FIG. 26. The semiconductor device 2c of FIG. 28 is the same as the semiconductor device 2a of FIG. 26 except that no third strain-inducing layers 166 are included, and thus a detailed description thereof will be omitted.

Figure 29:
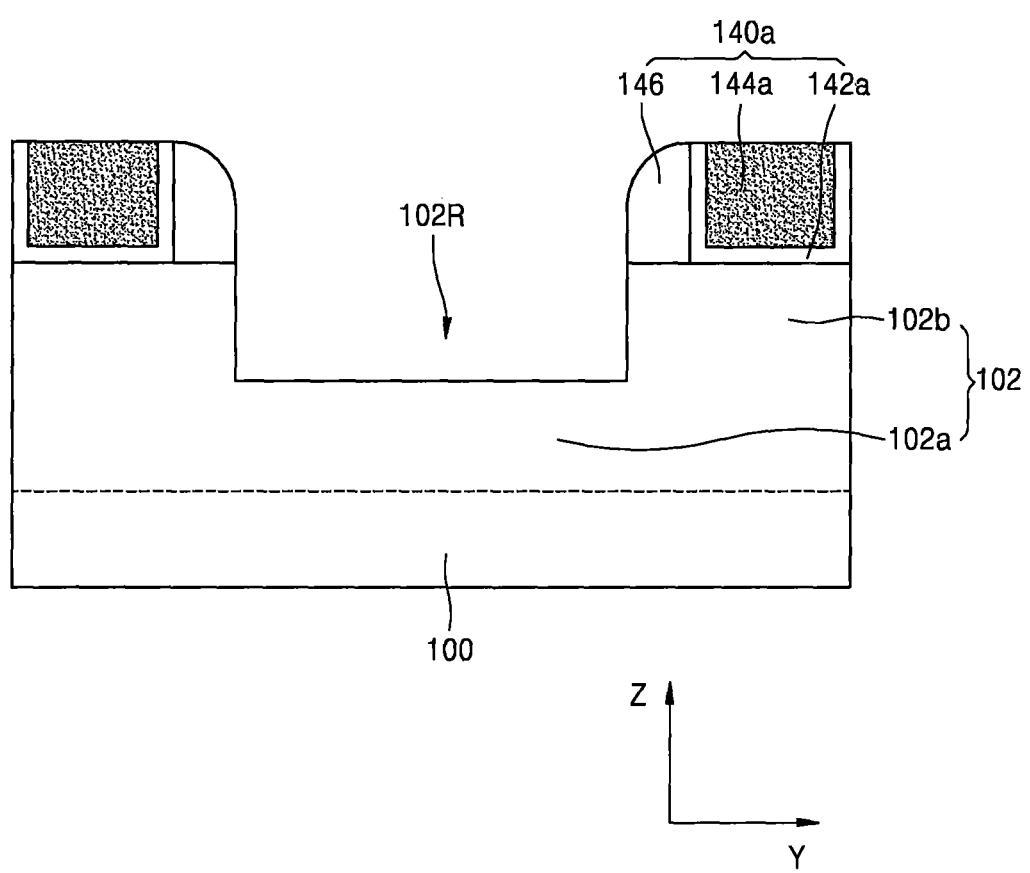
FIG. 29 is a cross-sectional view for explaining an operation of forming a gate electrode pattern in order to manufacture a semiconductor device according to an embodiment of the inventive concepts.

FIG. 29 is a cross-sectional view illustrating an operation for forming a gate electrode pattern 144a. In detail, FIG. 29 is a perspective view for explaining operations subsequent to the operation of FIG. 19.

Referring to FIG. 29, after the extending patterns 144 and the insulation layers 142 are removed, the gate dielectric layers 142a and the gate electrode patterns 144a are formed on the channel regions CH to form the gate structures 140a. In this case, the insulation layers 142 and the extending patterns 144 may be, respectively, dummy gate dielectric layers 142 and dummy gate electrode patterns 144.

Thereafter, a portion of the protruding pattern 104 of FIG. 19 that is between the extending pattern structures 140 is removed to form the pair of fin structures 102 having the pair of protrusion 102b and the recess 102R located between the protrusions 102b. Then, the operations subsequent to the operation of FIG. 21 may be performed to form the semiconductor device 2a of FIG. 26.

In other words, to manufacture the semiconductor device 2a of FIG. 26, the gate structures 140a may be first formed and then the source/drain region 160 may be formed, or the source/drain region 160 may be first formed and then the gate structures 140a may be formed. The same is also true with respect to the method of forming the semiconductor device 2c of FIG. 28.

Figure 30:
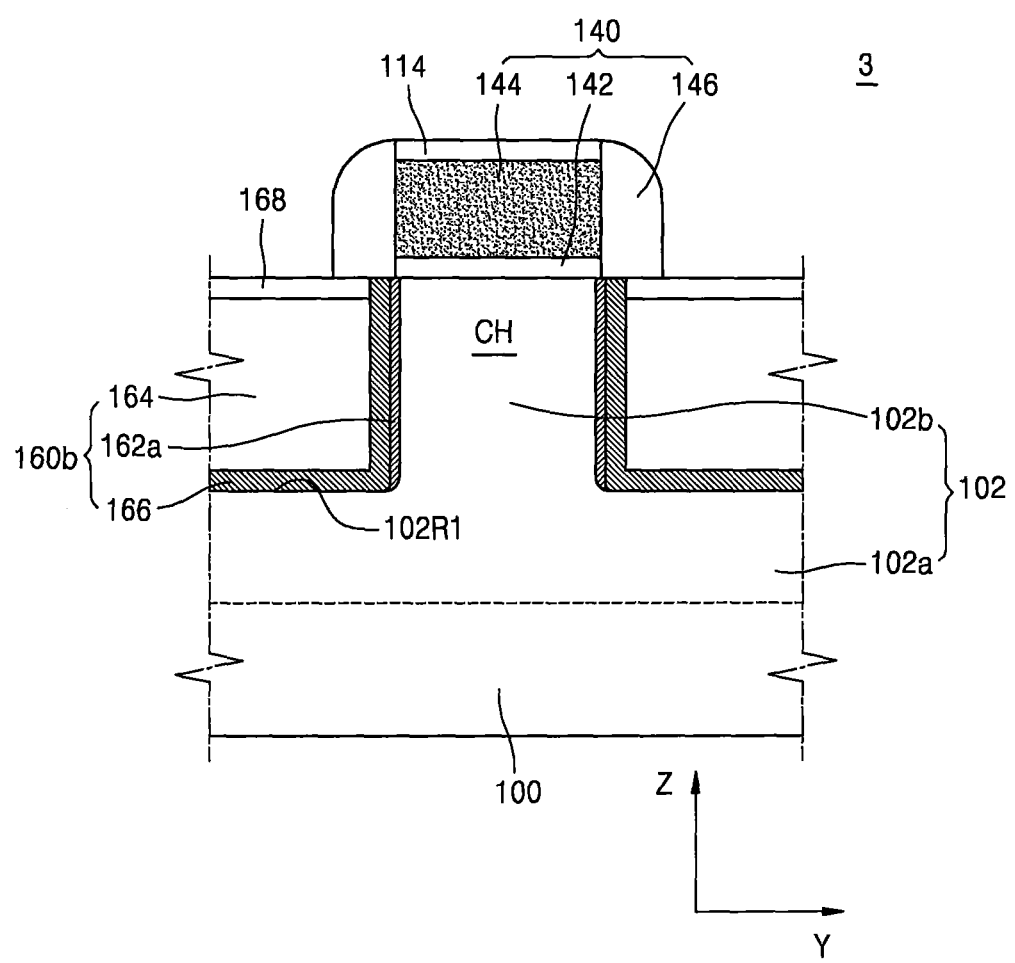
FIG. 30 is a cross-sectional view illustrating a semiconductor device according to an embodiment of the inventive concepts.

FIG. 30 is a cross-sectional view illustrating a semiconductor device 3 according to an embodiment of the inventive concepts.

Referring to FIG. 30, a first strain-inducing layer 162a may be disposed between a lateral surface of a channel region CH and a second strain-inducing layer 164. The first strain-inducing layer 162*a* may not be formed on the bottom of a recess 102R1.

The first strain-inducing layer 162*a* may be formed by first forming the first semiconductor layer 152 of FIG. 9 and then removing a portion of the first semiconductor layer 152 that exists on the bottom of the recess 102R1, or by first forming the first strain-inducing layer 162 of FIG. 11 and then removing a portion of the first strain-inducing layer 162 that exists on the bottom of the recess 102R1.

In other words, the semiconductor device 3 of FIG. 30 is the same as the semiconductor device 1*a* of FIGS. 12A and 12B except that the first strain-inducing layer 162*a* is formed only between the lateral surface of the channel region CH and the second strain-inducing layer 164, that is, the first strain-inducing layer 162*a* is not formed between the bottom of the recess 102R1 and the second strain-inducing layer 164.

The structure of the first strain-inducing layer 162*a* of FIG. 30 may be applied to all of the semiconductor device 1 of FIGS. 1A and 1B, the semiconductor device 1*b* of FIGS. 13A and 13B, the semiconductor device 1*c* of FIGS. 14A and 14B, and the semiconductor devices 2, 2*a*, 2*b*, and 2*c* of FIGS. 25-28.

Figure 31A:
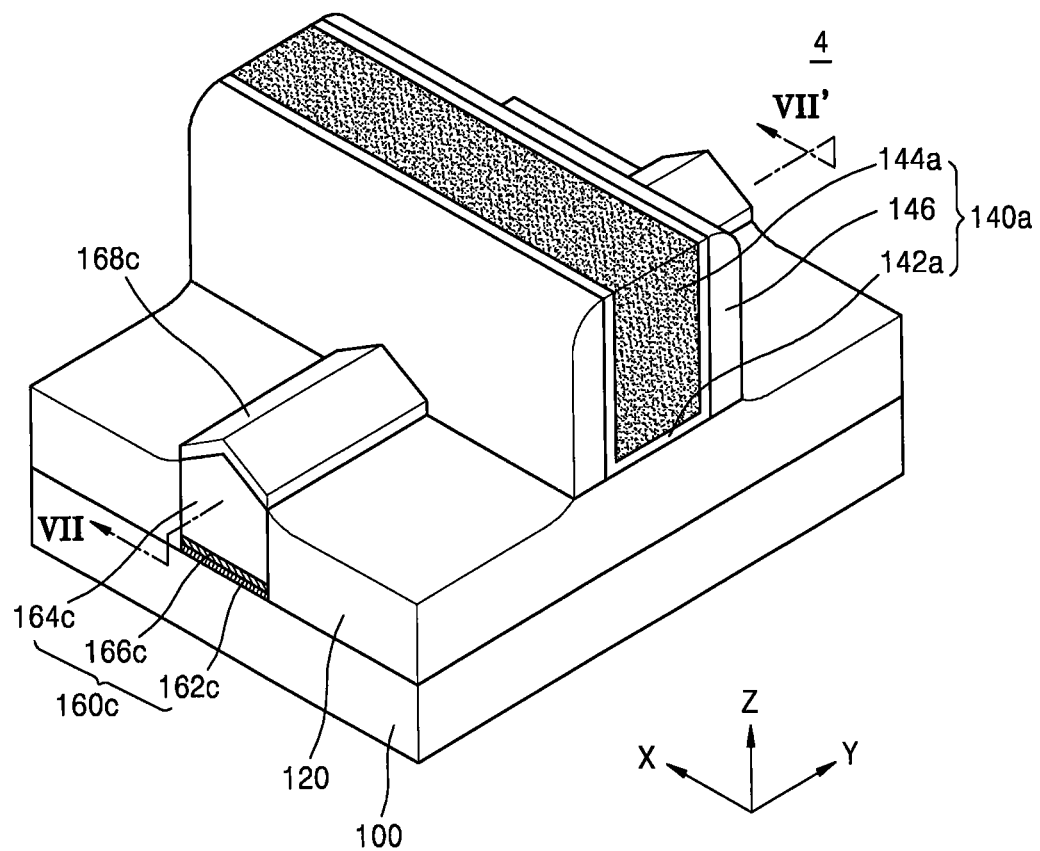
FIG. 31A is a perspective view illustrating a semiconductor device according to an embodiment of the inventive concepts.
Figure 31B:
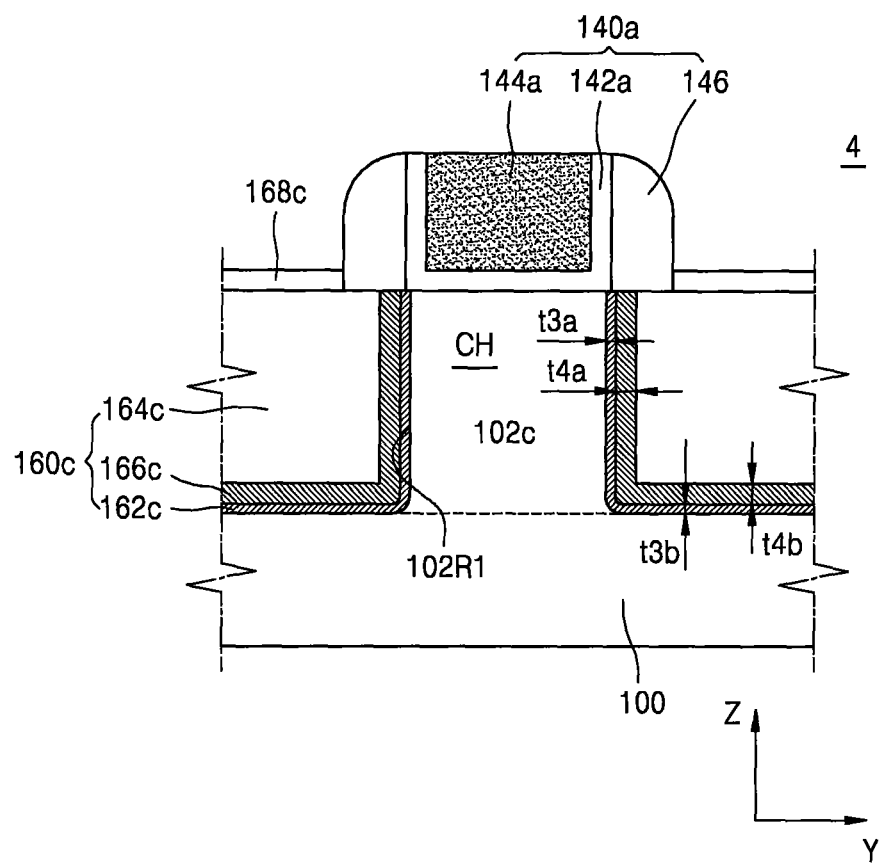
FIG. 31B is a cross-sectional view of the semiconductor device of FIG. 31A.

FIG. 31A is a perspective view illustrating a semiconductor device 4 according to an embodiment of the inventive concepts. FIG. 31B is a cross-section taken along line VII-VII' of FIG. 31A.

Referring to FIGS. 31A and 31B, the semiconductor device 4 includes a planar transistor in contrast with the semiconductor device 1 of FIGS. 1A and 1B that include a fin-structured transistor.

The semiconductor device 4 may be formed by forming an active region 102*c* that is defined by the isolation layer 120 on the substrate 100, then removing a portion of the active region 102*c* where a source/drain region 160*c* is to be formed, and forming the source/drain region 160*c* including first, second, and third strain-inducing layers 162*c*, 164*c*, and 166*c* in a space from which the portion of the active region 102*c* has been removed. In other words, the first, second, and third strain-inducing layers 162*c*, 164*c*, and 166*c* may be formed using a similar method to that of forming the first, second, and third strain-inducing layers 162, 164, and 166 of FIGS. 1A and 1B, and thus a detailed description thereof will be omitted.

Thus, it will be understood that a source/drain region including a first strain-inducing layer according to an embodiment of the inventive concepts may also be implemented in planar transistors.

Figure 32A:
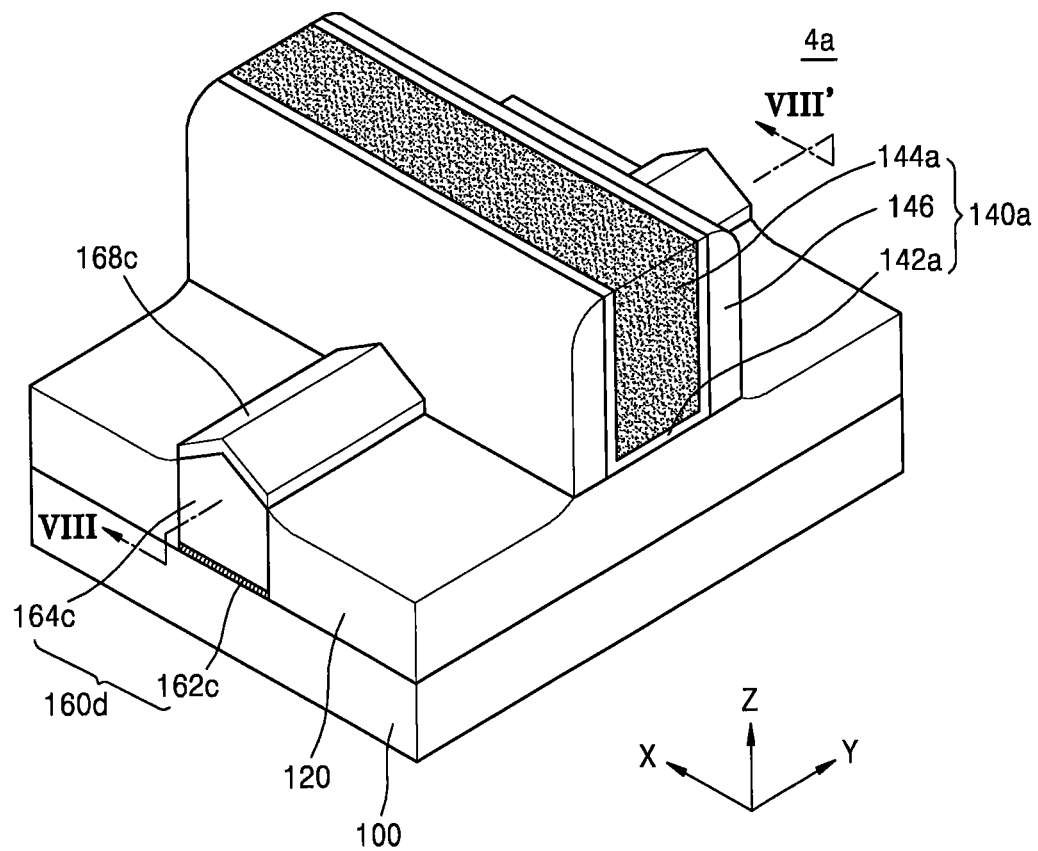
FIG. 32A is a perspective view illustrating a semiconductor device according to an embodiment of the inventive concepts.
Figure 32B:
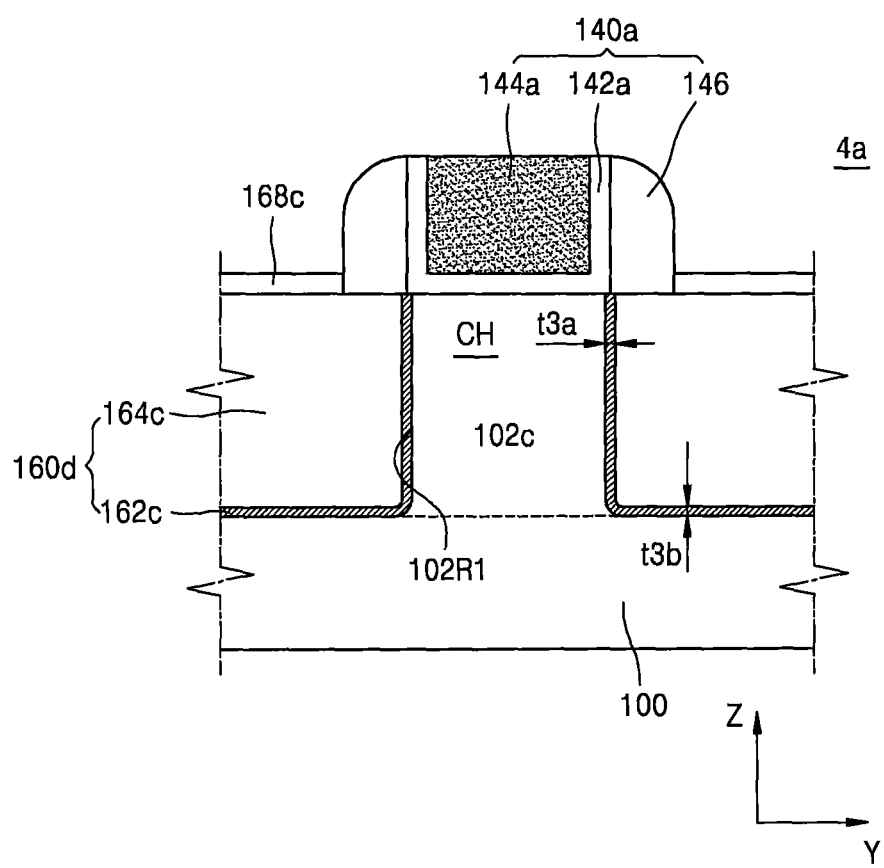
FIG. 32B is a cross-sectional view of the semiconductor device of FIG. 32A.

FIG. 32A is a perspective view illustrating a semiconductor device 4*a* according to an embodiment of the inventive concepts. FIG. 32B is a cross-section taken along line VIII-VIII' of FIG. 32A.

Referring to FIGS. 32A and 32B, a source/drain region 160*d* includes first and second strain-inducing layers 162*c* and 164*c*. The second strain-inducing layer 164*c* may be formed by SEG using the first strain-inducing layer 162*c* as a seed.

The semiconductor device 4*a* of FIGS. 32A and 32B does not include the third strain-inducing layers 166*c* in contrast with the semiconductor device 4 of FIGS. 31A and 31B. The semiconductor device 4*a* of FIGS. 32A and 32B is the same as the semiconductor device 4 of FIGS. 31A and 31B except that it does not include the third strain-inducing layers 166, and thus a detailed description thereof will be omitted.

Figure 33A:
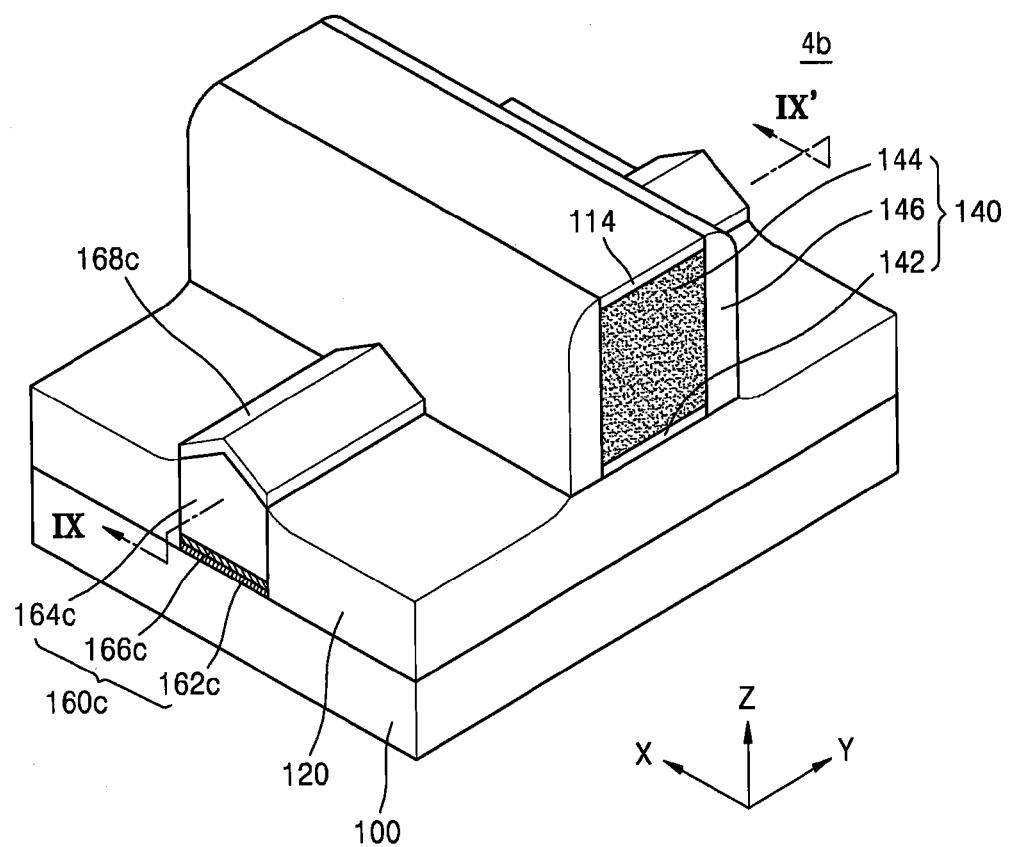
FIG. 33A is a perspective view illustrating a semiconductor device according to an embodiment of the inventive concepts.
Figure 33B:
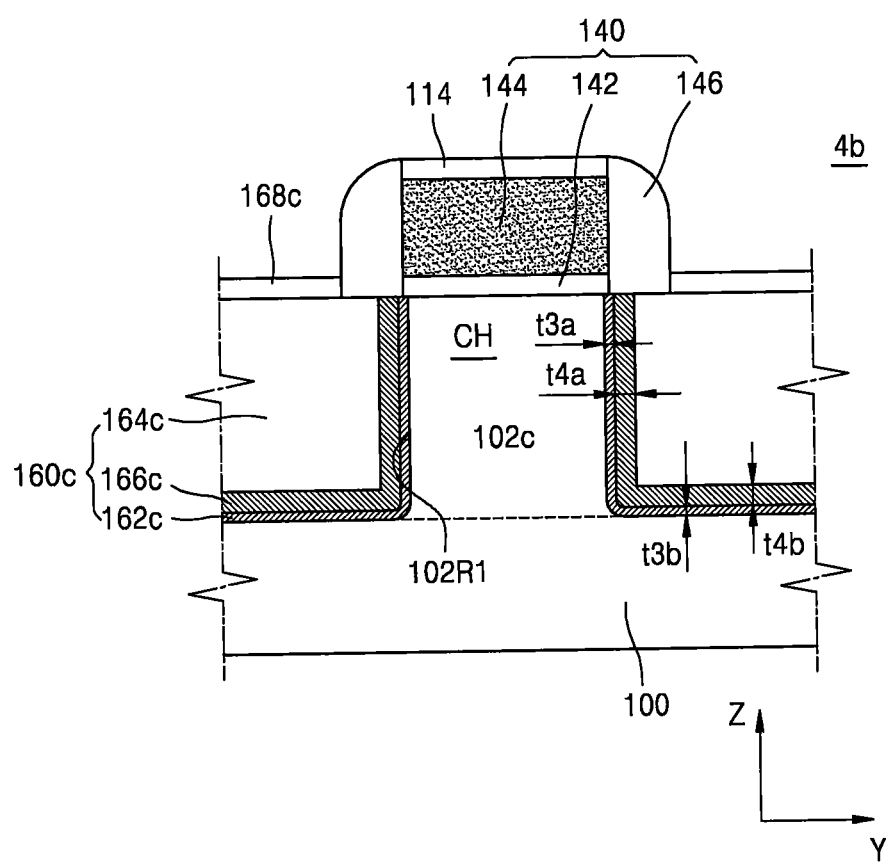
FIG. 33B is a cross-sectional view of the semiconductor device of FIG. 33A.

FIG. 33A is a perspective view illustrating a semiconductor device 4*b* according to an embodiment of the inventive concepts. FIG. 33B is a cross-section taken along line IX-IX' of FIG. 33A.

Referring to FIGS. 33A and 33B, the structure of a gate structure 140 is the same as that of the gate structure 140 of FIGS. 12A and 12B, that is, is different from that of the gate structure 140*a* of FIGS. 31A and 31B. The semiconductor device 4*b* of FIGS. 33A and 33B is the same as the semiconductor device 4 of FIGS. 31A and 31B except that the gate structure 140 is different from the gate structure 140*a* of FIGS. 31A and 31B, and thus a detailed description thereof will be omitted.

Figure 34A:
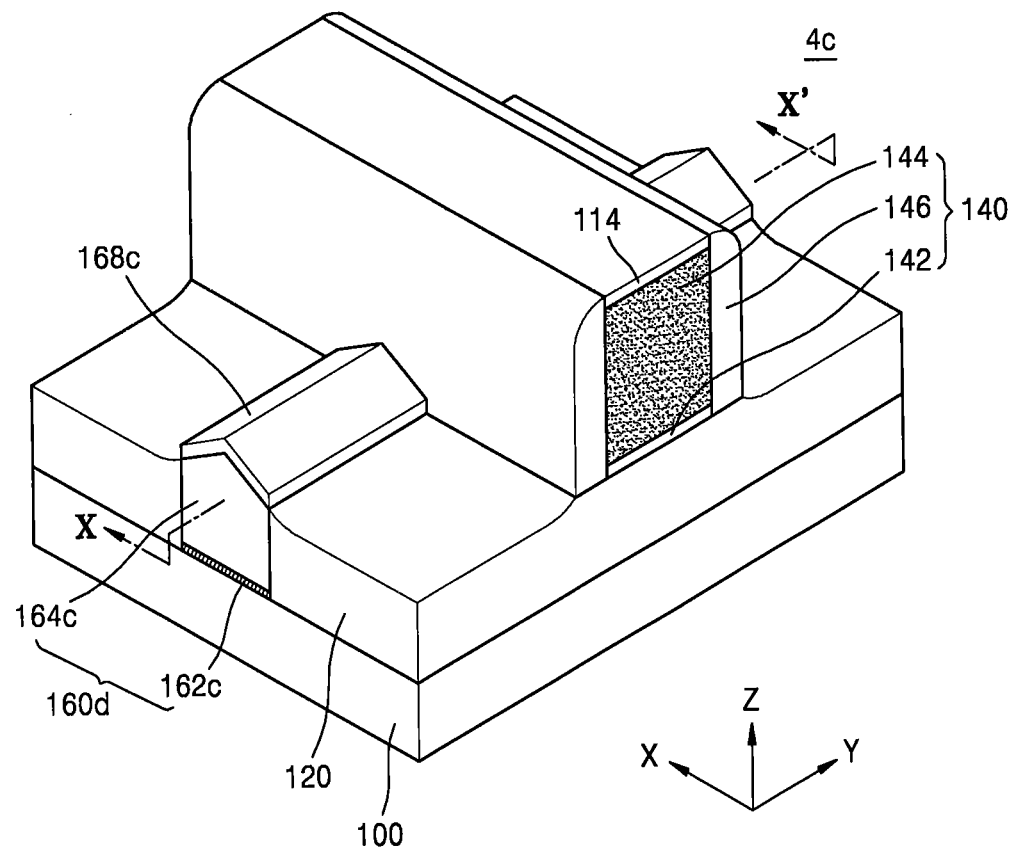
FIG. 34A is a perspective view illustrating a semiconductor device according to a embodiment of the inventive concepts.
Figure 34B:
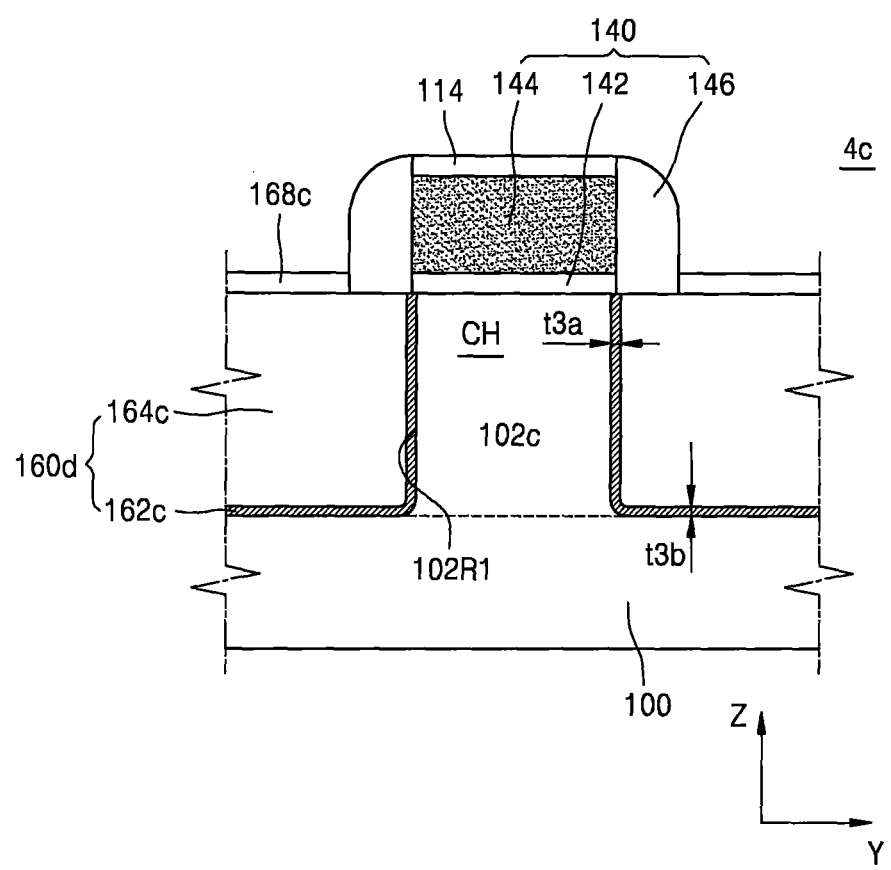
FIG. 34B is a cross-sectional view of the semiconductor device of FIG. 34A.

FIG. 34A is a perspective view illustrating a semiconductor device 4*c* according to an embodiment of the inventive concepts. FIG. 34B is a cross-section taken along line X-X' of FIG. 34A.

Referring to FIGS. 34A and 34B, the structure of a gate structure 140 is the same as that of the gate structure 140 of FIGS. 13A and 13B, that is, is different from that of the gate structure 140*a* of FIGS. 32A and 32B. The semiconductor device 4*c* of FIGS. 34A and 34B is the same as the semiconductor device 4*a* of FIGS. 32A and 32B except that the gate structure 140 is different from the gate structure 140*a* of FIGS. 32A and 32B, and thus a detailed description thereof will be omitted.

Figure 35:
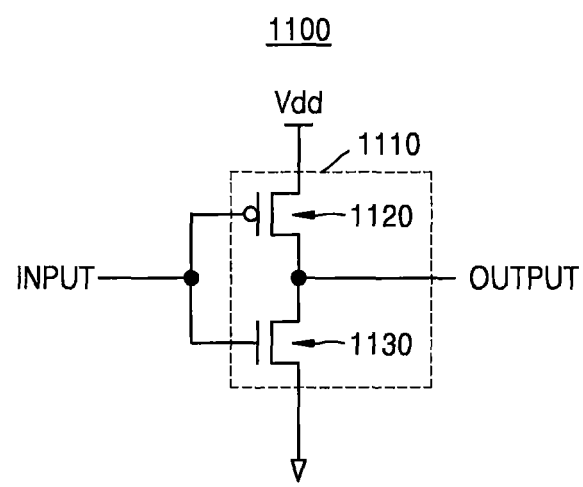
FIG. 35 is a circuit diagram of a complementary metal-oxide semiconductor (CMOS) inverter according to an embodiment of the inventive concepts.

FIG. 35 is a circuit diagram of a complementary metal-oxide semiconductor (CMOS) inverter 1100 according to an embodiment of the inventive concepts.

Referring to FIG. 35, the CMOS inverter 1100 includes a CMOS transistor 1110. The CMOS transistor 1110 includes a PMOS transistor 1120 and an NMOS transistor 1130 that are connected between a power supply terminal Vdd and a ground terminal. The CMOS transistor 1110 includes at least one of the semiconductor devices 1, 1*a*, 1*b*, 1*c*, 2, 2*a*, 2*b*, 2*c*, 3, 4, 4*a*, 4*b*, and 4*c* described above with reference to FIGS. 1A-34B.

Figure 36:
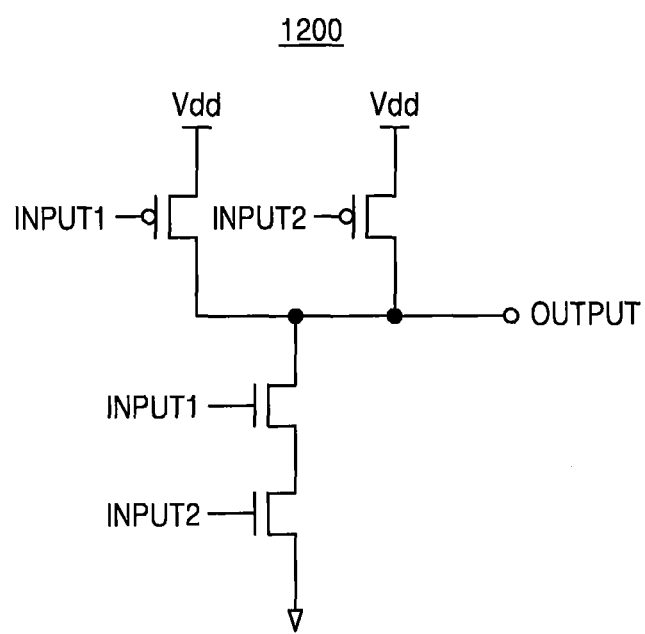
FIG. 36 is a circuit diagram of a CMOS NAND circuit according to an embodiment of the inventive concepts.

FIG. 36 is a circuit diagram of a CMOS NAND circuit 1200 according to an embodiment of the inventive concepts.

Referring to FIG. 36, the CMOS NAND circuit 1200 includes a pair of CMOS transistors to which different input signals are transmitted. At least one of the transistors in the NAND circuit 1200 is implemented as one of the semiconductor devices 1*a*, 1*b*, 1*c*, 2, 2*a*, 2*b*, 2*c*, 3, 4, 4*a*, 4*b*, and 4*c* described above with reference to FIGS. 1A-34B.

Figure 37:
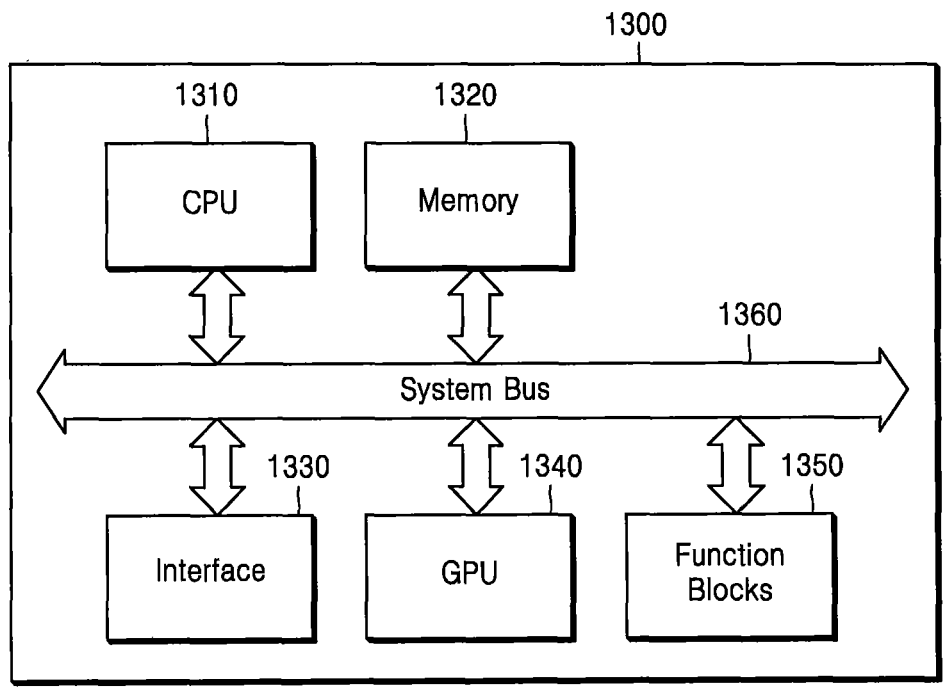
FIG. 37 is a block diagram of a system-on-chip (SoC) that includes a semiconductor device according to an embodiment of the inventive concepts.

FIG. 37 is a block diagram of a system-on-chip (SoC) 1300 according to an embodiment of the inventive concepts.

Referring to FIG. 37, the SoC 1300 may include a central processing unit (CPU) 1310, a memory 1320, an interface 1330, a graphics processing unit (GPU) 1340, functional blocks 1350, and a bus 1360 via which these components are connected to one another. The CPU 1310 may control the operation of the SoC 1300. The CPU 1310 may include one or more cores and an L2 cache. For example, the CPU 1310 may include multiple cores. The multiple cores may have an identical performance or different performances. The multiple cores may be activated at the same time or at different times. The memory 1320 may store results of processes performed in the function blocks 1350 under the control of the CPU 1310. For example, as the content stored in the L2 cache of the CPU 1310 is flushed, the memory 1320 may store the results of processes that are performed in the function blocks 1350. The interface 1330 may interface with external devices. For example, the interface 1330 may interface with a camera, a liquid crystal display (LCD), a speaker, or the like.

The GPU 1340 may perform graphic functions that are required by the SoC 1300. For example, the GPU 1340 may perform a video codec or process three-dimensional (3D) graphics.

The function blocks 1350 may perform various functions that are required by the SoC 1300. For example, when the SoC 1300 is an application processor (AP) for use in mobile devices, some of the function blocks 135 may perform a communication function.

The SoC 1300 includes at least one of the semiconductor devices 1, 1a, 1b, 1c, 2, 2a, 2b, 2c, 3, 4, 4a, 4b, and 4c described above with reference to FIGS. 1A-34B.

Figure 38:
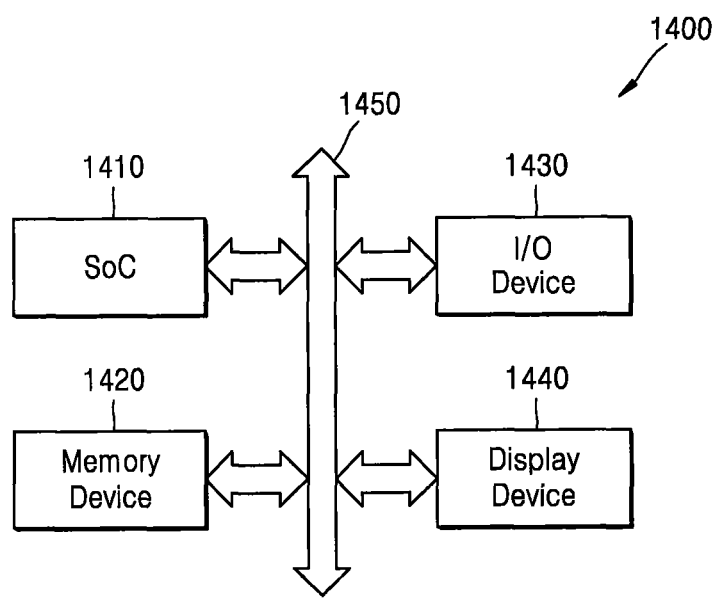
FIG. 38 is a block diagram of an electronic system including an SoC that includes a semiconductor device according to an embodiment of the inventive concepts.

FIG. 38 is a block diagram of an electronic system 1400 that includes an SoC 1410 that includes at least one semiconductor device according to an embodiment of the inventive concepts.

Referring to FIG. 38, the electronic system 1400 may include the SoC 1410. The electronic system 1400 may be, for example, a mobile apparatus, a desktop computer, or a server. The electronic system 1400 may further include a memory device 1420, an input/output (I/O) device 1430, and a display device 1440, which may be connected to one another via a bus 1450. The SoC 1410 includes at least one of the semiconductor devices 1, 1a, 1b, 1c, 2, 2a, 2b, 2c, 3, 4, 4a, 4b, and 4c described above with reference to FIGS. 1A-34B.

Figure 39:
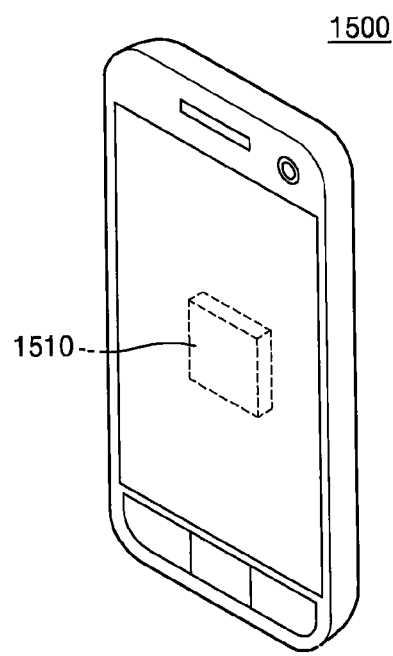
FIG. 39 is a perspective view of an electronic device that includes a semiconductor device according to an embodiment of the inventive concepts.

FIG. 39 is a perspective view of an electronic device to which a semiconductor device according to an embodiment of the inventive concepts is applied.

FIG. 39 illustrates an example in which the electronic system 1400 of FIG. 38 is applied to a mobile phone 1500. The mobile phone 1500 may include an SoC 1510. The SoC 1510 includes at least one of the semiconductor devices 1, 1a, 1b, 1c, 2, 2a, 2b, 2c, 3, 4, 4a, 4b, and 4c described above with reference to FIGS. 1A-34B.

While the inventive concepts have been particularly shown and described with reference to exemplary embodiments thereof, it will be understood that various changes in form and details may be made therein without departing from the spirit and scope of the following claims.

What is claimed is:

1. A semiconductor device, comprising:
   a substrate having a semiconductor fin structure protruding upwardly therefrom, the fin structure including a channel region;
   a gate structure on an upper surface of the channel region, the gate structure including a gate dielectric layer on the channel region, a gate electrode pattern on the gate dielectric layer and gate spacers on opposed sidewalls of the gate electrode pattern;
   a first source/drain region and a second source/drain region on opposite sides of the channel region, the first source/drain region including a first strain-inducing layer on a sidewall of the channel region and a second strain-inducing layer, wherein the first strain-inducing layer is between the second strain-inducing layer and the channel region,
   wherein the channel region has a first conductivity type and the first and second strain-inducing layers have a second conductivity type that is opposite the first conductivity type,
   wherein a concentration of second conductivity type dopants in the second strain-inducing layer is at least two orders of magnitude greater than a concentration of second conductivity type dopants in the first strain-inducing layer, and
   wherein a thickness of the first strain-inducing layer along an entirety of the sidewall of the channel region is substantially uniform.

2. The semiconductor device of claim 1, wherein the first strain-inducing layer directly contacts a lower surface of the gate dielectric layer.

3. The semiconductor device of claim 2, wherein the first strain-inducing layer also directly contacts a lower surface of the gate spacer.

4. The semiconductor device of claim 1, further comprising a third strain-inducing layer between the first strain-inducing layer and the second strain-inducing layer, wherein a germanium content of the third strain-inducing layer is less than the germanium content of at least one of the first or second strain-inducing layers.

5. The semiconductor device of claim 1, wherein the second strain-inducing layer directly contacts a portion of a lower surface of the gate spacer.

6. The semiconductor device of claim 1, wherein the first strain-inducing layer also extends between a lower surface of the second strain-inducing layer and the substrate, and wherein a thickness of a portion of the first strain-inducing layer that is between the second strain-inducing layer and the sidewall of the channel region is less than a thickness of a portion of the first strain-inducing layer that is between the lower surface of the second strain-inducing layer and the substrate.

* * * * *